(12) United States Patent
Morrison et al.

(10) Patent No.: US 12,619,035 B2
(45) Date of Patent: May 5, 2026

(54) MULTIWAVELENGTH OPTICAL SOURCES

(71) Applicant: Freedom Photonics LLC, Goleta, CA (US)

(72) Inventors: Gordon Barbour Morrison, Summerland, CA (US); Leif Albin Johansson, Santa Barbara, CA (US)

(73) Assignee: Freedom Photonics LLC, Santa Barbara, CA (US)

( * ) Notice: Subject to any disclaimer, the term of this patent is extended or adjusted under 35 U.S.C. 154(b) by 0 days.

(21) Appl. No.: 17/901,741

(22) Filed: Sep. 1, 2022

(65) Prior Publication Data

US 2023/0072926 A1 Mar. 9, 2023

Related U.S. Application Data

(60) Provisional application No. 63/240,851, filed on Sep. 3, 2021.

(51) Int. Cl.
| | |
|---|---|
| *G02B 6/42* | (2006.01) |
| *G02B 6/032* | (2006.01) |
| *G02B 6/43* | (2006.01) |
| *H01S 5/02251* | (2021.01) |
| *H01S 5/40* | (2006.01) |

(52) U.S. Cl.
CPC .......... *G02B 6/4202* (2013.01); *G02B 6/032* (2013.01); *G02B 6/43* (2013.01); *H01S 5/02251* (2021.01); *H01S 5/4025* (2013.01); *G02B 2006/0325* (2013.01)

(58) Field of Classification Search
CPC .......................... G02B 6/12019; G02B 6/4202
See application file for complete search history.

(56) References Cited

U.S. PATENT DOCUMENTS

| | | | | |
|---|---|---|---|---|
| 6,014,480 A | * | 1/2000 | Baney ................. | H04J 14/0307 |
| | | | | 385/24 |
| 6,101,210 A | * | 8/2000 | Bestwick ............ | H01S 5/02325 |
| | | | | 372/98 |
| 6,130,899 A | * | 10/2000 | Epworth ............... | H01S 5/4062 |
| | | | | 372/75 |
| 6,434,175 B1 | * | 8/2002 | Zah ....................... | H01S 5/4025 |
| | | | | 372/20 |
| 7,248,772 B2 | * | 7/2007 | Suzuki ................. | G02B 6/4214 |
| | | | | 385/129 |
| 7,899,105 B1 | * | 3/2011 | Hargis .................... | H01S 5/146 |
| | | | | 372/102 |

(Continued)

OTHER PUBLICATIONS

Blaicher et al., "Hybrid multi-chip assembly of optical communication engines by in situ 3D nano-lithography", Light: Science & Applications, vol. 9(71):1-11 (2020).

(Continued)

*Primary Examiner* — Rhonda S Peace
(74) *Attorney, Agent, or Firm* — Van Pelt, Yi & James LLP

(57) ABSTRACT

Configurations are disclosed for multi-wavelength optical devices and systems. In particular, multi-wavelength optical devices that include separate chips optically connected via phonic wire bonds. The disclosed configurations can utilize photonic wire bond interconnects and photonic wire bond interconnection techniques, which may facilitate low-cost implementation of wavelength division multiplexed optical systems.

18 Claims, 16 Drawing Sheets

(56) References Cited

U.S. PATENT DOCUMENTS

| | | | | |
|---|---|---|---|---|
| 8,903,205 | B2 * | 12/2014 | Koos | G02B 6/30 |
| | | | | 385/14 |
| 9,034,222 | B2 * | 5/2015 | Koos | G02B 6/138 |
| | | | | 264/1.24 |
| 9,559,487 | B2 * | 1/2017 | Doerr | H01S 5/3235 |
| 9,939,578 | B2 * | 4/2018 | Chang | G02B 6/4212 |
| 10,284,301 | B2 * | 5/2019 | Xu | H04B 10/503 |
| 10,320,152 | B2 | 6/2019 | Morrison | |
| 10,355,451 | B2 * | 7/2019 | Morrison | H01S 5/125 |
| 10,809,461 | B2 * | 10/2020 | Spannagel | G02B 6/42 |
| 10,840,672 | B2 * | 11/2020 | de Valicourt | G02F 1/3136 |
| 11,177,627 | B2 * | 11/2021 | Zilkie | H01S 5/0261 |
| 11,721,951 | B2 | 8/2023 | Morrison | |
| 12,095,228 | B2 | 9/2024 | Morrison | |
| 2002/0105991 | A1 | 8/2002 | Coldren et al. | |
| 2007/0071050 | A1 | 3/2007 | Kuramoto | |
| 2008/0166134 | A1 * | 7/2008 | McCallion | H01S 5/026 |
| | | | | 398/187 |
| 2010/0111119 | A1 | 5/2010 | Sato et al. | |
| 2010/0246612 | A1 * | 9/2010 | Shimizu | H01S 5/0602 |
| | | | | 372/18 |
| 2012/0195332 | A1 * | 8/2012 | Yoffe | H01S 5/1032 |
| | | | | 372/98 |
| 2013/0170833 | A1 * | 7/2013 | Nagarajan | H01S 5/4087 |
| | | | | 398/48 |
| 2013/0223788 | A1 * | 8/2013 | Koos | G02B 6/30 |
| | | | | 385/14 |
| 2014/0334768 | A1 * | 11/2014 | Chang | G02B 6/4204 |
| | | | | 438/27 |
| 2019/0058304 | A1 * | 2/2019 | de Valicourt | H01S 5/141 |
| 2019/0089461 | A1 * | 3/2019 | Sun | H04B 10/506 |
| 2019/0098751 | A1 * | 3/2019 | Koch | H05K 1/0274 |
| 2019/0199062 | A1 * | 6/2019 | Ma | H01S 5/06821 |
| 2019/0372307 | A1 | 12/2019 | Morton | |
| 2020/0355880 | A1 * | 11/2020 | Wright | G02B 6/43 |
| 2021/0173145 | A1 * | 6/2021 | Fasano | G02B 6/1225 |
| 2023/0072926 | A1 * | 3/2023 | Morrison | G02B 6/4202 |
| 2024/0264395 | A1 * | 8/2024 | Harris | G02B 6/4215 |

OTHER PUBLICATIONS

Hoose et al., "Multi-chip integration by photonic wire bonding: connecting surface and edge emitting lasers to silicon chips", Optical Fiber Communication Conference, Anaheim, California, Osa Technical Digest (online)(Optica Publishing Group, 2016), paper M2I.7, https://doi.org/10.1361/OFC.2016.M2I.7, 4 pages.

Lindenmann et al., "Photonic wire bonding: a novel concept for chip-scale interconnects", Optics Express, vol. 20(16):1-11 (2012).

* cited by examiner

130

140

150

700

800

MULTIWAVELENGTH OPTICAL SOURCES

INCORPORATION BY REFERENCE TO ANY PRIORITY APPLICATIONS

This application claims benefit under 35 U.S.C. § 119(e) of U.S. Provisional Application No. 63/240,851, entitled "MULTIWAVELENGTH OPTICAL SOURCES", filed on Sep. 3, 2021, which is hereby incorporated herein by reference in its entirety.

BACKGROUND

Field of the Invention

Various embodiments of this application relate to the integrated multi-wavelength optical devices and systems, and in particular, multi-wavelength sources based on heterogeneously integrated laser arrays and photonic integrated circuits.

Description of the Related Art

In optical telecommunication applications, multi-wavelength sources are routinely used to implement wavelength division multiplexing. Typically, the laser arrays that generate multi-wavelength light and optical devices that process the multi-wavelength light are fabricated on separate chips having different material compositions. Low loss optical power transfer between a laser array and the receiving optical devices fabricated on separate chips is important for supporting high quality data transfer.

SUMMARY

Multi-wavelength optical devices designs described herein can utilize photonic wire bond interconnects and photonic wire bond interconnection techniques, which may facilitate low-cost implementation of wavelength division multiplexed optical communication systems. Photonic wire bonds and bonding can be effective to provide low loss optical coupling between optical devices without the need for precise alignments between the corresponding optical ports. As discussed herein, photonic wire bonds may provide flexibility and other possible advantages.

A variety of optical devices are disclosed herein. Some such optical devices comprise multi wavelength optical sources that comprise laser bars and arrays and photonic wire bonds wherein the laser bars and arrays are photonically wire bonded to photonic integrated circuits. Example embodiments described herein have several features, no single one of which is indispensable or solely responsible for their desirable attributes. Without limiting the scope of the claims, some of the advantageous features will now be summarized.

BRIEF DESCRIPTION OF THE DRAWINGS

In the following description of the various embodiments, reference is made to the accompanying drawings which form a part hereof, and in which is shown by way of illustration various embodiments of the device. It is to be understood that other embodiments may be utilized and structural changes may be made.

DETAILED DESCRIPTION

Figure 1A:
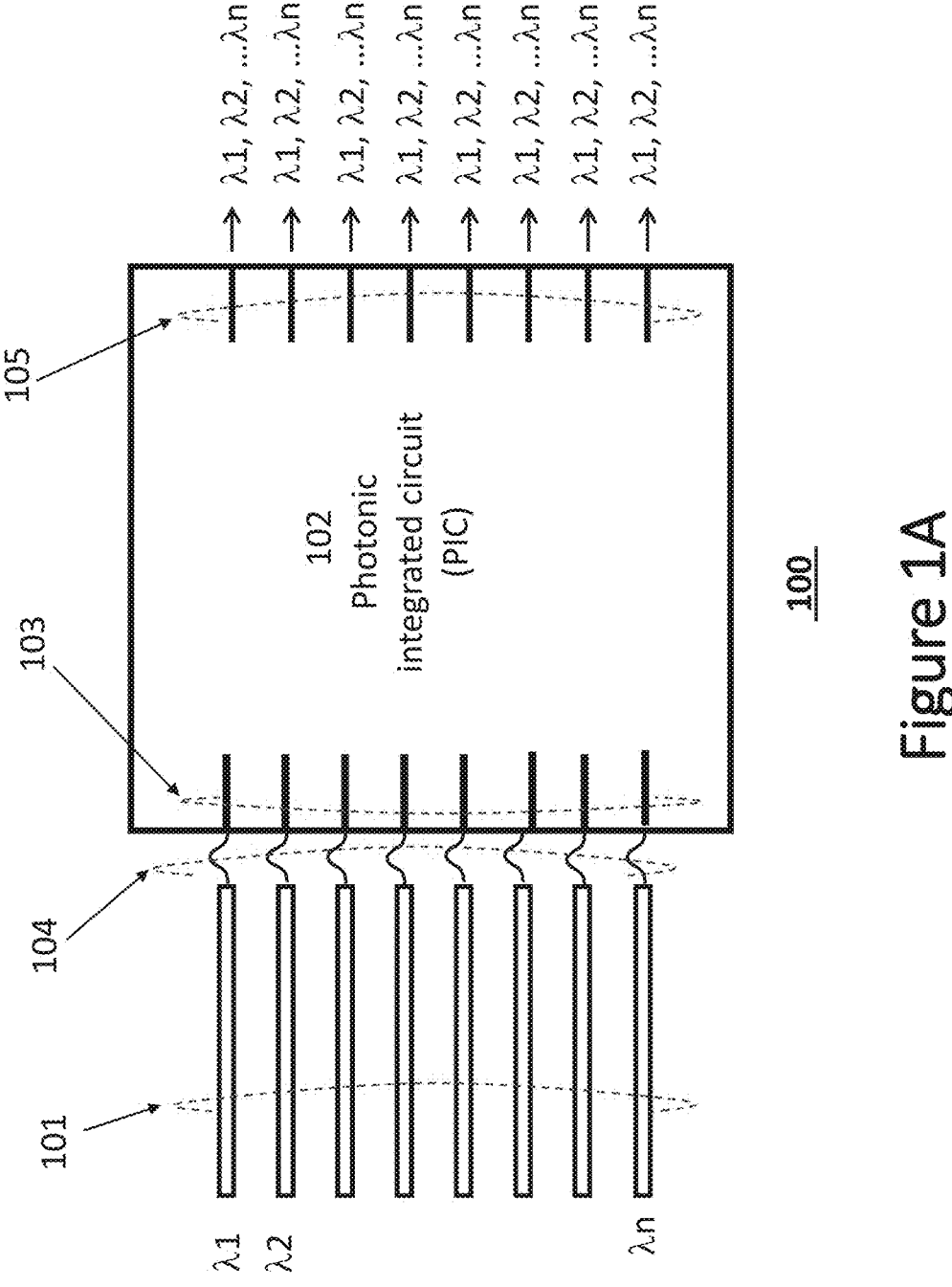
FIG. 1A illustrates an example multi-wavelength optical source configured to generate optical outputs having multiple wavelengths in accordance with certain embodiments described herein. The multi-wavelength optical source comprises a plurality of light sources (e.g., lasers) optically coupled to a wavelength multiplexer.

Although certain preferred embodiments and examples are disclosed below, inventive subject matter extends beyond the specifically disclosed embodiments to other alternative embodiments and/or uses and to modifications and equivalents thereof. Thus, the scope of the claims appended hereto is not limited by any of the particular embodiments described below. For example, in any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain embodiments; however, the order of description should not be construed to imply that these operations are order dependent. Additionally, the structures, systems, and/or devices described herein may be embodied using a variety of techniques including techniques that may not be described herein but are known to a person having ordinary skill in the art. For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein. It will be understood that when an element or component is referred to herein as being "connected" or "coupled" to another element, it can be directly connected or coupled to the other element or intervening elements may be present therebetween. For clarity of description, "reflector" or "mirror" can be used interchangeably to refer to an optical element and/or a surface having a reflectivity greater than or equal to about 5% and less than or equal to 100%. For example, an optical element and/or a surface having a reflectivity greater than or equal to about 5% and less than or equal to 99%, greater than or equal to about 10% and less than or equal to 90%, greater than or equal to about 15% and less than or equal to 80%, greater than or equal to about 20% and less than or equal to 70%, greater than or equal to about 30% and less than or equal to 60%, or any value in any range/sub-range defined by these values can be considered as a reflector or mirror. It will be understood that "light having single wavelength", "laser light having single wavelength", "single wavelength light" or "single wavelength laser light", can be light comprising wavelengths within a continuous wavelength or frequency band (e.g., a narrowband) centered around a center wavelength (or center frequency).

Super computers, artificial intelligence applications, and even datacenters can benefit from very high bandwidth optical interconnects. These systems can have many optical channels, or wavelengths, which can be individually modulated with data signals to carry information. In many system architectures, an optical source that provides all channels, or wavelengths, can be used. Such a multi-wavelength source may provide a comb of laser wavelengths that can be separated by a designated channel spacings, such as 12.5 GHz, 25 GHz, 33 Ghz, 50 GHz, 100 GHz, 200 GHz, 400 GHz, 500 GHz, 800 GHz, 1000 GHz, etc.

A comb source may comprise multiple laser sources (e.g., semiconductor lasers) and an optical multiplexer (e.g., a star coupler or an array waveguide grating) that combines the laser light received from the laser sources to generate one or more multi-wavelength outputs. In some cases, the wavelengths in the multi-wavelength light may be equally spaced and form a comb of wavelengths. Such architectures, however, may have several challenges, including reliable single mode performance of all the lasers, and efficient combination of the laser lights generated by individual sources into a photonic integrated circuit (PIC) for multiplexing and or other types of optical signal processing (e.g., demultiplexing, modulation, or other operations). The hybrid integration of multiple laser sources with a PIC involves careful alignment of the optical output port of individual lasers with the input ports of the PIC (e.g., using controlled mechanical stages and micro/nano positioners). Such mechanical alignment can be difficult, time consuming and expensive since it involves precise alignment of the output port of individual lasers with the individual input ports of the PIC (e.g., with sub-micron accuracy). Moreover, to couple light efficiently to the PIC, the optical output mode of each laser must be well matched to the optical mode supported by the receiving input port of the PIC. Poor matching of the optical modes between laser and PIC, or poor alignment of the optical modes from laser to PIC can result in high loss, and low optical coupling efficiency.

The sources used in telecom, datacenter, and interconnect applications can include Distributed Feedback (DFB) lasers. In addition to a distributed grating, a highly efficient DFB laser may comprise a highly reflective (HR) mirror, or facet, at one end, and an anti-reflection or low reflection coating at the other end. The position of the cleaved HR facet relative to the phase of the grating in the distributed grating plays a critical role in determining the properties of the DFB laser, yet may not be well controlled because of the imprecise bar cleaving process used to separate laser bars. The cleaving precision is usually on the order of micrometers, whereas the grating period which determines the phase, is on the order of a few hundred nm or less. DFB laser bars are therefore very low yield in terms of uniformity of performance and side mode suppression ratio. The DFB gratings are not typically perfectly aligned with the laser crystal cleave plane, and as a result, facet phase (and therefore DFB performance) varies along the laser bar, making not all of the lasers useful as sources for communications. Often as a result, small bars (2-4 lasers) or individual lasers may be pre-screened and individually aligned to the photonic integrated circuit.

Various designs that address some of the issues described above are disclosed herein. Certain embodiments described herein provide optical devices and systems that can benefit from flexible, individually customized and/or aligned, low loss waveguides and optical interconnects. In particular, optical devices and systems are disclosed herein that comprise flexible, individually customizable and/or aligned optical connection between a plurality of individual optical sources (e.g., individual lasers, laser arrays, laser bars and the like) to one or more photonic integrated circuit (PICs) fabricated on a chip separate from the chip or substrate on which the optical sources are fabricated. Accordingly, the optical sources and the PICs may be fabricated on different platforms comprising different materials. For example, the PIC may be fabricated on a silicon photonic platform while the optical sources may be fabricated on a platform comprising III-V semiconductor material. As such, low loss optical power transfer between the optical sources and a PIC may benefit from precise optical alignment between output ports of the optical sources to input ports of the PIC, which is provided by these flexible waveguide interconnects. In some cases, a PIC may comprise a Planar Lightwave Circuit (PLC). In some cases, PLC may comprise structures that guide light in a single plane or a single guiding layer.

Additionally, certain fabrication strategies and methods disclosed herein may facilitate heterogeneous integration of photonic devices where different types (e.g., active and passive optical devices) of devices are optically coupled using such waveguide interconnects.

In some embodiments, an output port of an optical source of the plurality of optical sources may be optically coupled or connected to an input port of the PIC by a coupling waveguide. In some embodiments, two output ports of an optical source of the plurality of optical sources may individually be optically coupled or connected to two individual PICs; for example, first and second output ports are connected to first second PICs, respectively.

In some cases, the coupling waveguide may be an individually fabricated polymer waveguide (or photonic wire bond). In some such cases, a polymer waveguide can be an in-situ structured waveguide. For example, the polymer wave guide may be fabricated after fabricating two optical devices on the same or separate chips, and then the polymer waveguide may be fabricated between the two optical devices to connect an output port of one of the optical devices to that of the other one. In some cases, a polymer waveguide may be structured using additive three-dimensional nanofabrication techniques. In particular, in some cases the polymer waveguide may be a directly written (e.g., using photolithography) polymer waveguide commonly referred to as photonic wire or photonic wire bond. Such photonic wire bonds may be air-cladded. In some cases, after fabrication, an air-cladded photonic wire bond may be embedded in a low index cladding material (e.g., a low index polymer) having an index of refraction lower than the photonic wire or waveguide. In some cases, a photonic wire or a photonic wire bond may be a freeform waveguide with customized shape and cross-section. In some such cases, at least a portion of the photonic wire or the photonic wire bond can be a single mode waveguide. A photonic wire bond may enable highly efficient optical power transfer from the output port of a light source to the input port of the PIC, while allowing a distance and a high degree of misalignment between the output port of a light source to the input port of the PIC. For example, the photonic wire bond may transmit 10% to 30%, 30% to 50%, 50% to 70%, 70% to 80%, or 80% to 99% of the optical power output via an output port of a light source to the input port of the PIC or any range formed by any of these values or may be possibly higher or lower. The output port of the light source and the input port of the PIC are separated by a distance (e.g., a lateral or longitudinal distance) between 10-30 microns, 30-50 microns, 50-100 microns, 100-150 microns, 150-200 microns, 200-500 microns, or any range formed by any of these values or may be possibly longer or shorter.

A directly written polymer waveguide or photonic wire bond can have diameter (e.g., an average diameter) between 0.5 to 1 microns, 1 to 2 microns, 2 to 4 microns, 4 to 6 microns, 6 to 8 microns 8 to 10 microns, 10 to 15 microns, 15 to 20 microns or any range formed by any of these values or may be possibly larger or smaller.

In some implementations, a directly written polymer waveguide may be a polymer waveguide formed by three-dimensional photolithography using a precisely controlled focused laser beam.

In some cases, where the optical output mode of the light source is different from the optical mode supported by the input port of the PIC, a photonic wire bond may still support highly efficient optical power transfer from the light source to the PIC. For example, a shape of the first end of the polymer waveguide comprising the photonic wire bond that is connected to the output port of the light source may be tailored to support efficient optical coupling between the optical output port of the light source and the polymer waveguide and a shape of the second end of the polymer waveguide comprising the photonic wire bond connected to the input port of the PIC may be tailored to support efficient optical coupling between the polymer waveguide and input port of the PIC. In some such examples, a shape (e.g., a cross-sectional shape) of the polymer waveguide may change along the length of the polymer waveguide to support low loss transmission of optical power from the first end to the second end of the polymer waveguide.

As such photonic wire bonds and/or bonding may enable efficient optical power transfer between optical ports (e.g., waveguide facets, waveguide edges, or wave ends) that are separated by relatively large distances (e.g., compared to the optical wavelength) and support different optical modes. The optical devices and systems disclosed herein are designed to utilize the above-mentioned advantages of photonic wire bonds and bonding to reduce the fabrication cost and complexity associated with providing certain optical functionalities.

Advantageously, using photonic wire bonds to provide optical connection between optical sources and a PIC fabricated on separate chips, may reduce the cost and complexity of fabricating multi-wavelength optical devices (e.g., multi-wavelength optical sources), by eliminating the need for aligning input ports with respect to output ports located on the separate chips, for example, with mechanical alignment devices positioning input ports and output ports.

Some embodiments disclosed herein, provide new configurations for multi-wavelength optical sources that may enable new functionalities or simplify the design of certain optical systems. In some such embodiments, an output port of an optical source of the plurality of optical sources may be butt coupled to an input port of the PIC. In some embodiments, a coupling waveguide can be a monolithically fabricated waveguide (e.g., a silicon on insulator, a polymer or a silicon nitride waveguide), fabricated on the PIC chip, on the same substrate where the optical source is fabricated, or on a separate chip. In some cases, the plurality of coupling waveguides may comprise a fiber array.

The PIC may include one or more optical devices fabricated on an optical waveguide platform. The optical waveguide platform may comprise SiNx, doped glass, polymer or silicon-on-insulator (SOI), for example. The optical devices may include, optical multiplexers, optical switches, optical modulators (e.g., electro-optic modulators), optical couplers, and the like. The PIC may comprise a plurality of input ports and/or one or more output ports. In some cases, an input port or an output port can be a facet of a monolithically fabricated waveguide on the PIC chip. In some cases, an input port or an output port can be a waveguide coupler (e.g., a vertical grating coupler) configured to provide optical coupling between another waveguide (e.g., an optical fiber, or a polymer waveguide or photonic wire bond) and the monolithically fabricated waveguide on the PIC chip. In some cases, an input port or an output port can be a waveguide coupler (e.g., a vertical grating coupler) configured to couple light between a free-space light beam and the monolithically fabricated waveguide on the PIC chip.

In some implementation, an input port of the PIC may comprise a mode converter or spot converter configured to transform an optical mode associated with light received by the input port to an optical mode of a monolithically fabricated waveguide on the PIC chip.

In various implementations, the plurality optical sources may comprise a laser source, a laser source combined with an optical amplifier, or a laser source, combined with an optical amplifier and an optical mode or spot converter. The optical mode converter may be configured to transform an optical mode of light received from the laser source and output the resulting optical mode via the output port of the laser source. In some cases, an optical output port of the optical source can be a facet of an active waveguide, a facet of a front reflector, a facet of an optical amplifier, or a facet of the mode converter.

In some embodiments, the plurality of optical sources may comprise a laser array or a laser bar. In some cases, a laser array may comprise a plurality of laser sources monolithically fabricated on a laser chip or a laser substrate. In some other cases, the laser array may comprise a plurality of individually fabricated laser chips mounted on a carrier.

In some embodiments, a laser source of the laser array may comprise a single mode laser (e.g., a semiconductor laser) configured to generate narrow band laser light having a center wavelength. The center wavelength may be within the O-band (e.g., between 1260 nm and 1360 nm), C-band (e.g., between 1530 nm and 1565 nm), or other optical communication bands (e.g., E-band, S-band, L-band, and U-band) for some designs. In some examples, a narrow band laser may have bandwidth from 1 Hz to 1 KHz, from 1 KHz to 1 MHz, from 1 MHz to 50 MHz, from 50 to 100 MHz, from 100 MHz to 1 GHz, or any range formed by any of these values or may be possibly larger or smaller.

In some implementations, a laser source of the laser array can be a single-output laser source configured to output light from one end of the laser source. In some implementations, a laser source of the laser array can be a dual-output laser source configured to output light from both ends of the laser source.

In some embodiments, a laser source may comprise one or more features of the laser sources discussed in U.S. Pat. No. 10,355,451, titled "Laser with Sampled Grating Distributed Bragg Reflector", filed on Apr. 25, 2018 and issued on Jul. 16, 2019, U.S. Patent Application No. 62/901,089 filed on Sep. 16, 2019 titled "Tunable Laser with Active Material on at Least One End for Monitoring Performance", and U.S. patent application Ser. No. 17/021,993 filed on Sep. 15, 2020, titled "Tunable Laser with Active Material on at Least One End for Monitoring Performance", which are each hereby incorporated herein in their entirety by reference, for example to provide various wavelength tunable laser designs.

In various embodiments, the optical devices and systems described below may provide different optical functionalities including but not limited to providing a plurality of multi-wavelength optical outputs.

The components of various embodiments disclosed herein can be fabricated using a wide variety of materials or combinations of materials some of which may exhibit the gain, optical activity, and/or photocurrent absorption as described herein, and/or allowing for fabrication of multi wavelength sources as described herein.

In various implementations, the PIC may comprise a waveguide layer configured to confine light in a vertical direction perpendicular to a top surface of a substrate on which the PIC is fabricated. In some cases, the waveguide layer may comprise, silicon, silicon nitride (e.g., $SiN_x$), doped glass, silica glass, a polymer material (e.g., PMMA), or other materials that may support low loss propagation of light having a wavelength within the operational wavelength of the PIC.

Multi-Wavelength Optical Sources Based on Single-Output Lasers

In some embodiments, optical devices and systems disclosed herein may comprise a plurality of single-output optical sources (e.g., a laser array) having a plurality of output ports, and a photonic integrated circuit (PIC) having a plurality of input ports. A plurality of coupling waveguides such as photonic wire bonds may optically connect the output ports of the plurality of optical sources to the input ports of the PIC such that each output port is optically connected an input port. The coupling waveguide (e.g., photonic wire bond) may enable transmission of light (e.g., laser light) output from the output port to the input port without the need to optically align the output port with the input port for example using mechanical fixtures to move the output port with respect to the input port. In some cases, the PIC may include an optical multiplexer configured to combine light received from the plurality of input ports.

In various implementations, a spacing between the output ports of the plurality of the optical sources and/or a spacing between the plurality of input ports of the PIC may be less than 500 microns, less than 100 microns, less than 50 microns, or less than 20 microns, or less than 10 microns or any range formed by any of these values or may be larger or smaller. In various implementations, the spacing between the output ports of the plurality of the optical sources and/or a spacing between the plurality of input ports of the PIC, may be a center-to-center distance, e.g., a distance between the centers of the input facets or output facets of two adjacent waveguides.

In some implementations, the plurality of optical sources and the PIC are fabricated on two separate substrates or two separate chips. The plurality of optical sources may comprise a laser array monolithically fabricated on a substrate (e.g., a laser bar), or individually fabricated optical sources (e.g., laser chips) mounted on a substrate or carrier after fabrication.

In some cases, the substrate on which the plurality of optical sources are fabricated may be mounted on a top surface of the PIC.

In some cases, a substrate on which the plurality of optical sources are fabricated or the carrier chip on which individual optical sources are mounted, may be mounted on an optical bench on which the PIC is mounted.

In various implementations, the coupling waveguide (e.g., the photonic wire bond) may be fabricated after mounting the plurality of optical sources on the optical bench or the PIC.

In some cases, a distance (e.g., a vertical distance) between the center of an output port of an optical source and a top surface of the optical bench may be different from a distance between the center of the input port of the PIC and the top surface of the optical bench. In some such cases, a photonic wire bond between the output port and the input port may still enable highly efficient optical power transfer between the two ports.

In some cases, a distance (e.g., a longitudinal distance) between the center of an output port of an optical source and the center of the input port of the PIC can be between 5 to 10 microns, 10 to 30 microns, 30 to 50 microns, 50 to 100 microns, 100 to 200 microns, 200 to 500 microns or any range formed by any of these values or may be larger or smaller. In some such cases, a photonic wire bond between the output port and the input port may still enable highly efficient optical power transfer between the two ports.

In various embodiments, each optical source of the plurality of optical sources may be tested (e.g., optically and electrically characterized) before being optically connected to the PIC. In some cases, individual optical sources (maybe each source) may be individually tested before being mounted on a carrier chip.

In some cases, the optical sources may be, e.g., individually, tested before the substrate on which the plurality of optical sources are fabricated, or the carrier one which the individual optical sources are mounted, is mounted on the optical bench or the PIC. In some such cases, the optical sources that have an unacceptable performance (e.g., unacceptable based on a performance criterion or compared to a threshold performance), may be identified and marked. In various embodiments disclosed below, the output port(s) of the optical sources that are identified to have unacceptable performance, may not be optically connected or coupled to PIC(s).

The unacceptable performance of an optical source may be related to a level optical output power, instability of the optical output power, instability of the optical output mode, instability of laser wavelength, low slope efficiency, and the like.

FIG. 1A illustrates an implementation of a multi-wavelength optical source 100 configured to generate one more optical outputs having multiple wavelengths ($\lambda 1, \lambda 2, \ldots \lambda n$) in accordance with certain embodiments described herein. The multi-wavelength source 100 comprises a plurality of optical sources 101 and a photonic integrated circuit (PIC 102). The optical outputs from a plurality of optical sources 101 may be combined by the PIC 102 to provide one or more outputs at least one or some of which, possibly all, comprise a portion of light output by one or possibly all, of the optical sources of the plurality of optical sources. The PIC may have a plurality of input ports 103 configured to receive light from the output ports of plurality of optical sources 101 and one or more output ports 105 configured to output a portion of light received from the input ports 104.

An output port of an optical source or an input port of the PIC 102 may comprise a waveguide facet, a region of waveguide near a waveguide facet, a waveguide coupler, an optical fiber facet and the like.

In some cases, the number of output ports 105 may be equal to the number of input ports 104 in a PIC. In some other cases, the number of output ports 105 may be larger or smaller than the number of input ports 104.

In some cases, the plurality of optical sources 101 may be fabricated on a single substrate. In some such cases, the plurality optical sources 101 may be monolithically fabricated on a single chip. In some cases, the plurality of optical sources 101 may comprise a laser array or a laser bar. In some cases, the plurality of optical sources 101 may comprise a plurality of laser chips attached to a laser carrier chip.

In some cases, the PIC chip 102 may be a silicon photonic chip comprising optical devices fabricated based on silicon-on-insulator (SOI) waveguides. In some cases, the PIC chip may be attached or mounted on a PIC carrier chip.

In various implementations, the source carrier chip and the PIC carrier chip may be disposed on a single optical bench (a bench for disposing optical devices).

In some implementations, the PIC chip 102 and the plurality of lasers 101 may be integrated on a single optical bench. For example, a laser bar and a silicon photonic PIC, that are fabricated separately, may be disposed on a common optical bench. Subsequently, the output ports of the lasers of the laser bar may be photonically wire bonded to the input ports of the PIC 103, such that optical coupling between the output ports of the lasers with the input ports of the PIC 103 may be provided by photonic wire bonds.

In some cases, selected regions of the common optical bench may be etched or otherwise fabricated to form mounting seats where the source carrier chip and the PIC carrier chip can be disposed or mounted. In some implementations, the PIC chip or the laser chips can be directly disposed on the mounting seats.

In some cases, at least an optical source of the plurality of light sources 101 may comprise a laser and an optical amplifier where the laser light output by the laser is amplified by the optical amplifier, and the output of the optical source comprises the amplified laser light. In these cases, for example, the output port of the optical source can be a waveguide facet, a fiber optical facet of the optical amplifier or a waveguide coupler or a mode converted optically connected to the optical amplifier.

In some implementations, the plurality of optical sources 101 may comprise a plurality of single wavelength distributed feedback (DFB) lasers configured to generate light with a narrowband (e.g., less than 1 KHz, less than 1 MHz, or less than 1 GHz) around a center wavelength. In some cases, different DFB lasers output different wavelengths and/or have different center wavelengths. In some cases, a DFB laser of the plurality of DFB lasers may output light having a center wavelength different from the center wavelength of the other DFB lasers.

In some cases, the plurality of DFBs 101 may be monolithically integrated with a plurality of semiconductor optical amplifier (SOAs) and in various implementations, different SOAs amplify the optical output received from respective DFB lasers. In some such cases, the SOAs may be electrically isolated SOAs.

A DFB laser or an SOA may output light via an output port comprising, for example, an output facet, an output waveguide, or an output coupler.

In some examples, a modulator (e.g., an electro-optical modulator) may be integrated with a DFB laser, or an amplified DFB laser comprising an SOA, to modulate laser light output by the DFB laser or the SOA and output the resulting modulated light via an output port of the corresponding optical source.

In some examples, a spot-size converter may be integrated with a DFB laser or an SOA to convert a mode of light output by the laser or the SOA and output the resulting light (e.g., having a different mode shape/area compared to output light), to the input port of a waveguide or an SOA. In some implementations, a spot-size converter may include a tailored region of a passive or active waveguide having a shape, size (e.g., cross-sectional size, or thickness), or structure different from the rest of the waveguide. In some cases, a spot-size converter may comprise a tapered region of the waveguide, a grating, or a periodic structure integrated with the waveguide. The spot-size converter may be integrated with or formed on an end region of a waveguide from which the laser light or amplified laser light is output, or an end region of a waveguide into which the laser light or amplified laser light is coupled.

In some implementations, an output port of a DFB laser or an SOA may be optically coupled to an input port of the PIC 102 via a coupling waveguide optically connecting the output port of the DFB laser to the input port of the PIC 102. In some cases, the coupling waveguide may be an air-cladded polymer waveguide. In some such cases, the air-cladded polymer waveguide may be a directly written waveguide (e.g., using two-photon photopolymerization). For example, the polymer waveguide may be fabricated by moving a focused laser beam within a polymer (e.g., SU8 or PMMA) such that the polymer molecules in the vicinity if the focal point are cured (to form the polymer waveguide). After fabricating the waveguide, the uncured polymer may be removed (e.g., using a solvent). In some examples, the coupling waveguide may be a photonic wire bond between the output port of the laser or the SOA and the input port of the PIC 102. In some cases, the coupling waveguide may be other types of waveguides (e.g., monolithically fabricated waveguides such as SOI and SiN waveguides).

In some cases, the coupling waveguide (e.g., photonic wire bond) may be a polymer-cladded polymer waveguide where a cladding polymer surrounding the polymer waveguide has a lower refractive index than that of the polymer used in the waveguide structure. In some such cases, the polymer-cladded polymer waveguide (e.g., photonic wire bond) may be fabricated by first fabricating an air-cladded polymer wave guide and subsequently disposing the polymer cladding to embed the polymer waveguide (e.g., photonic wire bond) in the polymer cladding.

In some implementations, the multi-wavelength source may comprise a plurality of DFB lasers 101 to the plurality of input ports 103 of the PIC 102 via photonic wire bonds where individual DFB lasers are photonically wire bonded to a respective input port of the PIC 102.

In some cases, the plurality of optical sources may be prescreened and tested before being optically connected to the plurality of input ports of the PIC (e.g., via photonic wire bonds). For example, one or more optical parameter (e.g., a wavelength, an optical output power, a level of side mode suppression, a slope efficiency, or a polarization) of the DFB laser may be tested prior to coupling to the PIC 102. One or more or all of the optical sources, e.g., DFB lasers, may be tested. In some cases, one more DFB lasers may be identified as defective based on their tested performance. In some such cases, a DFB laser identified as defective may not be wire bonded to the any optical input ports 103 of the PIC 102.

In some embodiments, the PIC 102 may comprise an optical multiplexer (e.g., an integrated optical multiplexer) configured to combine light received from the plurality of optical sources 101. In these embodiments, the plurality of input ports 103 of the PIC 102 may comprise one or more input ports of the optical multiplexer, and the plurality of output ports of the PIC 102 may comprise one or more output ports of the optical multiplexer. In some examples, the optical multiplexer can be an optical coupler (e.g., a star coupler. In some cases, the optical multiplexer may be configured to combine the light received from the plurality of input ports of the PIC 102 and output a portion of the resulting combined power via one or more outputs.

Figures 1B, 1C:
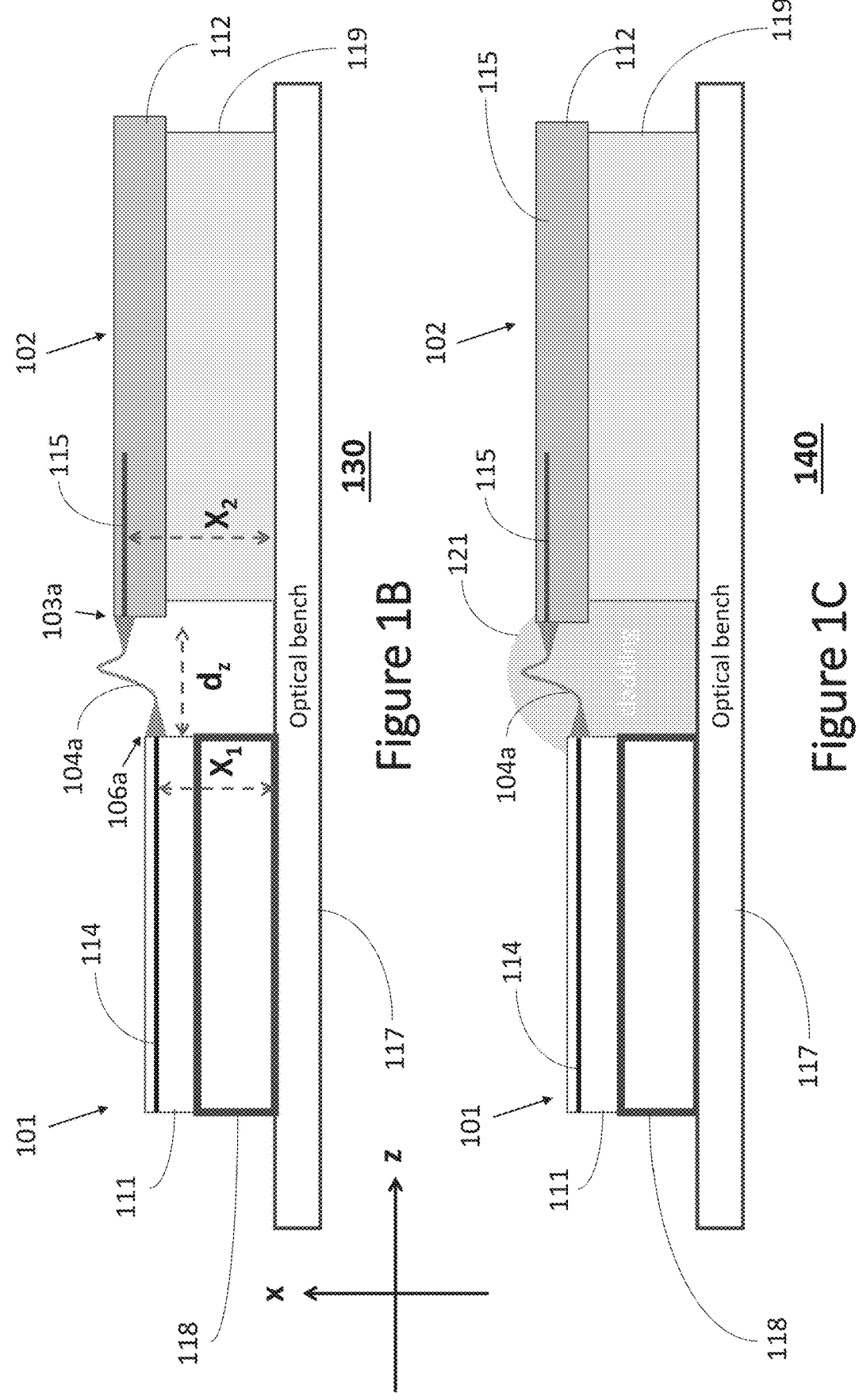
FIG. 1B schematically illustrates a side cross-sectional view of an optical device (e.g., a multi-wavelength optical source) comprising a photonic integrated circuit (PIC) connected to a plurality of optical sources (e.g., lasers) via a plurality of air-cladded polymer waveguides.
FIG. 1C schematically illustrates a side cross-sectional view of an example optical device (e.g., a multi-wavelength optical source) comprising a PIC optically connected to a plurality of optical sources via a plurality of encapsulated polymer waveguides.

FIG. 1B schematically illustrates a side cross-sectional view of an optical device 130 (e.g., a multi-wavelength optical source) comprising a PIC 102 optically connected to a plurality of optical sources 101. For example, the optical device 130 can be an example of the multi-wavelength optical source 100 shown in FIG. 1A. In some embodiments, the plurality of the optical sources 101, may be a laser array comprising semiconductor lasers (e.g., DFB or DBR lasers) monolithically fabricated on a laser substrate 111. In some examples, one or more possibly each semiconductor laser, may comprise an active waveguide (e.g., the active waveguide 114 of the laser shown in the cross-section) comprising optically active material (e.g., a compound III-V semiconductor material), along which a distributed Bragg grating (DFB) or two distributed Bragg mirrors (DBR) are disposed. In some cases, the laser substrate (or laser chip) 111 may be mounted on an optical source carrier chip 118 (e.g., a ceramic carrier). An individual optical source of the plurality of optical sources 101, possibly each optical source, may have an output port (e.g., the output port 106a of the laser shown in the cross-section) through which a portion of laser light exits the active waveguide (e.g., the active waveguide 114). In some examples, the output port 106a can may comprise a portion of a waveguide (e.g., a cleaved facet of the waveguide). In some such examples, the facet may be coated with AR layer(s).

The PIC 102, may comprise a PIC substrate 112 on which a one or more photonic devices are monolithically fabricated. An input port of the PIC 102 can be a facet (e.g., a cleaved facet) of an input waveguide of the PIC. In some examples, the PIC 102 can be a silicon photonic PIC and the input waveguide can be a silicon-on-insulator (SOI) waveguide. The PIC substrate 112 may be mounted or attached to a PIC carrier chip 119. In some examples, an input port 106a of the PIC 102 may comprise a portion of a waveguide (e.g., a cleaved facet of the waveguide). In some such examples, the facet may be coated with AR layer(s).

The optical source carrier chip 118 and the PIC carrier chip 119 may be mounted on an optical bench 117. In some implementations, the optical source carrier chip 118 and the PIC carrier chip 119 may be mounted such that a distance $d_z$ between the output port 106a and the input port 103a along a longitudinal direction (e.g., parallel to the active waveguide 114 and the PIC input waveguide 115) is larger than 10 microns, 20 microns, 50 microns, or 100 microns, 200 microns, 500 microns or any range between any of the values or longer or shorter. In some cases, the distance $d_z$ may be between 10 microns and 50 microns, 50 microns and 100 microns, or 100 microns and 150 microns, 150 microns and 200 microns, 200 microns and 500 microns or any range between any of the values or higher or lower.

In some implementations, a vertical distance $X_1$ (perpendicular to the top surface of the optical bench 117 and/or perpendicular to the top and/or bottom major surfaces of the laser chip 111 and/or PIC 102) between a center of the output port 106a and a top surface of the optical bench 117, is different than a vertical distance $X_2$ between a center of the input port 103a and a top surface of the optical bench 117. In some cases, the difference between $X_1$ and $X_2$ may be larger than 10 microns, 20 microns, 50 microns, or 100 microns or any range between any of the values or longer or shorter. Likewise, the vertical distance (perpendicular to the top surface of the optical bench 117 and/or perpendicular to the top and/or bottom major surfaces of the laser chip 111 and/or PIC 112) between a center of the output port 106a and a center of the input port 103a is larger than 10 microns, 20 microns, 50 microns, or 100 microns or any range between any of the values or longer or shorter.

In some cases, the output facet 106a and/or the input facet 103a may be coated with an antireflection (AR) layer(s) (e.g., including a plurality or dielectric layers). An AR layer may be designed to reduce optical reflection at an interface between a polymer waveguide 104a and the input port 103a or the output port 106a.

The output port (or facet) 106a may be optically connected to the input port (or facet) 103a by a polymer waveguide 104a such as a photonic wire, or a photonic wire bond having a first end connected to the output port 106a and a second end connected to input port 103a. In some cases, the polymer waveguide or photonic wire bond 104a may be a curved waveguide having one or more curved regions which have different curvatures. In some cases, a shape of the first end of the polymer waveguide or photonic wire bond 104a may be different than a shape of its second end. In some cases, the shape of the first end may be designed according to an optical mode of the active waveguide 114 and the shape of the second end may be designed according to the optical mode of the input waveguide 115 of the PIC. In some cases, a shape and a cross-section of the polymer waveguide or photonic wire bond 104a along its length may be designed to reduce optical transmission loss between the first and the second end (e.g., optical transmission loss causes by optical mode mismatch). In some cases, a diameter of the polymer waveguide 104a may be between 1 and 2 microns, 2 and 4 microns, 4 and 5 microns, 5 and 6 microns, 6 and 8 microns, 8 and 10 microns, 10 and 15 microns, 15 and 20 microns, 20 and 30 microns, or any range between any of these values or larger or smaller. As such, in some cases, a spacing between the output port 106a and the next output port, or a spacing between the input port 103a and the next input port, can be between 2 and 4 microns, 4 and 5 microns, 5 and 6 microns, 5 and 10 microns, 10 and 20 microns, 20 and 30 microns, 30 and 40 microns, 40 and 50 microns, 50 and 100 microns, 100 and 500 microns, 500 and 1000 microns, or any range between any of these values or larger. In some cases, a spacing between an output port 106a or input port 103a and the next or adjacent output port or input port can be a center-to-center distance (e.g., a distance between a center of the output port or facet 106a or a center of input port or facet 103a and the center of the next/adjacent output port/facet or input port or facet respectively).

In some cases, the first and the second ends may have a tapered shape wherein a cross-section of the polymer waveguide gradually decreases (linearly or nonlinearly) as a function of a distance from an interface between the polymer waveguide/photonic wire bond and the output port 106a (or the output port 103a). The cross-section of the polymer waveguide may comprise a cross-sectional area of the polymer waveguide in a plane perpendicular to the direction of propagation of light within the polymer waveguide.

In some cases, the polymer waveguide or photonic wire bond may be bonded to the output port 106a (or the input port 103a). For example, a bond (e.g., a chemical bond) may be formed between the output facet 106a of the active waveguide and the first end of the polymer waveguide/photonic wire bond 104a, or the input facet 103a of the PIC input waveguide and the second end of the polymer waveguide/photonic wire bond.

In some examples, the first and/or the second end of a polymer waveguide/photonic wire bond that is connected to the output port (or the input port), may cover a portion of the active waveguide (or the PIC input waveguide). In some such examples, the first or the second end of the polymer waveguide/photonic wire bond may be conformally shaped according to a shape or size of the facet or waveguide region to which they are connected to. In some such cases, the first and/or the second ends of the polymer waveguide/photonic wire bond may have a tapered or flared shape (e.g., the lateral dimension such as width or diameter may be tapered or flared). For example, a cross-section of the polymer waveguide gradually may increase (linearly, or nonlinearly) with respect to a distance from an interface between the polymer waveguide/photonic wire bond and the waveguide for a least a portion of the length of the polymer waveguide/photonic wire bond, for example, 1-5%, 5-10%, 10-20%, 20-30%, 30-40%, 40-50%, 50-60%, 60-70%, 70-80%, 80-90%, 80-95%, 95-100% or any range formed by any of these values. The cross-section of the polymer waveguide may comprise a cross-sectional area of the polymer waveguide in a plane perpendicular to the length of the polymer waveguide/photonic wire bond and/or perpendicular to the direction of propagation of light within the polymer waveguide/photonic wire bond.

Figure 1D:
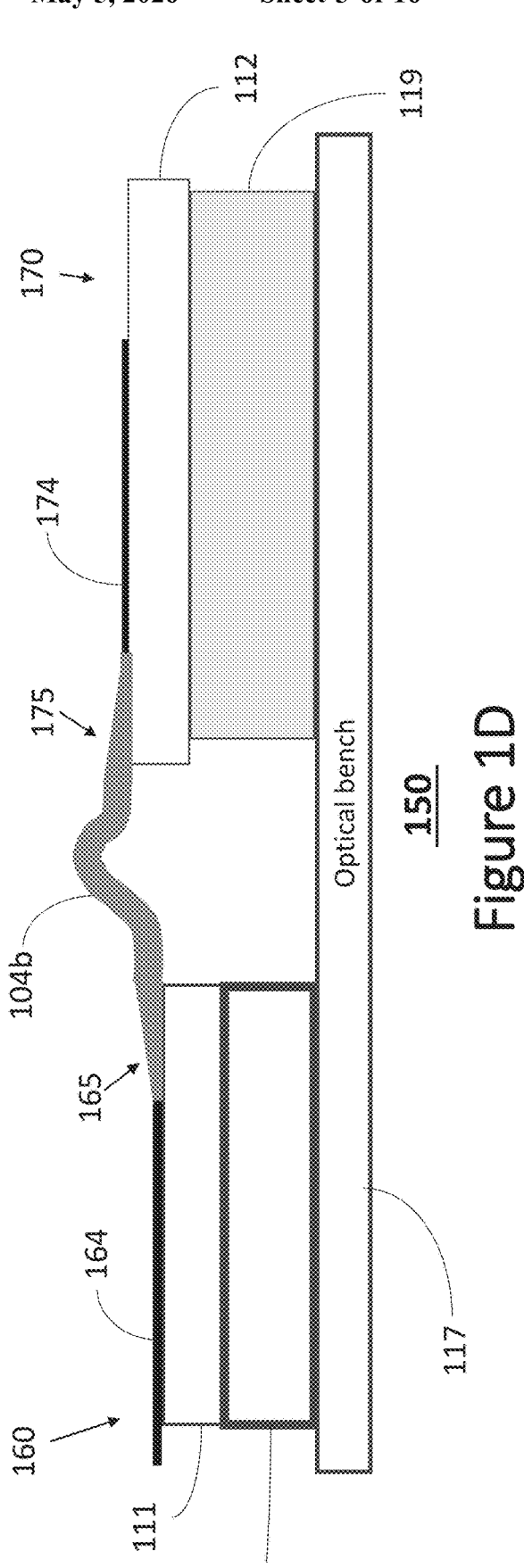
FIG. 1D schematically illustrates a side cross-sectional view of another example optical device (e.g., a multi-wavelength optical source) comprising a PIC optically connected to a plurality of optical sources via a plurality of air-cladded polymer waveguides. As illustrated, the air-cladded polymer waveguide is thicker in the middle in comparison to the ends where the thickness is reduced.

FIG. 1D schematically illustrates a side cross-sectional view of an optical device 150 (e.g., a multi-wavelength optical source) comprising a PIC 170 optically connected to a plurality of optical sources 160 via a plurality of the polymer waveguides/photonic wire bonds. The optical device 150, the PIC 170, and the optical sources 160 may comprise one or more features described above with respect to optical device 130, PIC 102 and the optical sources 101. In some cases, the PIC 170 may include a waveguide (e.g., an SOI waveguide) disposed on a top surface of the PIC substrate 112 and the optical source may include a laser having an active waveguide 164 disposed on the top surface of the laser chip 111. A polymer waveguide/photonic wire bond 104b of plurality of the polymer waveguides/photonic wire bonds may optically connect an output port of an active waveguide 164 of a laser to an input port of the waveguide 174. In some examples, the output port of a waveguide may comprise an out-coupling region configured to couple light from waveguide to the polymer waveguide/photonic wire bond 104a. In some examples, the input port of a waveguide 174 may comprise an in-coupling region configured to couple light from the polymer waveguide/photonic wire bond 104b to the waveguide. In some cases, an in-coupling region or an out-coupling region may comprise a mode converter, a tapered region, or a grating region. In some examples, a first end 165 of the polymer waveguide/photonic wire bond 104b may cover an out-coupling region of the active waveguide 164 and a second end 175 of the wire bond 104b may cover an in-coupling region of the waveguide of 174. In some cases, the first and second ends 165/175 of the polymer waveguide/photonic wire bond 104b may be conformally shaped according to a shape or size of the waveguide or waveguide region to which they are connected to, in order to provide an adiabatic transition between an optical mode of the polymer waveguide/photonic wire bond 104b and an optical mode of the corresponding waveguide. In some such cases, the first and the second ends 165/175 of polymer waveguide/photonic wire bond 104b may have a tapered shape wherein a cross-section of the polymer waveguide 104b gradually increases as function (linear or nonlinear function), of a distance from a boundary between the covered and/or uncovered portions of the laser waveguide 164 or the waveguide 174.

In some cases, at least a portion of the polymer waveguide/photonic wire may comprise a tapered region. A cross-section (e.g., width or diameter of a cross-section) of the polymer waveguide/photonic wire in a plane perpendicular to a direction of propagation of light in the polymer waveguide/photonic wire, may vary (linearly or nonlinearly) along the direction of propagation of light.

In some examples, polymer waveguide/photonic wire (e.g., polymer waveguide/photonic wire 104a or 104b) may comprise a first end, a second end, a middle section extending from the first end to the second end. In some cases, at least one of the first end or the second end may comprise a tapered or flared region. The tapered region may displaced a distance from an edge of the first end or the second end toward the middle of the polymer waveguide/photonic wire such as 1 micron, 2 micron, 5 microns, 10 microns, 20 microns, 50 microns, 100 microns, 500 micron or any ranges formed by any of these values or larger or smaller distances.

In some examples, a length of the tapered region can be longer than 2 microns, 5 microns, 10 microns, 20 microns, 50 microns, 100 microns, 500 micron or any ranges formed by any of these values or may be larger or smaller.

The tapered region may a have cross-sectional area that linearly or nonlinearly increases or decreases as a function of a distance in a direction from the first end or the second end toward the middle section of the polymer waveguide/photonic wire. In some cases, the middle section of a polymer waveguide/photonic wire may comprise at least one curved region or at least one bend. In some cases, the tapered or flared region may comprise a cylindrically symmetric or substantially cylindrically symmetric region.

In some cases, at least a section of the polymer waveguide/photonic wire bond is cladded by air or a polymer having a single refractive index different from the refractive index of the polymer waveguide/photonic wire bond. In some cases, at least a section of the polymer waveguide/photonic wire bond may be surrounded by a medium having a single refractive index.

In some implementations, a polymer waveguide/photonic wire bond that optically connects a PIC to an output port of an optical source may include at least one end having a tapered region (e.g., proximal or near an input port of the PIC or an output port the optical source). In some cases, such as the polymer waveguide/photonic wire 104a in FIG. 1B, both ends of the polymer waveguide/photonic wire may include a tapered region, where a cross-sectional area of the tapered region in a plane perpendicular to the direction of propagation of light within the tapered region may gradually decrease (linearly or nonlinearly) as a function of a distance from a boundary between the covered and/or uncovered portions of the waveguide, of a distance from the output port toward the middle of the polymer waveguide/photonic wire bond, or of a distance from the input port toward the middle of the polymer waveguide/photonic wire bond.

In some cases, such as polymer waveguide 104b in FIG. 1D, both ends of the polymer waveguide/photonic wire 104b may include a tapered region where a cross-sectional area of the tapered region in a plane perpendicular to the direction of propagation of light within the tapered region gradually increases (linearly or nonlinearly) as a function of a distance from a boundary between a covered and/or an uncovered portion of the waveguide 174 (or active waveguide 164).

In some cases, a diameter or width of the polymer waveguide/photonic wire 104b may be between 1 and 2 microns, 2 and 4 microns, 4 and 5 microns, 5 and 6 microns, 6 and 8 microns, 8 and 10 microns, 10 and 15 microns, 15 and 20 microns, 20 and 30 microns, 30 and 40 microns, or any range between any of these values or larger or smaller.

In yet other examples, both ends of the polymer waveguide/photonic wire may include a tapered region wherein one of the tapered region is similar to the tapered regions 165, 175 shown in FIG. 1D and another tapered region is similar to the tapered regions shown FIG. 1B.

In various implementations, the length of a tapered region of a polymer waveguide/photonic wire bond may be less than 5 microns, less than 10 microns, less than 20 microns, or less than 100 microns, or less than 1 mm or any range between any of these values or larger or smaller.

In some cases, a cross-sectional shape of at least a portion of the polymer waveguide/photonic wire 104a, 104b, in a plane perpendicular to a direction of propagation of light within the polymer waveguide/photonic wire 104a, 104b, may comprise a circular, round, oval, or elliptical shape. In some cases, a maximum diameter, width, or lateral extent of the polymer waveguide/photonic wire 104a, 104b extending between an input port and an output port may not exceed 6 microns, 8 microns, 10 microns, 20 microns, 40 microns, 50 microns, or be in any range between any of these values or may be larger or smaller.

In various implementations, a variation of the cross-sectional area or the diameter, width, or lateral extent of a tapered region of a polymer waveguide/photonic wire (in a plane perpendicular to the direction of propagation of light), along the direction of propagation of light may be tailored to support an adiabatic transition between an optical mode propagating in the polymer waveguide/photonic wire and an optical mode propagating in a waveguide to which the polymer waveguide/photonic wire is connected or vice versa.

In some implementations, a maximum diameter, width, or lateral extent of a polymer waveguide/photonic wire, or a shape and/or size of a tapered region of polymer waveguide/photonic wire, may be determined based at least in part on a wavelength ($\lambda$) of light propagating in the polymer waveguide/photonic wire, a refractive index of the polymer waveguide/photonic wire ($n_c$), and a refractive index ($n_m$) of a medium surrounding the polymer waveguide/photonic wire (e.g., air, or an encapsulating material).

In some cases, for a given wavelength and given refractive indices of the polymer waveguide/photonic wire and the surrounding medium, the maximum diameter, width, or lateral extent of the polymer waveguide/photonic wire may not exceed a threshold value above which the polymer waveguide/photonic wire supports more than one transverse mode. In some examples, the maximum diameter of the polymer waveguide/photonic wire having circular or round cross-section, may not exceed a threshold value above which the V-number ($V=(2\pi a/\lambda)\times\sqrt{(n_c^2-n_m^2)}$, were a is the radius of the polymer waveguide/photonic wire of the polymer waveguide/photonic wire exceeds 2.4.

In various implementations, the polymer waveguide is a photonic wire bond fabricated using a photonic wire bonder after mounting the PIC 102 (or 170) and the laser array 101 (or 160) on the optical bench 117. In some cases, the photonic wire bond may be fabricated using three-dimensional photolithography such as using a focused laser beam that can be moved in three dimensions so as to be located precisely in three dimensions. In some cases, for example, the gap between the PIC 102 (or 170) and the laser array 101 (or 160) may be filled with a photosensitive polymer (e.g., a UV curable polymer, or photosensitive resist). In some cases, a layer of photosensitive polymer may be disposed on at least a portion of the PIC 102 (or 170) and at least a portion of the laser array 101 (or 160). In some cases, photosensitive polymer may comprise PMMA, PDMS, or other types of photosensitive polymers. Subsequently, a focused laser beam (e.g., an ultra-violet laser beam) may be used to polymerize selected regions of the photopolymer (e.g., via two-photon photo polymerization) according to a desired shape of the polymer waveguide 104a (or 104b). The ultra-violet laser beam can be a high numerical aperture laser beam controlled by several micro/nano-positioners in three dimensions. In some cases, the photopolymer may be baked at an elevated temperature before and/or after photo-polymerization. In some examples, the polymer waveguide 104a may be an air-cladded waveguide. In some examples, the polymer waveguides 104a or 104b may be encapsulated in a polymer layer after fabrication. FIG. 1C schematically illustrates a side view of an example optical device 140 (e.g., a multi-wavelength optical source) comprising a PIC 102 optically connected to a plurality of optical sources 101 via a plurality of encapsulated polymer waveguides/photonic wire bonds. In the example shown, the polymer waveguide/photonic wire bond 104a is embedded in a polymer layer 121. The optical refractive index of the polymer layer 121 may be lower than that of the photopolymer or the polymer waveguide/photonic wire bond 104a to enable confinement and guided transmission of light in the polymer waveguide 104a.

Figure 2:
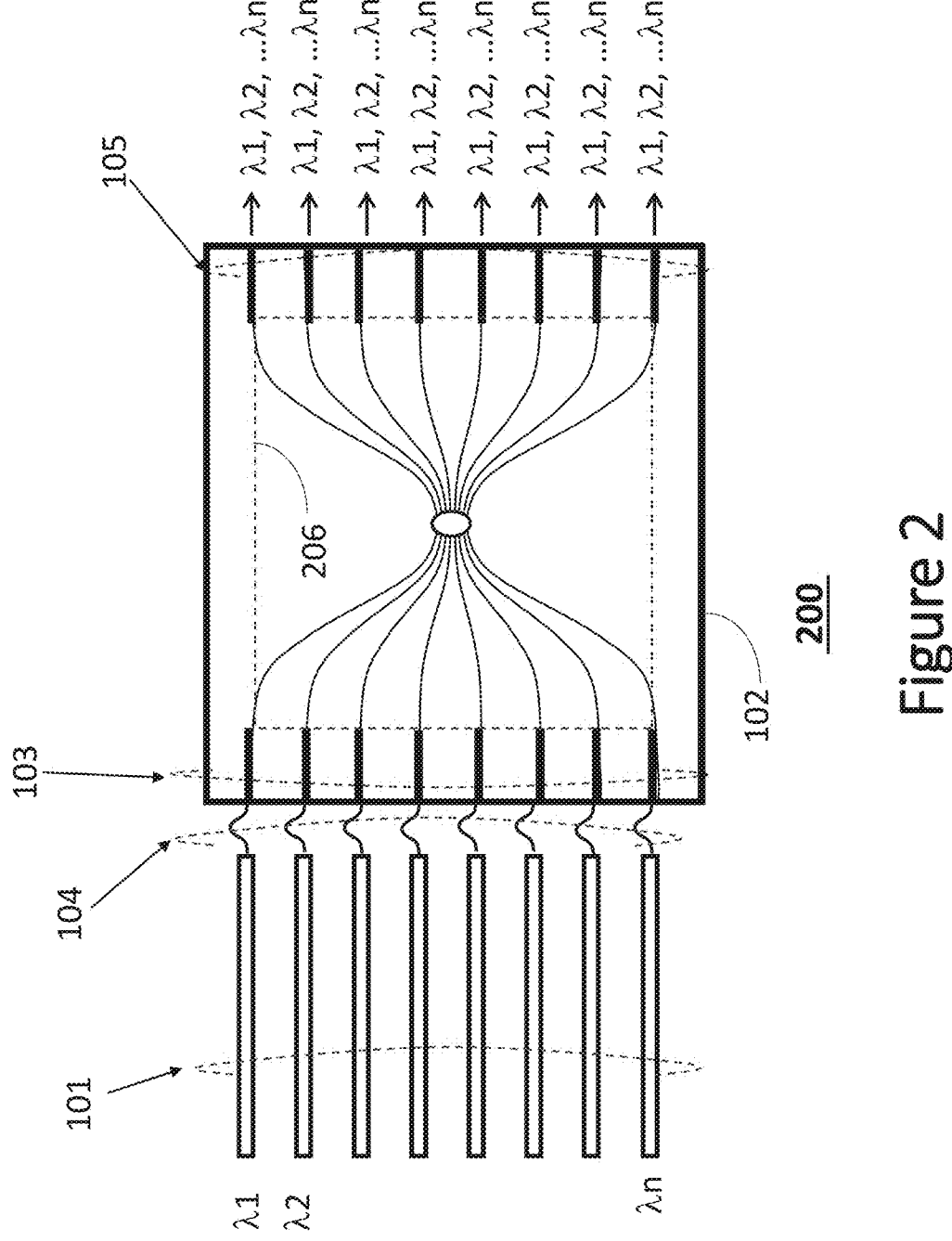
FIG. 2 illustrates an example multi-wavelength source comprising a star coupler.

FIG. 2 schematically illustrates an example multi-wavelength source 200 in accordance with certain embodiments described herein. In this example, the optical multiplexer comprises a star coupler 206 monolithically fabricated on the PIC chip 102. The star coupler 206 comprises a plurality of input waveguides configured to receive light from the plurality of input ports 103 of the PIC and a plurality of output waveguides optically connected to the plurality of PIC output ports 105. In some cases, the number of input waveguides may be equal to the number of output waveguides. In some cases, the number of input waveguides on the star coupler may be equal to the number input ports 103. In some cases, the number of output waveguides on the star coupler may be equal to the number PIC output ports 105. In some implementations, the star coupler 206 may be configured to couple a portion of the light received by each input waveguide to all output waveguides. In some cases, the portion of the light coupled to an output waveguide may be independent of the wavelength of light at least for light having a wavelength within an operational wavelength range of the multi-wavelength optical source 200. In some designs, the star coupler 206 can be a star coupler monolithically fabricated on the PIC.

Figure 3:
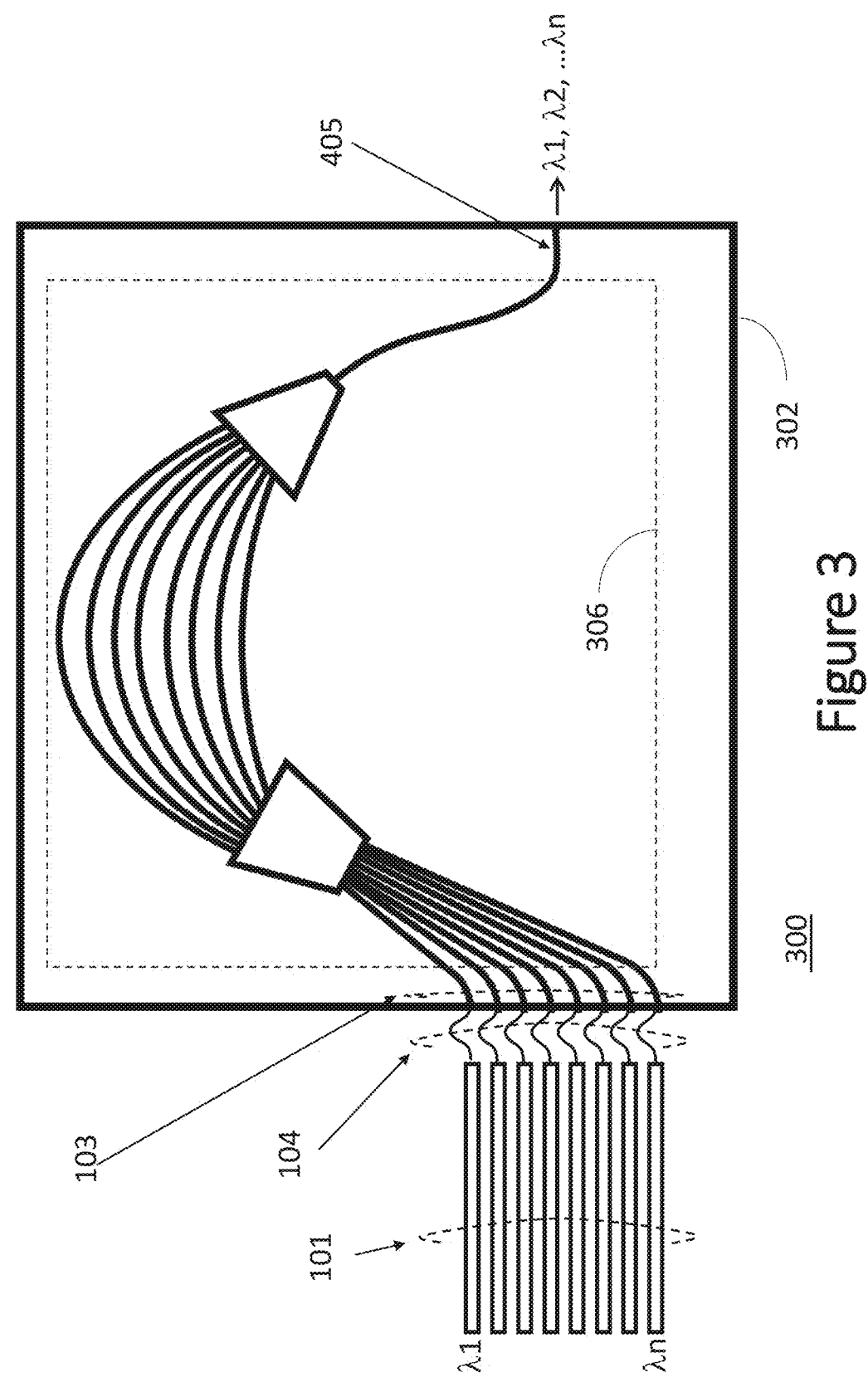
FIG. 3 illustrates another example of a multi wavelength source comprising an arrayed waveguide grating (AWG).

FIG. 3 schematically illustrates another example of a multi wavelength source 300 in accordance with certain embodiments described herein. The PIC 302 that receives light from the plurality of light sources 101 comprises a plurality of input ports 103 and a single output port 405. In this example, the optical multiplexer comprises an arrayed waveguide grating (AWG) 306 configured to combine multiple independent optical inputs having different wavelengths received from the plurality of input ports 103 of PIC 102 as a single optical output comprising multiple wavelengths. In some cases, the single output may comprise at least a portion of wavelengths ($\lambda 1, \lambda 2, \ldots \lambda n$) generated by the plurality of sources 101 optically connected to the input ports 103.

In some implementations, the PIC 302 may comprise a plurality of output ports 105 and an optical splitter (e.g., a multimode interferometer) configured to divide the single output received from the AWG 306 between the plurality of output ports of the PIC 302. In these implementations, light output by each output port of the plurality of output ports may comprise at least a portion of the wavelengths emitted by the plurality of the optical sources 101. In some cases, the optical splitter may equally divide the optical power received from the AWG output among the output ports. In some other cases, the optical splitter may provide different portions of the optical power output by the AWG 304 to different output ports.

In various embodiments, the waveguides in the star coupler 206 or the AWG 306 may comprise silicon, silicon nitride, glass, doped glass, or a polymer. In some cases, silicon or silicon nitride waveguides may be fabricated on a silicon dioxide layer.

Figure 4A:
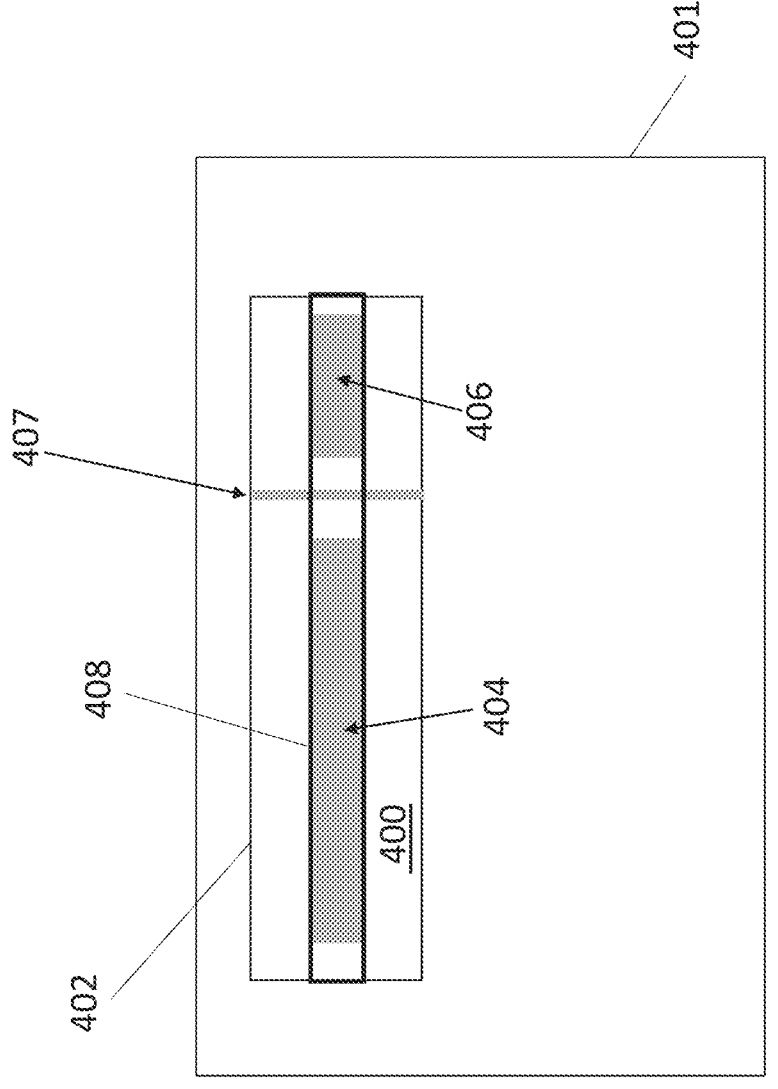
FIG. 4A illustrates an example of a laser chip comprising a semiconductor laser and an optical amplifier, mounted on a laser carrier chip.

FIG. 4A schematically illustrates an example of an optical source 400 of the plurality of optical sources 101 that may be used in a multi wavelength optical source (e.g., multi wavelength optical source 100, 200 or 300). The optical source 400 comprises a laser section 404 configured to generate narrowband laser light having a single center wavelength, and an optical amplifier section 406 configured to amplify the laser light received from the laser section 404. Two separate (electrically isolated) electrodes may be disposed on the laser section 404 and optical amplifier section 406 respectively to independently control the electrical currents injected to each section. For examples a first electrode disposed on the laser section 404 may control the current injected to the laser section 404 (and therefore the laser output power) and a second electrode disposed on the optical amplifier section 406 may control the current injected to the optical amplifier section 406 section (and therefore the optical gain provided by the optical amplifier section 406).

In some examples, the laser section 404 may be electrically and/or thermally isolated from the optical amplifier section 406 by an isolation layer (or region) 407. In some cases, the isolation layer 407 may comprise an ion implanted region of an active waveguide and/or the substrate on which the active waveguide is disposed. In some implementations, the laser section 404 and the amplifier 406 may be sections of an active waveguide 408 comprising a semiconductor material (e.g., III-V semiconductor material) that can provide optical gain upon excitation (e.g., electrical excitation) or pumping. In some cases, a section of the active waveguide 408 (e.g., a section between the laser section 404 and the amplifier section 406) may comprise a different material (e.g., a material having a different bandgap such as a larger bandgap) compared to the laser section 404 and the optical amplifier section 406. In some cases, the isolation layer (or region) 407 may comprise a material composition different from that of the laser section 404, the optical amplifier section 406, or a waveguide region between them. The isolation layer 407 may be included in an isolation section. For example, a section of the active laser waveguide 408 between the laser section 404 and the optical amplifier section 406 may serve as an isolation section configured to reduce thermal cross talk between the laser section 404 and optical amplifier section 406. In some cases, the active waveguide 408 may be fabricated or formed on a laser chip 402.

In some cases, the length of the isolation section may be longer than 50% of a thickness of the active waveguide 408 or longer than 50% of the combined thickness of the active waveguide 408 and a substrate on which the laser waveguide 408 is fabricated or formed. In some implementations, an isolation section of the active waveguide 408 may comprise of a material having a different bandgap (e.g., larger bandgap) compared to the rest of the active waveguide 408. Advantageously, an isolation section having a different (e.g., larger) bandgap may not absorb light output by the laser and therefore transmit the laser light from the laser section 404 to the optical amplifier section 406 with negligible attenuation (while thermally and/or electrically isolating the laser section 408 from the optical amplifier section 406).

In some cases, the isolation layer 407 may have a thermal conductance and/or electrical conductance lower than that of the laser section 404, the optical amplifier section 406, or a waveguide region between them.

In various embodiments, the laser section 404 and the optical amplifier section 406 may be monolithically fabricated on a single semiconductor layer on the laser chip 402. The laser chip 402 may be mounted or attached to a laser carrier chip or substrate 401 in some cases. In certain implementations, the carrier or the substrate 401 may be the substrate of a laser bar on which a plurality of optical sources 101 such as, for example, optical sources similar to the optical source 400 are disposed.

In some cases, the laser section 404 and the optical amplifier section 406 may be spatially separated by a distance to reduce thermal crosstalk between the laser section 404 (e.g., a DFB laser section) and the optical amplifier 406 (e.g., an SOA). For example, the laser section 404 and the optical amplifier 406 may be separated by an isolation section. In some implementations, the laser section 404 and the optical amplifier section 406 may comprise an active waveguide having a top cladding layer, a core layer, and a bottom cladding layer. In some such cases, the core layer may comprise a gain region configured to provide optical gain upon being pumped (e.g., upon receiving injection current). In some cases, the isolation section may comprise a passive waveguide (e.g., a waveguide having a bandgap larger than of the laser section 404 and the optical amplifier section 406), or the active waveguide of the laser section 404 and the optical amplifier 406. As discussed above, the isolation section may comprise the thermal isolation layer (or region) 407. In some implementations, the length of the isolation layer (or region) 407 can be smaller or as large as the isolation section (e.g., when the entire isolation section is ion implanted). The isolation layer 407 may have either or both lower thermal electrical conductance and lower electrical conductance than other regions of the isolation section. In some cases, the isolation layer may comprise a different material composition than other portions of the isolation section. In some implementations, the length of an isolation section may be N times larger than a chip thickness, and N can be from 0.3 to 1, 0.5 to 1, 1 to 2, 1 to 3, 1 to 4, 1 to 5, 5 to 10, 10 to 15, or 15 to 20, or any range formed by any of these values or larger or smaller, for example, in some implementations to obtain a desired thermal isolation level. In some cases, the chip thickness may be the thickness of the laser chip 402, a thickness between an active region of the laser section 404 or the amplifier section 406, to the top of the substrate or laser carrier chip or the substrate 401, a distance from a top cladding of the active waveguide 408, to the top of the laser carrier chip or substrate 401, or a distance from a top cladding of the active waveguide 408, to the bottom the a bottom cladding of the active waveguide. Accordingly, in various implementations the isolation section may be at least 0.5 or greater than 0.5 or at least 1.0 or greater than 1.0 times these thicknesses (e.g., the chip thickness referenced above). In various implementations, the chip thickness may be from 50 to 70 microns, from 70 to 90 microns, from 90 to 110 microns, from 110 microns to 130 microns, from 130 microns to 150 microns, from 150 microns to 200 microns or any range formed by the ese values or larger or smaller.

In some cases, the length the isolation section can be from 30 to 50 microns, from 50 microns, from 50 to 70 microns, from 70 to 90 microns, from 90 to 110 microns, from 110 microns to 130 microns, from 130 microns to 150 microns, from 150 microns to 200 microns or any range formed by the ese values or larger or smaller. In some cases, the length the isolation layer 407 can be from 1 to 10 microns, from 10 to 30 microns, from 30 to 50 microns, from 50 microns, from 50 to 70 microns, from 70 to 90 microns, from 90 to 110 microns, from 110 microns to 130 microns, from 130 microns to 150 microns, from 150 microns to 200 microns or any range formed by the ese values or larger or smaller.

In some cases, laser section 404 and the optical amplifier section 406 may be individually controlled via two separate electrodes to adjust the power and the wavelength of laser light output by the optical source 400. In some such cases, the output power of the optical source 400 can be adjusted by adjusting a current provided to the optical amplifier section 406 without affecting the wavelength of the light output by the optical source 400.

Figure 4B:
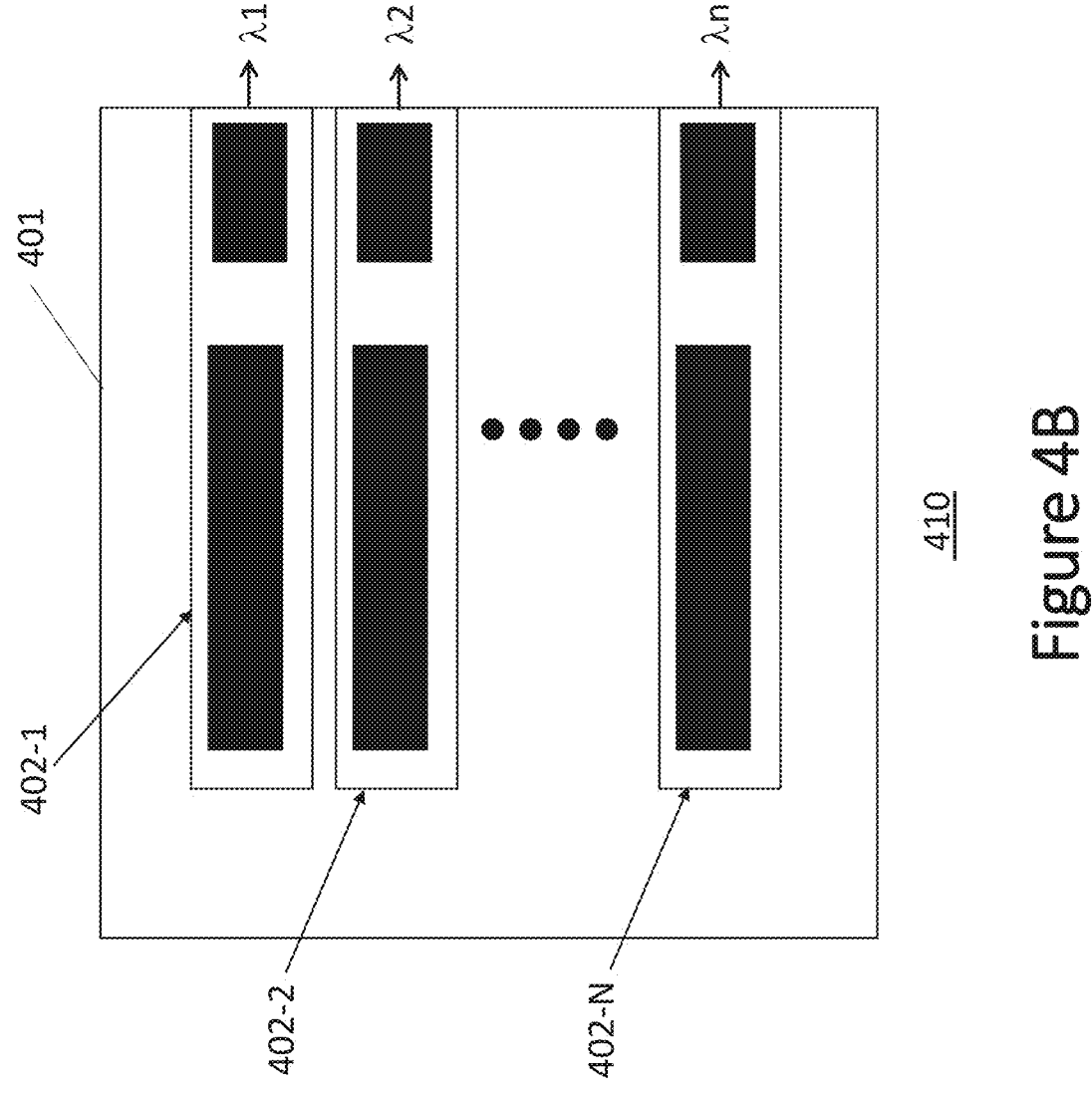
FIG. 4B illustrates schematically illustrates a laser array comprising a plurality of laser chips (e.g., similar to the laser chip shown in FIG. 4A) disposed on a laser carrier chip.

FIG. 4B schematically illustrates a laser array 410 comprising a plurality of laser chips (402-1, 402-2, 402-3, . . . 402-N) disposed on a laser carrier chip 401. In various implementations, the individual laser chips (402-1, 402-2, 402-3, . . . 402-N) may comprise one or more features described above with respect to the laser chip 402. In some cases, the laser chips (402-1, 402-2, 402-3, . . . 402-N) may be individually tested before being mounted on the carrier chip 401. For example, one or more parameters such as an optical output power, polarization, and spectrum of the laser source on a laser chip may be characterized potentially in conjunction with the current that drives the laser source. In some cases, the laser chips (402-1, 402-2, 402-3, . . . 402-N) having an optical and/or electrical performance better than threshold performance may be mounted on the carrier chip 401. In various implementations, the number of laser chips (402-1, 402-2, 402-3, . . . 402-N) included in the laser array 401 may be 4, 8, 16, or 32 or any number in any range formed by any of these values or may be higher or lower. In various implementations, the optical connection between the plurality of laser chips (402-1, 402-2, 402-3, . . . 402-N) and a PIC (e.g., PIC 100, 200, or 300) may be provided after mounting all laser chips on the laser carrier chip 401. In some cases, a laser chip may consist of more than one, e.g., 2, 3, 4, 6 or 8 individual lasers. In some cases, some of the lasers included in a laser chip may be included for redundancy and may not all be photonic wire bonded to a PIC. For example, one or more lasers on a laser chip may be identified as defective or having low performance during a testing step and may not be photonic wire bonded to a PIC.

Figure 5:
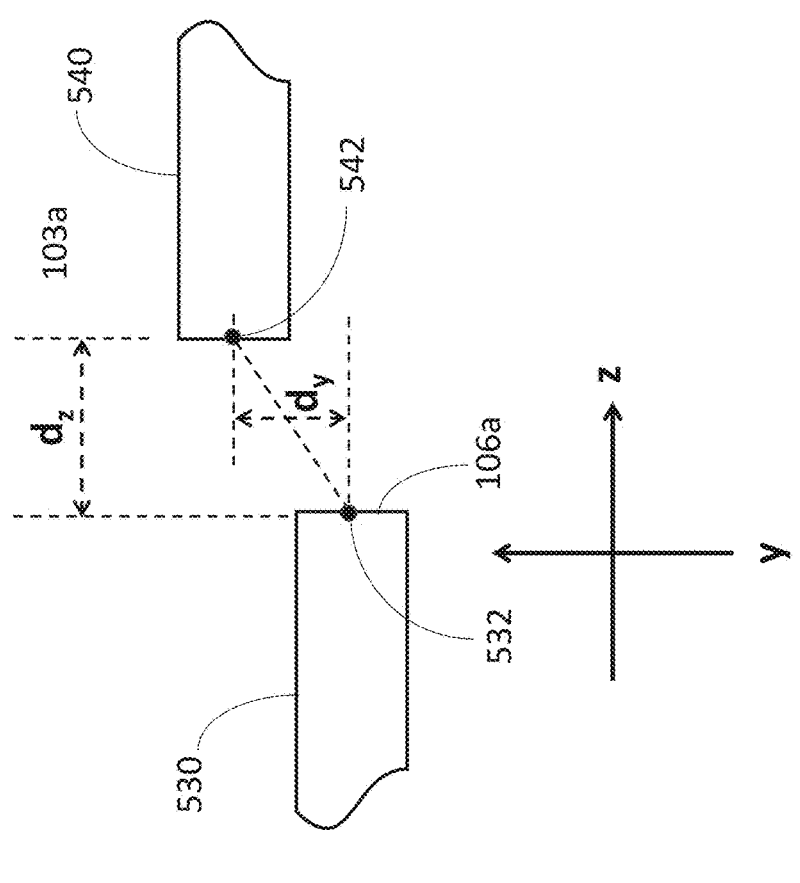
FIG. 5 schematically illustrates the alignment between an output port of an optical source and an input port of a PIC.

FIG. 5 schematically illustrates the alignment between an output port 106a of an optical source of the plurality of optical sources 101, and input port 103a of the plurality of input ports of the PIC (e.g., PIC 100, 200, or 300). In various implementations, the output port 106a can be a facet of an output end 530 of a waveguide associated with the optical source. In some cases, the facet may be AR coated. The output end 530 may comprise, a passive waveguide section, or an active waveguide section. The passive waveguide section may comprise a Bragg grating, or a mode converter and the active waveguide section may comprise a Bragg grating. In various implementations, the input port 103a can be a facet of an input end 540 of a waveguide fabricated on the PIC. In some cases, the facet may be AR coated.

In some embodiments, a center point 532 of the output facet 106a and a center point 542 of the input facet 103a may be separated by a longitudinal distance $d_z$ along a longitudinal direction (e.g., along, z-axis), a first lateral distance $d_x$ along a first lateral direction perpendicular to the longitudinal direction (e.g., along the x-axis), and a second lateral distance $d_y$ along a second lateral direction (e.g., along the y-axis) perpendicular to the first lateral direction and the longitudinal direction. The longitudinal direction may be parallel to the output end 530 and/or the input end 540 and/or to the top and/or bottom major surfaces of the laser chip and/or PIC 102. In some implementations, the longitudinal distance $d_z$, the first lateral distance, $d_x$, and the second lateral distance $d_y$ may be between 5 to 10 microns, 10 to 30 microns, 30 to 50 microns, 50 to 100 microns, 100 to 150 microns, 150 to 200 microns, 200 to 300 microns, 300 to 500 microns, or any range between any of these values or larger or smaller. The center point 532 can be a point on the surface of the output port 106a located in the middle of a thickness of the output end 530 (e.g., along x-axis) and in the middle of the width of the output end 530 (e.g., along y-axis). The center point 542 can be a point on the surface of the input port 103*a* located in the middle of a thickness of the input end 540 (e.g., along x-axis) and in the middle of the width of the input end 540 (e.g., along y-axis).

In some implementations, the PIC (e.g., PIC 100, 200, or 300) may include other optical devices that receive the light output by the one or more outputs of the multiplexer (e.g., the multiplexer, 106, 206, or 306). The multiplexer and these other optical devices may be monolithically integrated on a single chip or substrate, in various implementations, to provide certain downstream functionality. In some examples, individual outputs (e.g., each output) of the multiplexer provide light to an optical channel of PIC configured to process light having a wavelength or wavelength range different than the wavelength or wavelength range of light processed by other channels. In some cases, an output of the multiplexer may be connected to an optical device in an optical sub-system associated with an optical channel of the PIC. The optical sub-system may be monolithically fabricated on the PIC substrate along with multiplexer. In some cases, optical sub-systems receiving light from different outputs of the multiplexer may be identical subsystems or subsystems providing the same functionalities. In some embodiments, the other optical devices may include demultiplexers, optical filters, optical modulators, optical switches that are interconnected by a network of waveguides. In these implementations, the outputs of the multiplexer may be optically connected to the other optical devices PIC.

Figure 6:
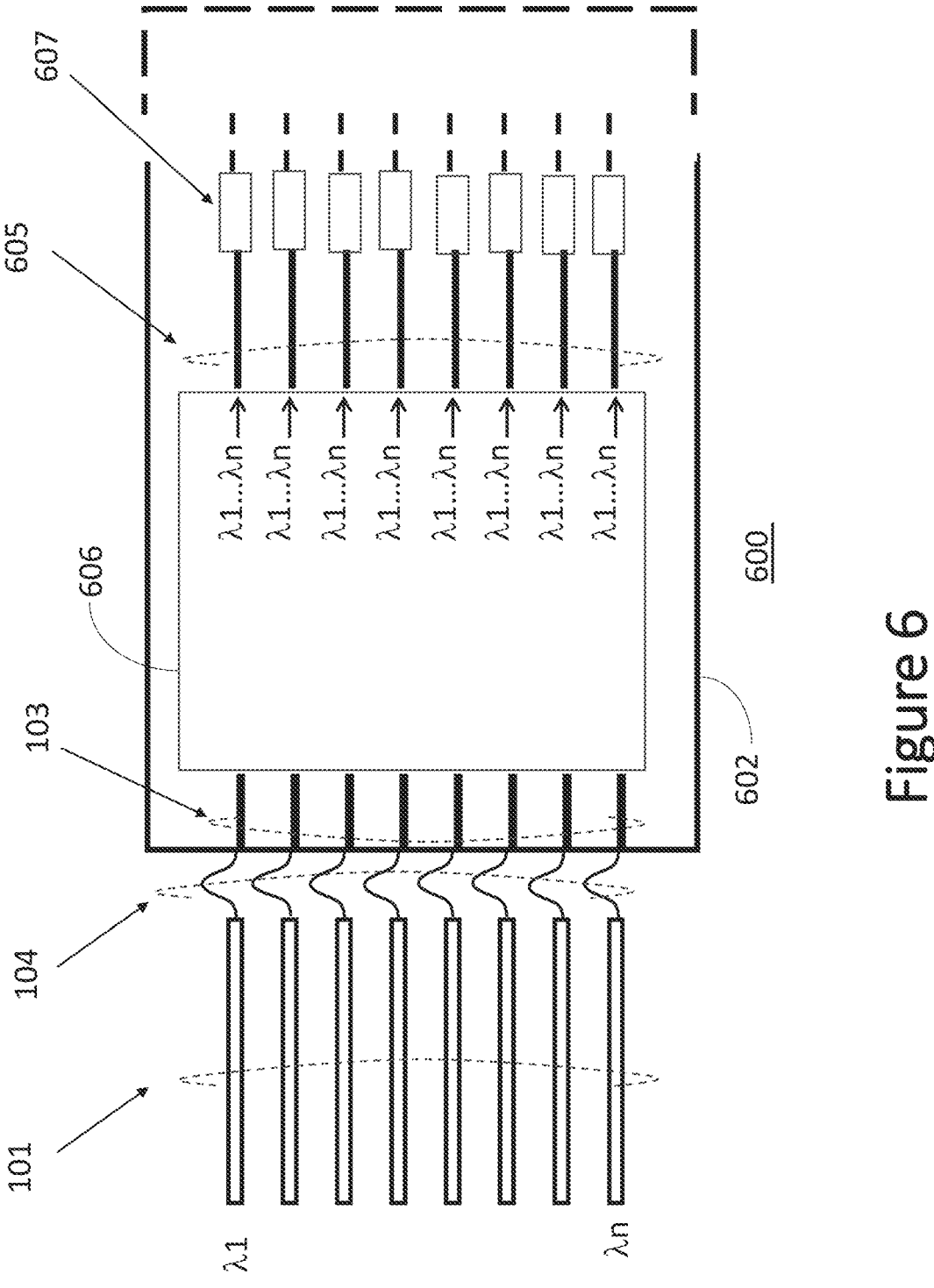
FIG. 6 illustrates an example of an optical system 600 comprising a plurality of lasers coupled to a PIC that includes an optical multiplexer and one or more optical devices and/or sub-systems receiving light from the optical multiplexer.

FIG. 6 illustrates an example of an optical (or photonic) system 600 comprising a plurality of DFB lasers 101 and a PIC 602. The optical system 600 may comprise one or more features described above with respect to the multi-wavelength source 100, 200, or 300. The PIC 602 may comprise, for example, a plurality of input ports 103, a multiplexer 606, and one or more photonic devices and/or subsystems optically connected to the multiplexer 606 on the PIC 602. The plurality of DFB lasers 101 may be photonically wire bonded to the input ports 103 of the PIC 602. The plurality of DFB lasers 101, the photonic wire bonds 104, the input ports 103 of the PIC 602, and the multiplexer 606 may form a multi-wavelength source. The one or more photonic devices or subsystems 607 may receive light from one or more outputs 605 of the multiplexer 606 and to provide downstream functionalities.

Multi-Wavelength Optical Sources Based on Dual Output Lasers

In some embodiments, individual optical sources of the plurality of optical sources may comprise a dual-output optical source configured to output light from a pair of output ports. For example, each optical source may comprise a dual-output optical source in some implementation. The plurality of dual output optical sources may be optically coupled to two PICs using two groups of coupling waveguides (e.g., photonic wire bonds). The configuration, mounting, and optical connection of two PICs and the plurality of dual output light sources may comprise some of the features with respect to configuration, mounting, and optical connection of a PIC and the plurality of single-output light sources described above FIG. 7 illustrates an example of an optical device 700 comprising a plurality of dual output optical sources individual ones (e.g., each) of which have a pair of output ports configured to output laser light generated in the light source. In some cases, the dual-output light source may generate laser light having a center wavelength different than the center wavelengths of the other dual-output sources. In certain cases, the plurality of dual-output optical sources may comprise a laser array or a laser bar 708 with two groups of output ports disposed along two opposite sides or edges 709/710 of the laser array or the laser bar 708. In some implementations, the plurality of dual-output optical sources may be optically connected to a first PIC 702*a* having a first group of input ports and a second PIC 702*b* having a second group of input ports. A first group of output ports near the first edge 709 of the laser array 708 may be optically connected to a first group of input ports via a first group of coupling waveguides 704*a* (e.g., photonic wire bonds). A second group of output ports near the second edge 710 of the laser array 708 may be optically connected to a second first group of input ports via a second group of coupling waveguides 704*b* (e.g., photonic wire bonds). In some cases, the first group of output ports may be closer to the first edge 709 and the second group of output ports may be closer to the second edge 710, of the laser array 708. Likewise, as shown, the first and second PICs 702*a*, 702*b* can be on, and/or optically connected to output ports on, opposite sides of the laser array 708.

In some cases, a dual output optical source of the plurality of dual output optical sources included in laser bar 708 may output a first output power from a first output port and a second output power from a second output port. In some cases, the first and the second output powers may be substantially equal. In some cases, a ratio between the first and the second output powers may be from 0.5 to 1, from 1 to 1.5, or from 1.5 to 2.

In various implementations, a spacing between the output ports in the first group of output ports, between the output ports in the second group of output ports, between the input ports in the first group of input ports, or between the input ports in the second group of input ports, can be less than 100 microns, less than 50 microns, or less than 20 microns or may be in any range formed by any of these values or may be larger or smaller.

As referenced above, in some cases, a coupling waveguide of the first and/or the second groups of coupling waveguides 704*a* and 704*b* may comprise a photonic wire bond. In some cases, the coupling waveguides 704*a* and 704*b* may comprise: monolithically fabricated waveguides (e.g., SOI waveguides, polymer waveguides, glass waveguides, and the like), or optical fibers (e.g., fiber arrays). In some such cases, the PIC 702*a*, the laser array 708 and the PIC 702*b*, and the first and the second groups of coupling waveguides 704*a* and 704*b*, may be monolithically fabricated on a single substrate.

In some cases, the laser array 708, the first PIC 702*a*, and the second PIC 702*b* may be fabricated on three separate chips. In some other cases, the laser array 708, the first PIC 702*a*, and the second PIC 702*b* may be fabricated (e.g., monolithically fabricated) on a single chip. In some cases, two of the laser array 708, the first PIC 702*a*, and the second PIC 702*b* may be fabricated on the same chip.

In some examples, the first PIC 702*a* and/or the second PIC 702*b* may comprise a first optical multiplexer and a second optical multiplexer respectively. In some examples, the first PIC 702*a* and/or the second PIC 702*b* may comprise a first group and a second group of PIC output ports configured to output light output from an optical multiplexer processed by the first PIC 702*a* and the second PIC 702*b*, respectively. In some implementations, both groups of output ports may be configured to output multi-wavelength light comprising at least a portion of wavelengths generated by the laser array 708.

In some implementations, the first PIC 702*a* and/or the second PIC 702*b* may comprise optical devices and subsystems configured to receive and process light (e.g., multi-wavelength light) from a first optical multiplexer and/or a second optical multiplexer respectively.

A dual output laser source of the plurality of dual-output laser sources (e.g., in the laser array 708 may) may comprise a dual-output laser, a dual-output laser coupled to one optical amplifier receiving one of the laser outputs, or a dual-output laser coupled to two optical amplifiers each receiving one of the laser outputs. In various implementations, the dual-output laser source may include one or more optical mode or spot converters. For example, in some implementations, an optical mode converter may receive one of the laser outputs, or light output by one of the optical amplifiers. In some cases, a dual-output laser, the optical amplifiers, and the optical mode converters that receive light from dual-output laser, are monolithically fabricated on a single laser chip. In some cases, the dual-output lasers, the optical amplifiers, and the optical mode converters included in a laser array (e.g., the laser array 708) may be monolithically fabricated on a single substrate. In some designs, the dual-output lasers, the optical amplifiers, and the optical mode converters included in a dual-output source may be electrically and/or thermally isolated using a one or more isolation layers. For example, an isolation layer may electrically and thermally isolate the dual-output laser and the optical amplifier to enable electrically controlling the dual-output laser and the optical amplifier independently. In some such examples, the wavelength of laser light output by the dual-output laser source may be adjusted independent of the corresponding optical output power.

In some examples, a modulator (e.g., an electro-optical modulator) may be integrated with a dual-output laser source, to modulate laser light output by the dual-output laser (or an optical amplifier receiving light from the dual-output laser), and output the resulting modulated light via an output port of the corresponding dual-output laser source.

In some cases, an optical amplifier can comprise a semiconductor optical amplifier (SOA) comprising the same or different semiconductor gain material used in the dual-output laser. In some cases, an optical amplifier can comprise an optical fiber amplifier (e.g., an erbium doped fiber amplifier).

In some cases, a dual-output laser can comprise a dual-output DFB laser (e.g., semiconductor DFB laser). In some such cases, the DFB laser can comprise a quarter wavelength shifted (QWS) DFB laser. In some cases, the QWS DFB laser may comprise an extended grating-free section between two Bragg grating regions, having an optical length larger than 5%, 10%, 20%, 30%, 40%, 50%, 60%, 70%, 80%, or 90% of a total length of the dual-output laser (e.g., between two output ports of the dual-output laser). The structural features and arrangement of such dual-output QWS DFB lasers are described below with reference to FIG. 10A. In some cases, a grating-free section may be a region that does not include any optical gratings. In some cases, a grating-free section of an optical waveguide (e.g., an active optical waveguide) may have an effective refractive index or refractive index that is substantially constant along the grating-free section.

In some cases, a dual-output laser can comprise a dual-output DBR laser (e.g., semiconductor DBR laser). In some such cases, the DBR laser may include a phase tuning section between two optical gain sections configured to change a phase of light circulated inside the DBR laser (e.g., light propagating in an active waveguide of the DBR laser), e.g., based on thermo-optic effect, electro-optic effect, or thermal expansion, for example, by applying an electrical signal to electrodes disposed with respect to the phase tuning section to alter the phase thereof. In some examples, one or more isolation layers (or regions), or one or more isolation sections may be disposed along the DBR laser to thermally and/or electrically isolate the phase tuning section from the optical gain sections, and/or the optical gain sections form the distributed Bragg mirrors. The structural features and arrangement of such dual-output QWS DFB lasers are described below with reference to FIG. 10A.

Figure 8:
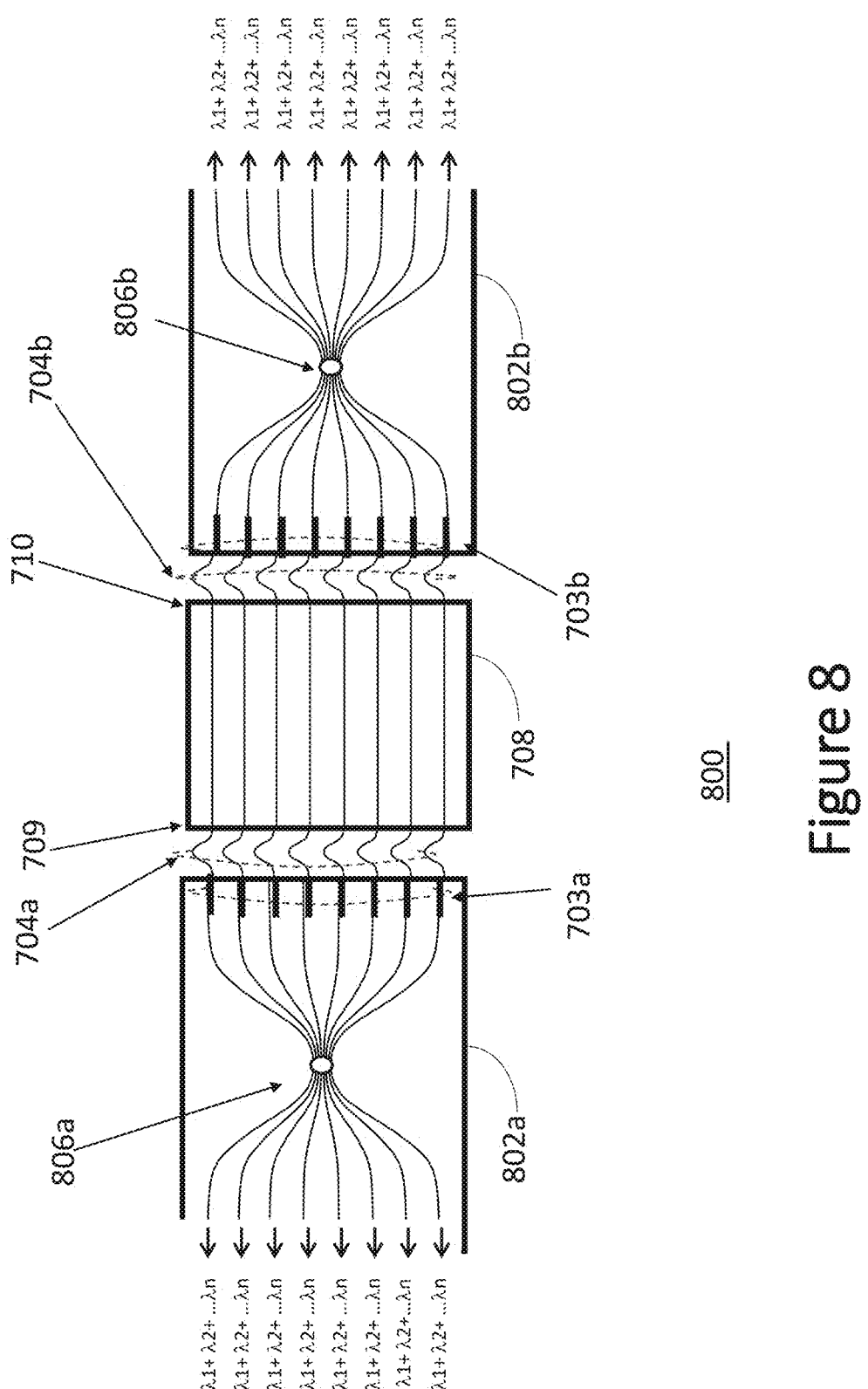
FIG. 8 illustrates an example of the optical device shown in FIG. 7 where each PIC comprises a star coupler.

As described above, in various implementations, the dual-output laser may output light to the first and second multiplexers on either side of the laser (e.g., multiplexers included in two PICs). FIG. 8 shows an embodiment of the optical device 700 where the first multiplexer 806*a* of the first PIC 802*a* and the second multiplexer 806*b* of the second PIC 802*b* are star couplers. Depending on the design, the optical device 800 may comprise one or more features described above with respect to the optical device 200.

The first star coupler 806*a* comprises a plurality of input waveguides receiving light from the first group of input ports of the first PIC 802*a* and a first group of output waveguides. The second star coupler 806*b* comprises a plurality of input waveguides receiving light from the second group of input ports of the second PIC 802*b* and a second group of output waveguides. In some cases, one or more individual ones of the output waveguides (e.g., each output waveguide) may output multi-wavelength light comprising at least a portion of the wavelengths generated by the optical sources in the laser array 708.

Figure 9:
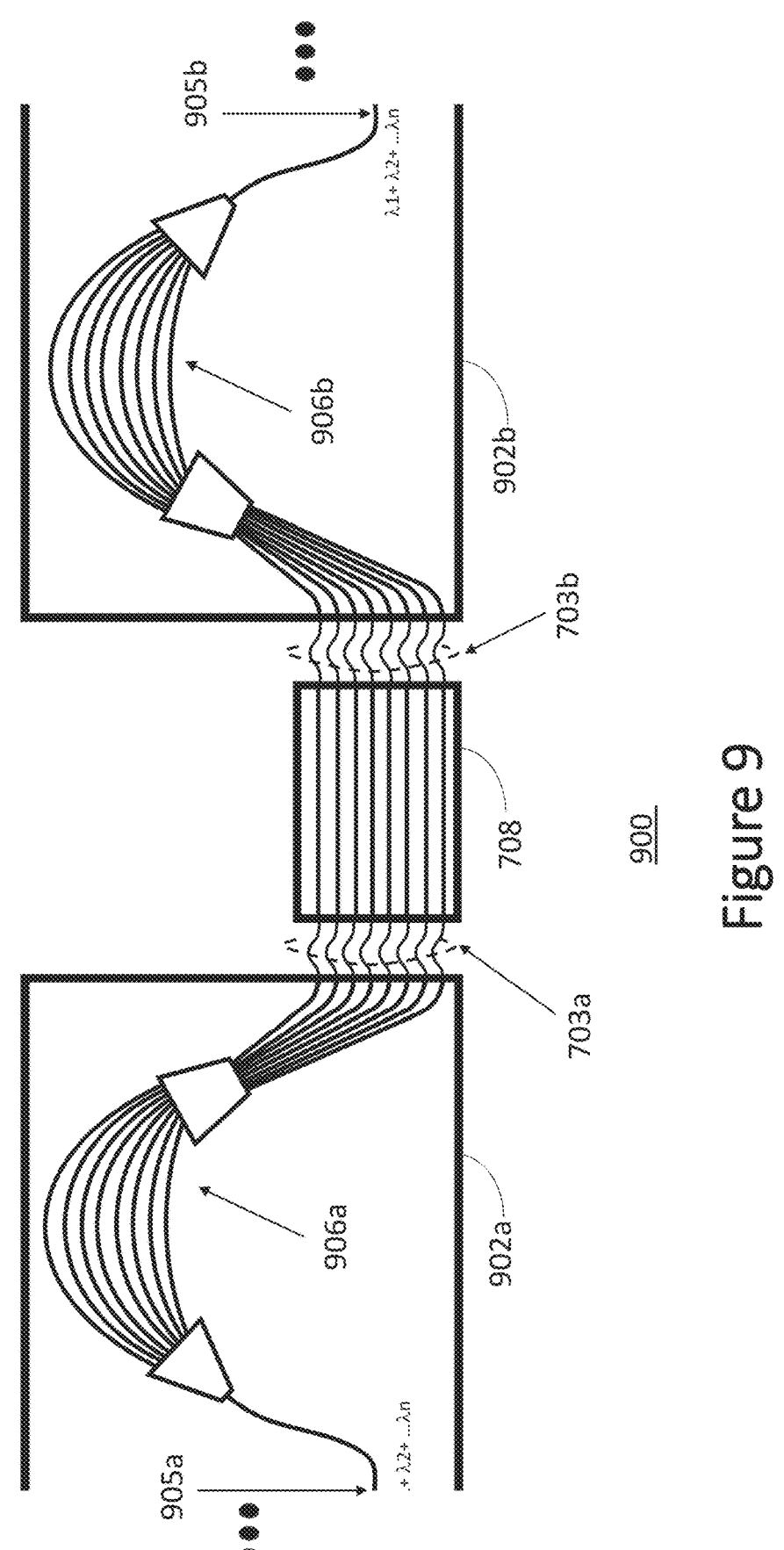
FIG. 9 illustrates an example of the optical device shown in FIG. 7 where each PIC comprises an AWG.

FIG. 9 schematically illustrates another embodiment of the optical device 700 where the first multiplexer 806*a* of the first PIC 802*a*, and the second multiplexer 806*b* of the second PIC 802*b* comprise AWGs. Further, this optical device 900 may comprise one or more features described above with respect to the optical devices, 100, 200, or 300.

The first AWG coupler 906*a* comprises a plurality of input waveguides receiving light from the first group of input ports of the first PIC 902*a* and has an output waveguide 905*a*. The AWG coupler 906*b* comprises a plurality of input waveguides receiving light from the second group of input ports of the second PIC 902*b* and has a second output waveguide 905*b*. In some cases, one or more individual ones of the output waveguides (e.g., each output waveguide) may output multi-wavelength light comprising at least a portion of the wavelengths generated by the optical sources in the laser array 708.

In some implementations, the PIC 902*a* and/or PIC 902*b* each may comprise a plurality of output ports and an optical splitter (e.g., a multimode interferometer) configured to divide the single output received from the AWG 906*a* (or 906*b*) between the plurality of output ports of the PIC 902*a*/902*b*. In these implementations, light output by each output port of the plurality of output ports may comprise at least a portion of the wavelengths emitted by the plurality of the optical sources included in the laser array 708. In some cases, the optical splitter may equally divide the optical power received from the AWG 906*a*/906*b* among the output ports. In some other cases, the optical splitter may provide different portions of the optical power output by the AWG 906*a*/906*b* to different output ports.

Dual-Output Lasers

Figures 10A, 10B:
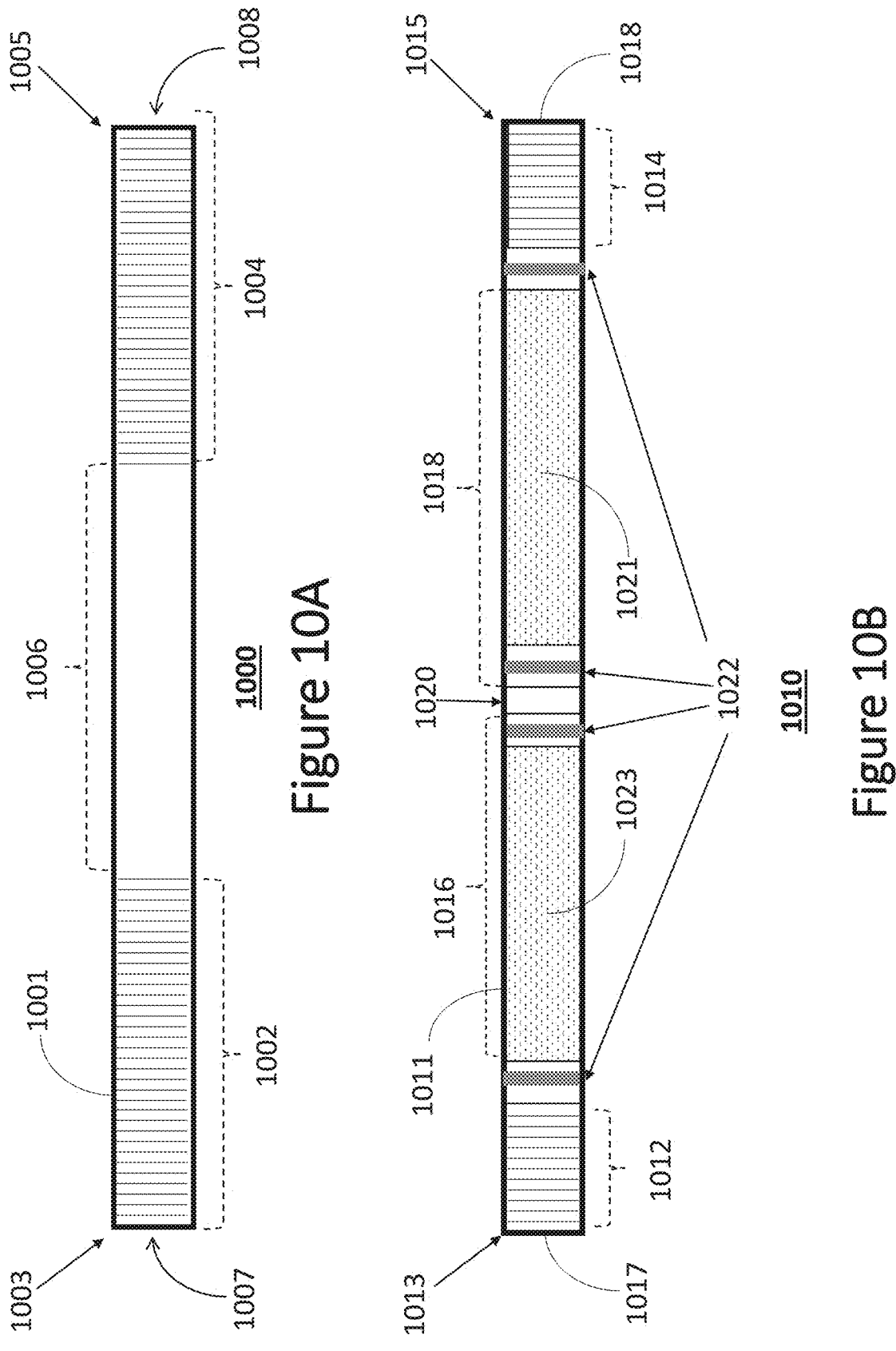
FIG. 10A illustrates a quarter wavelength shifted (QWS) Distributed Feedback (DFB) semiconductor laser comprising an extended grating-free section, and two output ports.
FIG. 10B illustrates a dual output Distributed Bragg Grating (DBR) semiconductor laser, comprising a phase shift section, and multiple isolation sections.

In some cases, a laser in the dual output laser array 708 shown in FIGS. 7-9 may comprise the dual output laser 1000 or 1010 shown in FIGS. 10A and 10B and/or described below. FIG. 10A and FIG. 10B, for example, show two examples of a dual output semiconductor laser configured to generate light of a single wavelength light or single wavelength region and output a portion of the light from each end of the semiconductor laser. In some implementations, the light output from both sides of the dual output laser has the same wavelength or wavelengths.

Figure 7:
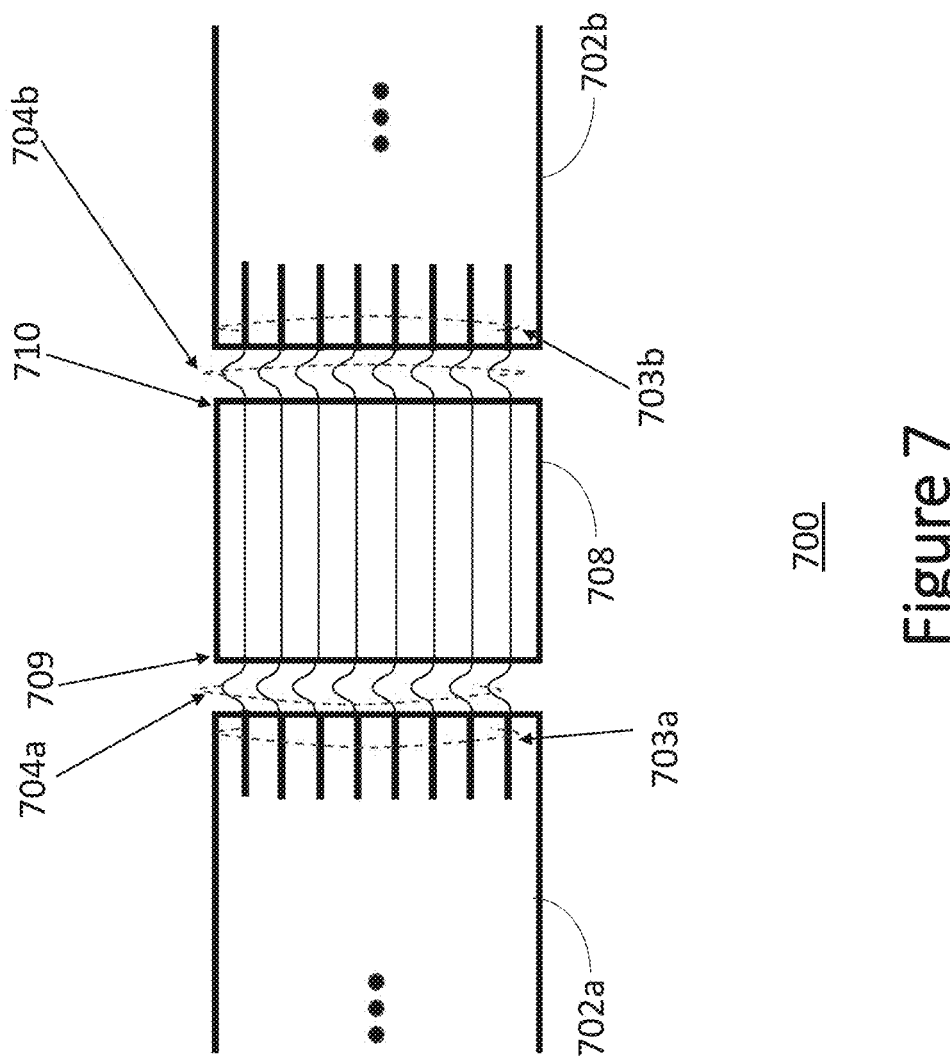
FIG. 7 illustrates an example of an optical device comprising a plurality of dual output optical sources optically connected to two PICs.

In applications, e.g., where a large array of DFB lasers sources are used such as in FIGS. 7-9, the optical sources 101 may comprise an array of quarter-wavelength-shifted (QWS) DFB lasers. An example QWS DFB may include a distributed grating having a grating-free quarter wavelength shift section (e.g., a section that provides a phase shift of $\pi/2$) in the distributed grating in order to break optical mode degeneracy. In some cases, a quarter-wavelength-shifted (QWS) DFB laser may include anti-reflection coatings at one or both ends. The QWS DFB lasers may be fabricated with high yield and may have no performance deficiencies due to or associated with the randomness of the cleaved facet position relative to the grating phase. As such, a laser bar or laser array may include a large number of QWS lasers having similar performance. Since QWS lasers are configured to output laser light from both ends, such lasers can have poor power efficiency when they provide optical power via one end (about 50% of the laser power may be lost through the other end). As such, these lasers are excellent candidates for optical devices and systems that are configured to collect laser light from both ends of a laser array or laser bar comprising QWS DFB lasers. The efficiency (e.g., the slope efficiency) and output power of a QWS laser may be limited by the short length of grating-free phase shift region (e.g., a quarter wavelength long). Accordingly, a modified QWS DFB laser design (e.g., having a grating-free phase shift region longer than a quarter wavelength) described below may provide high output power with higher efficiency. Additionally, the stability of a single longitudinal mode sustained and output by the modified QWS DFB laser design may be improved, e.g., due to reduced sensitivity to parasitic reflections and reduced probability of mode hoping.

In some implementations, a laser (e.g., dual output lasers) of the dual output laser array may comprise at least one Sampled Grating Distributed Bragg Reflector (SG-DBR). For example, a dual output laser may include two SG-DBRs and a section in between to provide a quarter wavelength shift.

The semiconductor laser 1000 shown in FIG. 10A, is a quarter wavelength shifted (QWS) DFB comprising a laser waveguide 1001 (also referred to as active waveguide) extending in a longitudinal direction between a first output port 1007 and a second output port 1008. Laser waveguide 1001 comprises a material (e.g., a semiconductor material) that upon being pumped (e.g., by a current injected via an electrode), provides optical gain at a design wavelength of the laser. A length of the laser 1000 may be the distance between the first output port 1007 and the second output port 1008. The first and second output ports 1007, 1008 can be cleaved facets, or interfaces between the semiconductor laser waveguide 1001 and another optical device (e.g., an optical waveguide, an optical amplifier, and the like). In some cases, the first and/or second output ports 1007, 1008 may be coated with anti-reflection (AR) layers. In some examples, at least a portion of the laser waveguide 1001 may be an active waveguide configured to be pumped provide optical gain upon being pumped (e.g., electrically pumped). The QWS DFB semiconductor laser 1000 may further comprise a first grating section 1002 and a second grating section 1004 separated by a phase shift section 1006. In some cases, the first and second grating sections 1002, 1004 may be formed on the active waveguide 1001. In some implementation, at least a portion of the active waveguide 1001 may be electrically pumped via one or more pumping electrodes. In some examples, the phase shift section 1006 may comprise a grating-free section. The phase shift subsection may be configured such that an optical phase of light entering the phase shift section 1006 is shifted by a desired amount (e.g., $\pi/2$) upon exiting the phase shift section 1006. For example, a length of the phase shift subsection 1006, may be configured such that the optical path length within the subsection 1006 is substantially equal to a desired value for light having a wavelength the design wavelength of the semiconductor laser 1001 (e.g., $\lambda_0/4$, where $\lambda_0$ is the laser wavelength). A phase shift section that provides a phase shift of $\pi/2$ or quarter wavelength, may be referred to as quarter wavelength shift (QWS) phase shift section.

In some cases, the phase shift section 1006 may include a phase tuning subsection (not shown) configured to control (e.g., electrically control or fine tune) the phase of light passing through the phase shift section 1006 (e.g., via thermo-optic, electro-optic effects, or thermal expansion). In some cases, the phase tuning subsection may comprise a different material compared to the remaining of the phase shift section 1006 or the active waveguide 1001. For example, a bandgap of the phase tuning subsection, may be different from (e.g., larger than) that of the remaining of the phase shift section 1006 or the active waveguide 1001. Advantageously, when the bandgap of the phase tuning subsection is different from (e.g., larger than) the bandgap of the active waveguide 1001, the laser light propagating in the active waveguide 1001 will not significantly affect the carrier (e.g., electron or hole) energy and distribution within the phase tuning subsection and therefore does not affect the performance of the phase tuning subsection. Moreover, when the bandgap of the phase tuning subsection is different from (e.g., larger than) the bandgap of the active waveguide 1001, the laser light propagating inside the phase tuning subsection will not be significantly absorbed or amplified by the phase tuning subsection.

One or more electrically isolated control electrodes may be disposed on the phase tuning subsection to apply electric voltage or electric current on the phase tuning subsection. In some cases, an electrically controlled heater may be disposed in the vicinity of the phase tuning subsection. In some implementations, both grating sections 1002, 1004 may comprise an optical grating. In some cases, the first and the second grating sections 1002, 1004 may include Bragg gratings (e.g., Distributed Bragg gratings) comprising periodic variation of an effective refractive index of the laser waveguide 1001. In some cases, the gratings of the first and the second grating sections 1002, 1004 may be identical gratings (e.g., comprise same variation of the refractive index). In some cases, the gratings of the first and the second grating sections 1002, 1004 may have identical grating periods or Bragg wavelengths. In some cases, a grating period or a Bragg wavelength of the grating included in the first grating section 1002 may be different from that of the second grating 1004 section by less than 1%, 5%, or 10% or any range between any of these values or larger or smaller. Each grating section may comprise distributed Bragg grating (DBR). In some cases, the period or the Bragg wavelength ($\Lambda$) of the gratings of the first and the second grating sections may be equal to $\lambda/2$, where $\lambda$ is the wavelength of laser light sustained in the laser waveguide ($\lambda=\lambda_0/n_{eff}$, where $n_{eff}$ is the effective refractive index of the waveguide and $\lambda_0$ is the free-space laser wavelength).

Figures 10C, 10D:
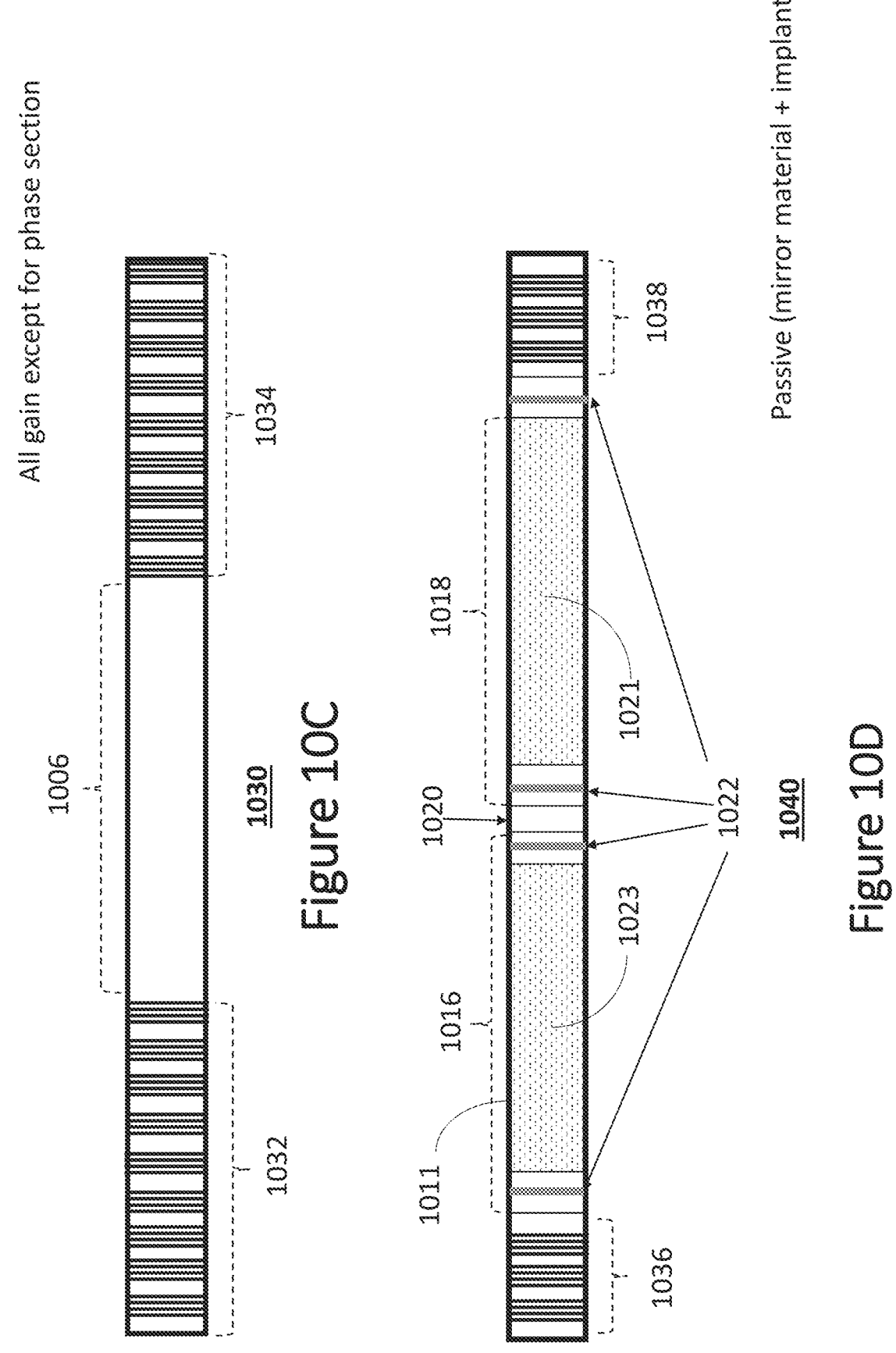
FIG. 10C illustrates a dual output quarter wavelength shifted (QWS) semiconductor laser comprising an extended grating-free section between two sampled grating Bragg reflectors (SG-DBRs).
FIG. 10D illustrates a dual output semiconductor laser, comprising a phase shift section, multiple isolation sections, and two SG-DBRs.

In some implementations, one or both grating sections of the semiconductor laser 1000 may comprise Sampled Grating Bragg Reflectors (SG-DBR). FIG. 10C illustrates a semiconductor laser 1030 that comprises a phase shift section 1006 (e.g., a quarter wavelength shifted (QWS) phase shift section) extending between a first grating section 1032 and a second grating section 1034 where both grating sections comprise SG-DBRs. An SG-DBR can include a plurality of distributed Bragg reflectors which cumulatively produce a comb of reflections. The full width half maximum and reflection strength of the comb can be tailored by various design parameters including grating burst length, number of bursts, spacing between bursts, coupling coefficient etc. The semiconductor laser 1030 may comprise one or more features described above with respect to semiconductor laser 1000.

In various designs, at least a portion of the phase shift section 1006 may comprise an active region capable of providing optical gain. One or more pumping electrodes may be disposed on the phase shift section to provide current or voltage to the active region of the phase tuning section. A region of a phase shift section may include one or more electrically isolated regions having bandgaps different from (e.g., larger than) a bandgap of the remaining of the active portion. A region with a different bandgap may comprise a phase tuning section configured to control the phase of light propagating therethrough. In some cases, at least one control electrode, which is electrically isolated from the pumping electrodes, may be disposed on a region of phase tuning section having a different bandgap, to electro-optically or thermo-optically control the phase of light transmitted through that region. As described above, the performance of the phase tuning section having a different bandgap than (e.g., larger than) the bandgap of the active region (e.g., a region providing optical gain region to laser light), will not be significantly affected the propagation of laser light. A phase tuning section having a different bandgap than (e.g., larger than) the bandgap of the active region (e.g., a region providing optical gain region to laser light), will not absorb laser light generated and/or amplified by the optically active portion of the waveguide that provides optical gain at a wavelength corresponding to the bandgap of the optically active portion.

The first grating section 1002 may be positioned at or proximal or near a first end 1003 of the laser waveguide and the second grating section 1004 may be positioned at or proximal or near a second end 1005 of the laser waveguide. The length of the phase shift section 1006 along the longitudinal direction may be selected such that the corresponding optical path length is a quarter of the wavelength laser light generated and sustained in the laser waveguide, within the waveguide. In some cases, a phase of (e.g., light at) the first grating section 1002 may be shifted with respect to that of (e.g., the phase of light at) the second grating section 1004, by $3\lambda/8$, $\lambda/4$, $\lambda/8$ or any value in between. In some cases, the first grating section 1002 may be positioned closer to the first end 1003 of the laser waveguide and the second grating section 1004 may be positioned closer the second end 1005 of the laser waveguide.

In some implementations, the length of the phase shift section 1006 along the longitudinal direction may be substantially equal to $M \times \lambda/2 + \lambda/4$ or $(\lambda/4) \times (2 \times M+1)$ where $\lambda$ is the wavelength of the laser light within the waveguide, and M is an integer equal or larger than 1. In some implementations, the length of the phase shift section 1006 along the longitudinal direction may be different from $(\lambda/4) \times (2 \times M+1)$ by less than 1%, 5%, 10%, 15%, 20% or other values.

In some implementations, the length of the phase shift section 1006 along the longitudinal direction may be substantially equal to $M \times \Lambda + \Lambda/2$ where $\Lambda$ is Bragg wavelength of the gratings included in the first and the second grating sections, and M is an integer larger equal or larger than 1. In some implementations, the length of the phase shift section 1006 along the longitudinal direction may be different from $M \times \Lambda + \Lambda/2$ by less than 0.01%, 0.05%, 0.1%, 0.5%, 1%, 5%, 10%, 15%, 20% or any range between any of these value or other values.

In some implementations, M can be large enough to make the length of the phase shift section 1006 between 1%-5%, 5%-10%, 10%-30%, 30%-50%, 50%-70%, or 70%-90% of the length of the laser or any range between any of these values or other values. In various embodiments, a phase shift section longer than $\lambda/4$ may increase the slope efficiency, increase the output power, improve the stability of the center wavelength, and/or increase the side mode suppression ratio of the QWS DFB laser.

The laser light generated semiconductor laser 1000 may be coupled out of the laser waveguide through the first output port 1007 and the second output port 1008. In some cases, the semiconductor laser 1000 may be one of the lasers in the dual output laser array 708. In some such cases, the first and the second output ports 1007, 1008 may be the output ports of the laser array 708. In some cases, the first and/or the second output ports 1007, 1008 may be interfaces between the semiconductor laser 1000 and at least one semiconductor optical amplifier (SOA) co-fabricated with the semiconductor laser 1000 on a single chip. In some cases, the semiconductor laser 1000 and the semiconductor optical amplifier(s) may comprise a single waveguide having at least two optically active regions. In some such cases, the semiconductor laser 1000 may be a laser in an amplified dual output laser array. In some cases, a ratio between the optical power output from, the first and/or the second output ports 1007, 1008, may be between 0.5 and 1.

In some cases, the temperature of the first grating section 1002 and the second grating section 1004 may be controlled independently using separate heating elements (e.g., resistive heating elements integrated with the semiconductor laser 1000). In some cases, the center wavelength of the semiconductor laser 1000 may be tuned (e.g., fine tuned) by tuning the temperature of the grating sections 1002/1004.

In some cases, the semiconductor laser 1000 may be fabricated with a higher yield and may output more optical power (via both ends), or may have higher slope efficiency compared to a QWS DFB laser having a shorter grating-free section (e.g., a conventional QWS DFB having a grating-free section that is a quarter wavelength long). Some designs, for instance, have high yield and are a desirable architecture for use in multi wavelength laser arrays.

In some embodiments, the optical sources included in the laser array 708 may comprise the quarter-wavelength shifted DFBs similar to QWS DFB 1000 described above. Advantageously, by using such DFB lasers, a higher level optical output power may be provided to the PIC(s) included in the optical device 700, 800, or 900 described above.

The semiconductor laser 1010 shown in FIG. 10B, is a dual output distributed Bragg Grating (DBR) semiconductor laser, comprising a laser waveguide 1011 extending in a longitudinal direction between a first output port 1017 and a second output port 1018. In some cases, the laser waveguide 1011 may comprise a top cladding layer, a core layer, and a bottom cladding layer. In some such cases, the core layer may comprise a gain region configured to provide optical gain upon being pumped (e.g., upon receiving injection current). In some cases, the bottom cladding layer may comprise a base material on which the subsequent layers are grown. A length of the laser may be the distance between the first output port 1017 and the second output port 1018. The first and second output ports 1017/1018 can be cleaved facets, or interfaces between the laser waveguide and another optical device (e.g., an optical waveguide, an optical amplifier, and the like). At least a portion of the laser waveguide may be an active waveguide configured to provide optical gain upon being pumped (e.g., electrically pumped). The semiconductor laser 1010 may comprise two optical reflectors (e.g., two distributed Bragg gratings (BGs) also referred to as distributed Bragg reflectors (DBRs), or Sampled Grating Distributed Bragg Reflectors also referred to as SG-DBR) that together form a laser cavity that supports a single narrow linewidth optical resonance. The first BG reflector (or SG-DBR) 1012 may be disposed at or proximal to or near a first end 1013 of the laser waveguide and the second BG reflector (or SG-DBR) 1014 may be disposed at or proximal to or near a second end 1015 of the laser waveguide. In some cases, the first BG reflector (or SG-DBR) 1012 may be disposed closer to the first end 1013 of the laser waveguide and the second BG reflector (or SG-DBR) 1014 may be disposed closer to the second end 1015 of the laser waveguide.

In some implementations, one or both grating sections of the semiconductor laser 1010 may comprise Sampled Grating Bragg Reflectors (SG-DBR). FIG. 10D illustrates a semiconductor laser 1040 that comprises a first grating section 1036 and a second grating section 1038 both grating sections comprising SG-DBRs. The semiconductor laser 1040 may comprise one or more features described above with respect to semiconductor laser 1010.

In some cases, the semiconductor laser 1010 may include one or more phase tuning sections. As described above a phase tuning section is configured to control the phase of light generated and sustained on the laser cavity, for example, via thermo-optic effect, electro-optic effect, or thermal expansion. In various implementations, the phase tuning section may comprise at least one conductive electrode for injecting an electric current through the phase tuning section or a resistive element, or applying a voltage across the phase tuning section. In the example shown in FIG. 10B, the phase tuning section 1020 is disposed at or near the middle of the semiconductor laser 1010. In some implementations, the portion of the laser waveguide where the BG reflectors 1012/1014 and/or the phase tuning sections (e.g., the phase tuning section 1020) are disposed may comprise passive material (e.g., a material having a different bandgap compared to an active or gain material such a larger bandgap than active or gain material) and do not provide optical gain during laser operation. In some cases, the semiconductor laser 1010 may comprise two gain sections 1023/1021 between the BG reflectors 1012/1014. For example, a first portion 1016 of the laser waveguide between the first BG reflector 1012 and the phase tuning section 1020, and a second portion 1018 of the laser waveguide between the second BG reflector 1014 and the phase tuning section 1020, may comprise optical active material that provide optical gain upon being pumped. The BG reflectors 1012/1014, the gain sections 1023/1021, and the phase tuning section 1020, or any combination thereof, may be thermally and/or electrically isolated from each other by isolation sections 1022 (e.g., which have low thermal and/or electrical conductance). An isolation section may comprise a passive waveguide section having a length longer than 50% of the thickness of the laser waveguide 1011. In certain implementations, an isolation section may comprise an ion implanted region (the gray shaded region within the isolation section 1022) where an electric impedance of the isolation section is increased by implanting certain ions (e.g., H+ or deuterium). An isolation section 1022 may have a length along the longitudinal direction (e.g., along a direction extending between the reflectors 1012, 1014) and a cross-section area perpendicular to the longitudinal direction. In some cases, the length of the isolation section may be substantially equal to a distance between the section that are being thermally and/or electrically isolated (e.g., the distance between a Bragg reflector a gain section, or between a gain section and the phase tuning section 1020). In some examples, a length of the ion implanted region may be from 1% to 10%, 10% to 30%, 30%-50%, 50% to 70%, or 70% to 100% of the length of the isolation section 1022.

In some cases, a level of thermal or electrical isolation may be tailored by controlling the length and/or cross-sectional area of the isolation sections 1022. The isolation section 1022 may comprise one or more features described above with respect to the isolation section between the laser section 404 and the amplifier section 406 of the laser chip 401. In some cases, for a semiconductor laser having its p-type semiconductor layer on top of the n-type layer, the thermal isolation may be increased by increasing the length of the isolation section relative to a chip thickness (e.g., the laser chip thickness). In some cases, the chip thickness may be the thickness of the laser waveguide 1011. In some cases, the chip thickness may be the thickness between the active region of the semiconductor laser 1010 to the top of the substrate (e.g., the substrate or laser chip carrier on which the laser waveguide 1011 is disposed or mounted), e.g., between 90-150 microns below. In some cases, the chip thickness may be the combined thicknesses of the cladding layer, core layer, and the bottom cladding layer of the active laser waveguide 1011 and any intervening layer between the bottom cladding layer and the substrate or the laser carrier chip on which the laser chip is disposed or mounted. In some examples, the chip thickness may be between 50-100 microns, 100-150 microns, 50-150 microns, 150-300 microns, 300 to 500 microns, or 500 microns to 1 mm or any range between any of these values or possibly larger or smaller. In some implementations, the length of an isolation section (e.g., the length of the passive waveguide that may include an ion implanted region or the length of the implanted region) of the isolation sections 1022 may be N times larger than the chip thickness, and N can be from 0.1 to 1, 0.5 to 1, 1 to 2, 1 to 3, 1 to 4, 1 to 5, 5 to 10, 10 to 15, or 15 to 20, or any range formed by any of these values or larger or smaller, for example, in some implementations to obtain a desired thermal isolation level. Accordingly, in various implementations the isolation section may be at least 0.5 or greater than 0.5 or at least 1.0 or greater than 1.0 times these thicknesses (e.g., the chip thickness referenced above).

In some cases, the laser waveguide 1001 or 1011 may be fabricated or formed on a laser chip. In some cases, a laser chip comprising the semiconductor laser 1000 or the semiconductor laser 1010 may be mounted on a laser carrier chip.

In some embodiments, the active laser cavity formed by the first and second BG reflectors 1012/1014 and the gain section (e.g., gains sections 1016 and 1018) may support generation of laser light having a single center wavelength in a single longitudinal mode of the laser cavity with a side mode suppression ratio (SMSR) larger than 10 dB, 20 dB, 30 dB, or 40 dB, or any range between any of these values or possibly larger or smaller. The single wavelength laser light generated by the semiconductor laser 1010 may be coupled out of the laser waveguide through the first output port 1017 and the second output port 1018. In some cases, the semiconductor laser 1010 may be one of the lasers in the dual output laser array 708. In some such cases, the first and the second output ports 1017, 1018 may be the output ports of the laser array 708. In some cases, the first and/or the second output ports 1017, 1018 may be interfaces between the semiconductor laser 100 and at least one semiconductor optical amplifier co-fabricated with the semiconductor laser 1010 on a single chip. In some cases, the semiconductor laser 1010 and the semiconductor optical amplifier(s) may comprise a single waveguide having optically active regions. In some such cases, the semiconductor laser 1010 may be a laser in an amplified dual output laser array.

In some embodiments, one or more semiconductor optical amplifiers (SOAs) may be integrated with the semiconductor laser 1010 to amplify laser light output from the first and/or the second output ports 1017/1018. In some such embodiments, an isolation layer (or region), or an isolation section, similar to the isolation layers and isolation sections described above, may be disposed between an output port of the semiconductor laser 1010 and an input port of the SOA to provide thermal/electrical isolation between the SOA and the laser.

In some embodiments, the laser light generated and output by the semiconductor laser 1010 may have a narrow bandwidth, or linewidth (e.g., a linewidth from 100 Hz to 1 KHz, 1 KHz to 100 KHz, 100 KHz to 1 MHz, or 1 MHz to 50 MHz and a side mode suppression ratio larger than 20 dB, 30 dB, 40 dB or larger.

In some embodiments, one or more semiconductor optical amplifiers (SOAs) may be integrated with the semiconductor laser 1000 or 1010 to amplify laser light output from the first and/or the second output ports 1007, 1008 or 1013, 1015. An SOA may be configured to fine tune the laser power delivered from the corresponding output port to a photonic device via a photonic wirebond. In some cases, an SOA integrated with the semiconductor laser 1000 or 1010, may be thermally and/or electrically isolated from the semiconductor laser 1000 or 1010 by an isolation layer (similar to the isolation layer 407 described above with respect to FIG. 4A) and a corresponding waveguide section disposed between the semiconductor laser 1000 or 1010.

In some cases, the gratings of the first and the second grating sections 1002, 1004 (or 1012, 1014) may be different gratings. For example, the first grating section 1002 may comprise a Bragg Grating (BG) and the second grating section 1004 may comprise a Sampled Grating Distributed Bragg Reflector (SG-DBR).

In some cases, the dual output lasers 1000, 1010, 1030, 1040 may output a first output power from a first output port (e.g., output port 1005 or 1015) and second output power from a second output port (e.g., output port 1013 or 1003), which may be on opposite sides of the lasers. In some cases, the first and the second output powers may be substantially equal. In some cases, a ratio between the first and the second output powers may be from 0.5 to 1, from 1 to 1.5, or from 1.5 to 2.

Multi-Wavelength Optical Sources Based on External Cavity Lasers

In some implementations, a multi wavelength optical source may comprise a plurality of optically active waveguides optically coupled to a PIC that includes a plurality of narrowband optical reflectors. Individual ones of said plurality of narrow band optical reflectors are configured to reflect light within respective wavelength bands. The wavelength band comprises a narrow wavelength band centered around a center wavelengths. Different reflectors reflect light distributions having different center wavelengths. In some cases, the plurality of active waveguides may be active waveguides monolithically fabricated on a gain bar or a single gain chip. In some other cases, the individual optically active waveguides may be fabricated on respective gain chips and the plurality of gain chips are mounted on a gain carrier chip. The plurality of gain chips mounted on the gain carrier chip may form an array of gain chips.

The optically active waveguide may be extended from a first end to a second end along a longitudinal direction (e.g., parallel to the top and/or bottom major surfaces of the PIC) and may comprise a back optical reflector disposed near the first end. In some cases, the second end may comprise an output port of the active waveguide. In some such cases, the output port of the active waveguide may be a facet (e.g., a cleaved facet). In some examples, the facet may be coated with one or more antireflection (AR) layers to prevent reflection of light having a wavelength within the gain bandwidth of the active waveguide, from the facet. In various embodiments, a portion of the active waveguide may comprise an active optical material that can provide optical gain on being pumped.

In some examples, an optically active waveguide of the plurality of optically active waveguides may include a phase tuning section (e.g., integrated with or disposed on the active waveguide), configured to adjust a phase of light propagating inside the active waveguide (e.g., via thermo-optic effect, electro-optic effect, or thermal expansion).

In various implementations, the output port of an active waveguide of the plurality of active waveguides, may be optically connected to an input port of the PIC having a plurality of narrowband reflectors, using a photonic wire bond. In some cases, the output port of the active waveguide may be misaligned relative to the input port of the PIC. For example, a distance between the center point of the output port of the active waveguide and the centerpoint of the input port of the PIC in a transverse direction perpendicular to the longitudinal direction, may be larger than 10 microns, 50 microns, or 100 microns or any range between any of these values or larger or smaller.

In some cases, the back reflector may be a broadband reflector configured to reflect light having a wavelength within an optical gain bandwidth of the optically active waveguide. In some cases, the broadband reflector can be a coated facet (e.g., coated with a highly reflective dielectric or metallic coating). In various implementations, the back reflector can be a highly reflective (HR) or a partially reflective (PR) reflector.

In some cases, the back reflector may be a narrowband reflector broadband reflector configured to reflect light within a narrow wavelength band centered around a center wavelength.

In some implementations, the narrow band back reflector and the narrow band reflector on the PIC may comprise a Bragg grating, a comb mirror or a sampled grating distributed Bragg reflector (SG-DBR).

In some embodiments, an active waveguide of the plurality of active waveguides may comprise one or more phase tuning sections configured to tune the phase of the light propagating inside the active waveguide, for example, via thermo-optic effect, electro-optic effect, or thermal expansion.

In some cases, a laser cavity may be formed between the back reflector of the active waveguide and a narrowband mirror of the PIC via the photonic wire bond. Such laser cavity may sustain a single wavelength or wavelength band having the center wavelength of the narrowband reflector. Upon pumping, the active waveguide in this laser cavity may generate and sustain laser light having a single wavelength. The single wavelength or wavelength region may be determined by the spectral properties of the back mirror of the active waveguide and the narrowband mirror of the PIC. The laser light generated by the active waveguide may be output via an output port of the PIC.

In some embodiments, a plurality of active laser cavities may be formed between the back reflectors of the plurality of active waveguides and the plurality of the narrowband reflectors of the PIC where individual active laser cavities generate and sustain laser light having a single wavelength or wavelength range different than that of the other active laser cavities.

In some embodiments, the PIC may have one or more output ports configured to output at least a portion of light generated in respective active laser cavities. As such, light output by individual output ports of the PIC may comprise at least a portion of wavelengths generated by the plurality of active laser cavities.

In some embodiments, at least a portion of multi-wavelength light generated by the active laser cavities may be transmitted to one or more optical devices on the PIC (e.g., optical modulators, optical filters, optical switches, and the like) via one or more waveguide sections.

Figure 11:
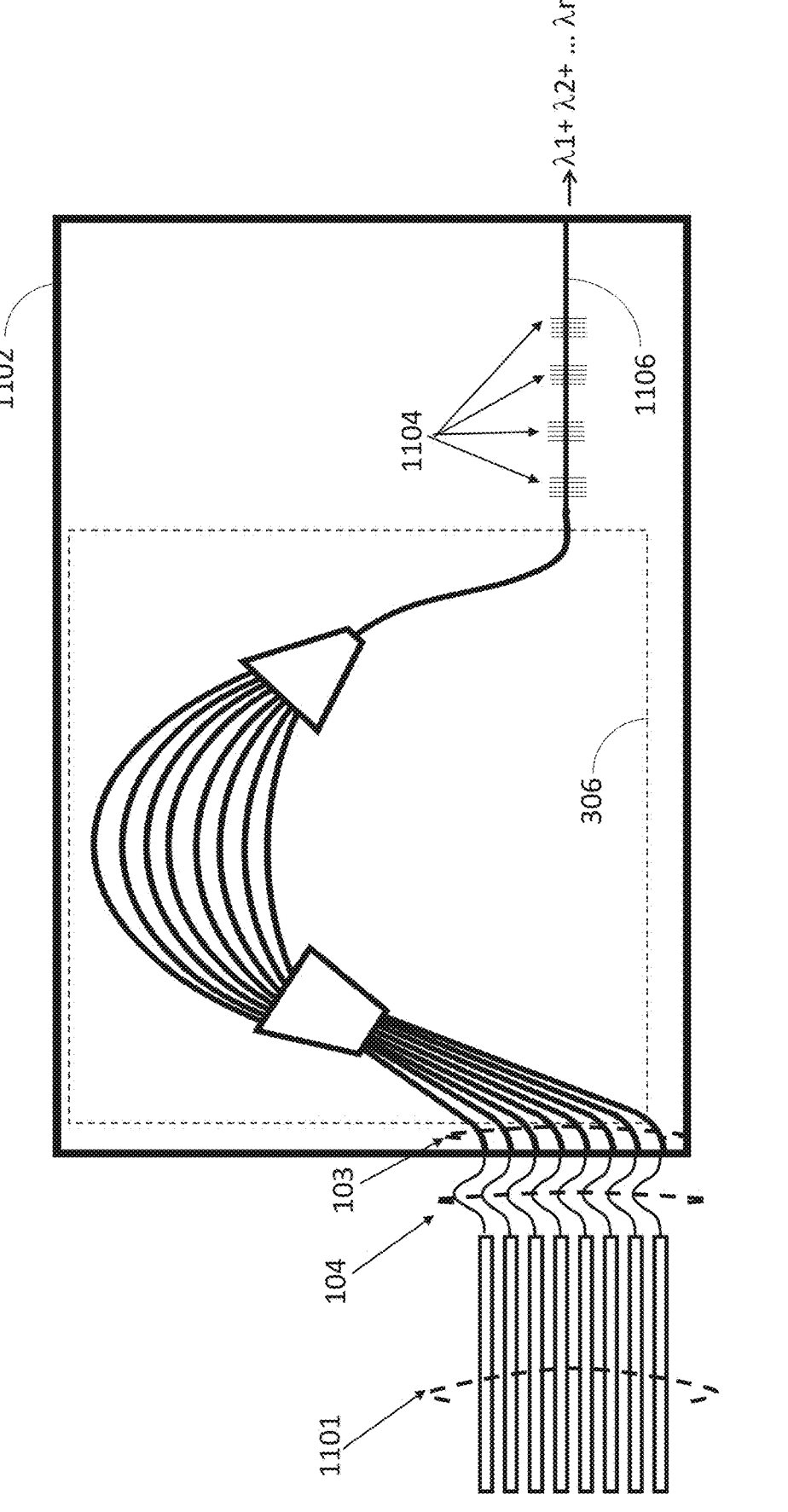
FIG. 11 illustrates an example of a multi wavelength optical source comprising a plurality of optically active waveguides (e.g. lasers) optically coupled to a PIC that comprises an AWG and plurality of narrowband optical reflectors disposed on AWG output.

FIG. 11 illustrates an example of a multi wavelength optical source comprising a plurality of optically active waveguides 1101 (e.g., waveguides comprising optical gain medium) optically coupled to a PIC 1102 that comprises a plurality of narrowband optical reflectors 1104 disposed along an output waveguide 1106 of the PIC 1102. The PIC 1102 further comprises a plurality of input ports 103, and an AWG 306 having plurality of inputs connected to respective input ports 103 and an output port connected to the output waveguide 1106. A plurality output ports of the optically active waveguides 1101 may be connected to the plurality of the input ports 103 by a plurality of photonic wire bonds 104. In some cases, the PIC may use another type of optical multiplexer such as an Echelle grating. In some cases, the plurality of narrowband reflectors 1104 may comprise a plurality of comb reflectors or a plurality of ring resonators (e.g., ring resonators side coupled to the output waveguide 1106). In some embodiments, the narrowband reflectors 1104 may be individually disposed at one or more, possibly all of the inputs of the AWG 306. For example, a narrowband reflector may be disposed in a waveguide that connects an input port 103 of the PIC 1102 to an input of the AWG 306. Moreover, a plurality of narrow band reflectors may be use wherein individual narrowband reflectors may be disposed in respective waveguides that connect respective input ports of the PIC 1102 to respective inputs of AWG 306.

A plurality of active laser cavities formed between the back reflectors of the plurality of active waveguides 1101 and the plurality of the narrowband reflectors 1104 may generate multi wavelength light (e.g., having a comb like spectrum) that is output via the output waveguide 1106.

Figure 12:
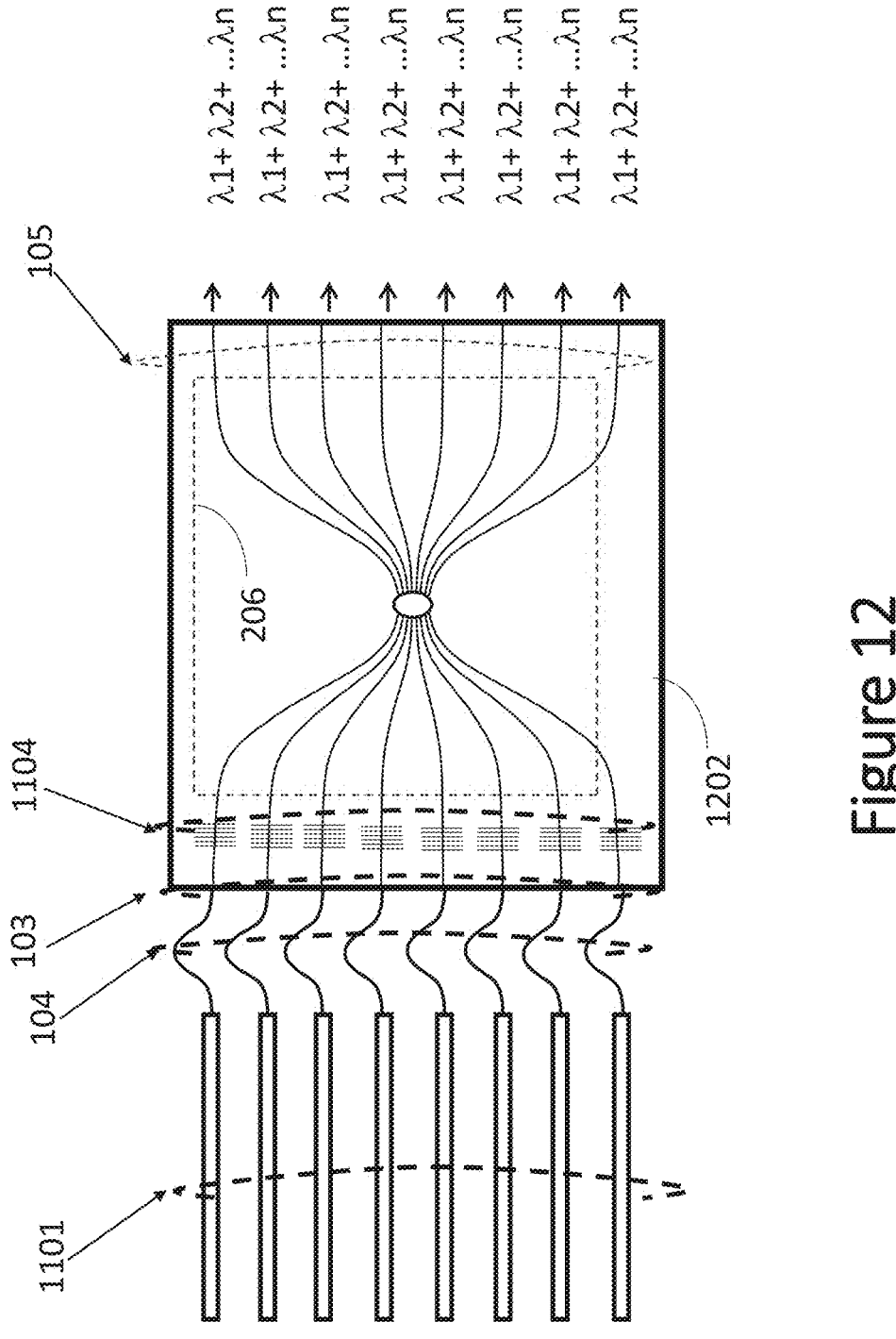
FIG. 12 illustrates an example of a multi wavelength optical source comprising a plurality of optically active waveguides (e.g. lasers) optically connected to a PIC that comprises a plurality of narrowband optical reflector, and a star coupler that receives laser lights form the plurality of narrowband optical reflectors.

FIG. 12 illustrates another example of a multi wavelength optical source comprising a plurality of optically active waveguides 1101 optically coupled to a PIC 1202 that comprises a plurality of narrowband optical reflectors 1104. The PIC 1202 comprises a plurality of input ports 103, a plurality of output ports 105, and a star coupler 206 having a plurality of inputs connected to the input ports 103 and a plurality of outputs connected to the plurality of output ports 105. A plurality output ports of the optically active waveguides 1101 may be connected to the plurality of the input ports 103 by a plurality of photonic wire bonds 104. In some cases, the plurality of narrowband reflectors 1104 may comprise a plurality of comb reflectors 1104 or a plurality of ring resonators (e.g., ring resonators side coupled to a waveguide connecting the input ports 103 to the inputs of the star coupler). As illustrated, individual ones of the plurality output ports of the optically active waveguides 1101 may be connected to respective input ports 103 by respective photonic wire bonds 104.

In some cases, the narrow band reflectors 1104 may comprise the comb reflectors discussed in U.S. Pat. No. 10,355,451, titled "Laser with Sampled Grating Distributed Bragg Reflector", filed on Apr. 25, 2018 and issued on Jul. 16, 2019, U.S. Patent Application No. 62/901,089 filed on Sep. 16, 2019 titled "Tunable Laser with Active Material on at Least One End for Monitoring Performance", and U.S. patent application Ser. No. 17/021,993 filed on Sep. 15, 2020, titled "Tunable Laser with Active Material on at Least One End for Monitoring Performance", which are each hereby incorporated herein in their entirety by reference, for example, to provide various wavelength tunable laser designs.

An active laser cavity formed between the respective back reflector of an active waveguide of the plurality of active waveguides 1101 and the corresponding narrowband reflector of the plurality of the narrowband reflectors 1104, may generate single wavelength laser light or laser light having a single wavelength region that is coupled to a corresponding input of the star coupler 206 via the respective narrowband reflector. The star coupler 206 may combine the optical outputs of the plurality of the narrowband reflectors 1104.

In some examples, the PIC 1202 may not include the star coupler 206. In some such examples, the PIC 1202 may comprise a plurality of output ports configured to receive light output from the narrowband optical reflectors 1104 such that different output ports provide laser light having wavelengths different from the wavelength of laser outputs provided by the other output ports. In some other cases, laser light output from the narrowband optical reflectors 1104 may be provided to one or more optical devices or subsystems monolithically fabricated on the PIC 1202.

In some implementations, an output port of a PIC (e.g., the PIC, 102, 302, 602, 702a/b, 802a/b, 902a/b, 1102, or 1202), may be connected to an optical fiber via an air-cladded or polymer-cladded polymer waveguide. In some cases, the air-cladded or polymer cladded polymer waveguides may be a photonic wire (e.g., directly fabricated using a focused laser beam). In some cases, a first end of the photonic wire may be connected to the output port (e.g., a waveguide facet, end region of a waveguide) of the PIC, and the second end of the photonic wire may be connected to a core region in a facet (e.g., a cleaved facet) of the optical fiber.

In some implementations, an output port of a PIC (e.g., the PIC, 102, 302, 602, 702a/b, 802a/b, 902a/b, 1102, or 1202), may be optically coupled to an optical fiber. In some examples, the optical fiber may be butt coupled to the optical port. In some other examples, the optical fiber may be optically coupled to the output port via one or more optical elements (e.g., lenses, collimators, prisms, polarizers, and the like).

In some implementations, an output port of a first PIC (e.g., the PIC, 102, 302, 602, 702*a*/b, 802*a*/b, 902*a*/b, 1102, or 1202), may be connected to the input port of a second PIC or another optical device via an air-cladded or polymer-cladded polymer waveguide. In some cases, the air-cladded or polymer cladded polymer waveguides may be a photonic wire (e.g., directly fabricated using a focused laser beam). In some cases, a first end of the photonic wire may be connected to the output port (e.g., a waveguide facet or waveguide end) of the first PIC, and the second end of the photonic wire may be connected to an input port (e.g., a waveguide facet, or a waveguide end) of the second PIC or the optical device.

In some cases, the photonic integrated circuits (PICs) of the optical devices and systems described above, may comprise a planar light wave circuit (PLC). In some cases, a PLC may comprise one or more photonic chips and/or optical devices, that are integrated using hybrid integration methods.

In some implementations, multi-wavelength light or multi-wavelength laser light generated or output by any of the optical devices and systems described above may comprise light having wavelengths within a plurality of narrowband wavelength intervals (or frequency intervals) and a plurality of center wavelengths (or center frequencies), where individual narrowband wavelength intervals are centered around individual center wavelengths. In some cases, where a wavelength spacing (or frequency spacing) between subsequent center wavelengths (or center frequencies) is substantially constant, e.g., between the lowest and highest center wavelengths included in the multi-wavelength light, the multi-wavelength light or multi-wavelength laser light may comprise a frequency comb or wavelength comb. In some cases, a frequency spacing of a frequency comb may be 12.5 GHz, 25 GHz, 33 GHz, 50 GHz, 100 GHz, 200 GHz, 400 GHz, 500 GHz, 800 GHz, or 1000 GHz in any range formed by any of these values or possibly outside these ranges.

In various implementations described above, one or more output ports of an optical source (e.g., a single-output or a dual-output optical source) of the plurality of optical sources (e.g., in a laser array), may not be optically connected (e.g., photonic wire bonded) to the input ports of a PIC. For example, an optical source identified as a defective optical source based on a test performed prior to the wire bonding process, may not be wire bonded to an input port of the PIC.

In various implementations described above, at least a portion of a polymer waveguide (e.g., air-cladded or polymer cladded) or a photonic wire bond, along its length may be a single mode waveguide supporting a single transverse mode (e.g., the fundamental transverse mode). In some cases, a portion of a polymer waveguide or photonic wire bond may support multiple transverse modes, however, the higher order transverse modes may experience significantly more loss than the fundamental mode.

In some cases, a single-output or dual-output laser (e.g., a semiconductor DBR or DFB laser) that is integrated with an optical amplifier (e.g., a semiconductor optical amplifier) may be separated from the semiconductor optical amplifier by a distance (e.g., in a longitudinal direction along the laser waveguide) larger than half of the thickness of an optically active layer (e.g., a layer comprising III-V semiconductor material) in which the laser and/or the amplifier are fabricated or disposed. In some such cases, the thermal cross-talk between the optical amplifier and the laser may be reduced due to the separation.

In various implementations described above, a laser chip may include one more laser sources or dual-output laser sources. A plurality of laser chips may be mounted on a laser carrier chip to fabricate a laser array or a dual-output laser array.

In various implementations described above, a gain chip may include one more optically active waveguides or optical amplifiers. A plurality of laser chips may be mounted on a carrier chip (e.g., a gain carrier chip) to fabricate an optical gain array or gain bar.

In various implementations described above, phase tuning section or a phase shift section may comprise at least one conductive electrode for injecting an electric current through the phase tuning section or a resistive element, or applying a voltage across the phase tuning section.

In some implementations, an optical source of the plurality of the optical sources 101 or the optical sources formed by the plurality of the active waveguides 1101, may comprise an optical power monitoring section configured to provide a signal indicative of an optical power output by the optical source. The active power monitoring section may be disposed at an end of the optical source or the active waveguide opposite to an output port through which laser light or amplified light exits the device. In some cases, the optical power monitoring section can be integrated with the optical source or optically active waveguide (e.g., monolithically fabricated on the same chip). In some cases, the optical power monitoring section may comprise a separate device that is optically connected to an end of the optical source or optically active waveguide (e.g., an opposite to a corresponding output port), via a photonic wire bond. In some cases, the optical power monitoring section may comprise a monitor photodiode. For example, the laser shown on FIG. 4A may include an optical power monitoring section (in addition to the laser section 404 and the optical amplifier section 406) disposed on laser chip 402.

Example Embodiments

Example embodiments described herein have several features, no single one of which is indispensable or solely responsible for their desirable attributes. A variety of example systems and methods are provided below.

Group 1

Example 1. An optical device comprising:

a laser array comprising a plurality of laser sources and having a plurality of output ports configured to output laser light generated by the plurality of laser sources;

a photonic integrated circuit (PIC) comprising a plurality of input ports and an optical multiplexer configured to combine laser lights received from the plurality of input ports; and a plurality of polymer waveguides connected to the plurality of input ports and the plurality of output ports, the plurality of the polymer waveguides configured to guide laser light output from the plurality of output ports to the plurality of input ports;

wherein the laser array and the PIC are fabricated on at least two separate substrates; and wherein the diameter of at least one of the polymer waveguides of the plurality of polymer waveguides is less than 20 microns, or wherein a longitudinal distance between one of said output ports and one of said optical input ports optically connected thereto via the plurality of polymer waveguides is less than 500 microns, or wherein a spacing between adjacent output ports of the plurality of output ports or a spacing between adjacent input ports of the plurality of input ports is less than 20 microns.

Example 2. The optical device of Example 1, wherein a polymer waveguide of the plurality of polymer waveguides comprises a first end connected to an output port of the plurality of output ports, and a second end connected to an input port of the plurality of input ports.

Example 3. The optical device of Example 2, wherein a longitudinal distance between a centerpoint of the output port and a centerpoint of the input port is between 10 and 200 microns.

Example 4. The optical device of Example 2, wherein a lateral distance between a centerpoint of the output port and a centerpoint of the input port is larger than 50 microns.

Example 5. The optical device of Example 2, wherein the polymer waveguide is an air-cladded polymer waveguide.

Example 6. The optical device of Example 2, wherein the polymer waveguide is embedded in a polymer layer having an optical refractive index less than that of the polymer waveguide.

Example 7. The optical device of any of Examples 2 and 6, wherein the polymer waveguide is a photonic wire bond.

Example 8. The optical device of Example 1, wherein the plurality of laser sources comprise a plurality of separate laser chips and the laser array comprises the plurality of separate laser chips mounted on a laser carrier chip.

Example 9. The optical device of any of Examples 1 and 8, wherein the laser array is mounted on a surface of the PIC or a substrate on which the PIC is fabricated.

Example 10. The optical device of any of Examples 2 and 8, wherein the laser array and the PIC are mounted on a single optical bench.

Example 11. The optical device any of Examples 2 and 8, wherein the laser array is mounted on a laser carrier chip and the PIC is mounted on a PIC carrier chip.

Example 12. The optical device of Example 11, wherein the laser and PIC carrier chips are mounted on a single optical bench.

Example 13. The optical device of any of Examples 10 and 12, wherein a distance between a centerpoint of the optical output port and a top surface of the optical bench is different from a distance between the centerpoint of the input port and the top surface of the optical bench.

Example 14. The optical device of any of Examples 9-11, wherein laser light output by at least one laser source of the plurality of laser sources is not optically coupled to any input port.

Example 15. The optical device of Examples 14, wherein the individual laser sources are tested before the laser array is mounted, and the laser source is identified based on an outcome of the test.

Example 16. The optical device of Example 1, wherein laser light generated by a laser source of the plurality of laser sources comprises a narrowband light output centered around a single center wavelength.

Example 17. The optical device of Example 16, wherein the single center wavelength is a wavelength in C-band.

Example 18. The optical device of Example 16, wherein the single center wavelength is a wavelength in O-band.

Example 19. The optical device of Example 1, wherein the number of the plurality of laser sources is larger than 4, 8, 16, or 32.

Example 20. The optical device of Example 1, wherein the plurality of laser sources comprises a laser bar or a laser array.

Example 21. The optical device of Example 1, wherein the plurality of laser sources comprise semiconductor lasers configured to generate laser light and output the laser light from the plurality of output ports.

Example 22. The optical device of Example 1, wherein a laser source of the plurality of laser sources comprises a semiconductor laser and a semiconductor optical amplifier (SOA) configured to amplify laser light received from the semiconductor laser and output the amplified laser light via an output port of the plurality of output ports.

Example 23. The optical device of Example 1, wherein a laser source of the plurality of laser sources comprises a semiconductor laser and a spot-size converter configured to convert a spot-size of laser light output by the laser and output a laser light having a converted spot-size via an output port of the plurality of output ports.

Example 24. The optical device of Example 1, wherein a laser source of the plurality of laser sources comprises a semiconductor laser, a semiconductor optical amplifier (SOA), and a spot-size converter, wherein:

the semiconductor optical amplifier (SOA) is configured to amplify laser light received from the semiconductor laser; and the spot-size converter configured to convert a spot-size size of the amplified laser light output by the SOA and output an amplified laser light having a converted spot-size via an output port of the plurality of output ports.

Example 25. The optical device of Example 22 wherein the semiconductor laser and the SOA are monolithically fabricated on a laser chip and wherein the semiconductor laser and the SOA are electrically and/or thermally isolated by an isolation region.

Example 26. The optical device of any of Examples above, wherein the semiconductor laser is a distributed feedback (DFB) laser or distributed Bragg reflector (DBR) laser.

Example 27. The optical device of Example 26, wherein the semiconductor laser is a quarter wavelength shifted DFB semiconductor laser comprising a grating-free section in an active waveguide having a length larger than 5% of the total length of the semiconductor laser.

Example 28. The optical device of any of Examples 1 and 22-27, wherein the laser source comprises an optical modulator configured to modulate the laser light output by the laser source.

Example 29. The optical device of Example 1, wherein different laser sources of the plurality of laser sources are configured to generate laser light having wavelengths different from the wavelengths of laser light generated by the other laser sources, and the PIC further comprises a plurality of PIC output ports, configured to output multi-wavelength light comprising light having a plurality of wavelengths, wherein different wavelengths are associated with different laser sources of the plurality of laser sources.

Example 30. The optical device of Example 29, wherein the optical multiplexer comprises a star coupler configured to receive laser light from the plurality of input ports, and transmit or couple the multi-wavelength light to the plurality of PIC output ports.

Example 31. The optical device of Example 1, wherein laser sources of the plurality of laser sources is configured to generate laser light having a wavelength different from wavelengths of laser light generated by the other laser sources, and the PIC further comprises at least one output port, configured to output multi-wavelength light comprising light having a plurality of wavelengths, different wavelength are associated with respective laser sources of the plurality of laser sources.

Example 32. The optical device of Example 31, wherein the optical multiplexer comprises an arrayed waveguide grating (AWG) configured to receive light from the plurality of input ports, and output the light having multiple wavelengths.

Example 33. The optical device of Example 1, wherein the PIC comprises a waveguide layer comprising silicon nitride, silicon, doped glass, or polymer.

Example 34. The optical device of Example 1, wherein a substrate of the least two separate substrates comprises a material not used in the other substrates.

Example 35. An optical device comprising:

a laser array comprising a plurality of laser sources and having a plurality of output ports configured to output laser light generated by the plurality of laser sources;

a photonic integrated circuit (PIC) comprising a plurality of input ports and an optical multiplexer configured to combine laser light received from the plurality of input ports; and a plurality of photonic wire bonds connected to the plurality of input ports and the plurality of output ports, the plurality of waveguides configured to guide laser light output from the plurality of output ports to the plurality of input ports;

wherein the laser array and the PIC are fabricated on at least two separate substrates.

Example 36. The optical device of Example 35, wherein a photonic wire bond of the plurality of photonic wire bonds comprises a first end connected to an output port of the plurality of output ports, and a second end connected to an input port of the plurality of input ports.

Example 37. The optical device of Example 36, wherein a longitudinal distance between a centerpoint of the output port and a centerpoint of the input port is between 10 and 200 microns.

Example 38. The optical device of Example 36, wherein a lateral distance between a centerpoint of the output port and a centerpoint of the input port is larger than 50 microns.

Example 39. The optical device of any of Examples 35-38, wherein at least one of the photonic wire bonds is an air-cladded waveguide.

Example 40. The optical device of Example 36, wherein at least one of the photonic wire bonds comprises a waveguide embedded in a polymer layer having an optical refractive index less than that of the waveguide.

Example 41. The optical device of any of Examples 35 to 40, wherein the photonic wire bond is a polymer waveguide.

Example 42. The optical device of any of the Examples above, wherein the plurality of laser sources comprise a plurality of separate laser chips and the laser array comprises the plurality of separate laser chips mounted on a laser carrier chip.

Example 43. The optical device of any of the Examples above, wherein the laser array is mounted on a surface of the PIC or a substrate on which the PIC is fabricated.

Example 44. The optical device of any of the Examples above, wherein the laser array and the PIC are mounted on a single optical bench.

Example 45. The optical device any of the Examples above, wherein the laser array is mounted on a laser carrier chip and the PIC is mounted on a PIC carrier chip.

Example 46. The optical device of any of the Examples above, wherein the laser and PIC carrier chips are mounted on a single optical bench.

Example 47. The optical device of any of Examples 44 or 46, wherein a distance between a centerpoint of the optical output port and a top surface of the optical bench is different from a distance between the centerpoint of the input port and the top surface of the optical bench.

Example 48. The optical device of any of the Examples above, wherein laser light output by at least one laser source of the plurality of laser sources is not optically coupled to any input port.

Example 49. The optical device of any of the Examples 14, wherein individual laser sources are tested before the laser array is mounted, and the laser source that is not optically coupled is identified based on an outcome of the test.

Example 50. The optical device of any of the Examples above, wherein laser light generated by a laser source of the plurality of laser sources comprises a narrowband light output centered around a single center wavelength.

Example 51. The optical device of Example 50, wherein the single center wavelength is a wavelength in C-band.

Example 52. The optical device of Example 50, wherein the single center wavelength is a wavelength in O-band.

Example 53. The optical device of any of the Examples above, wherein the number of the plurality of laser sources is larger than 4, 8, 16, or 32.

Example 54. The optical device of any of the Examples above, wherein the plurality of laser sources comprises a laser bar or a laser array.

Example 55. The optical device of any of the Examples above, wherein the plurality of laser sources comprise semiconductor lasers configured to generate laser light and output the laser light from the plurality of output ports.

Example 56. The optical device of any of the Examples above, wherein a laser source of the plurality of laser sources comprises a semiconductor laser and a semiconductor optical amplifier (SOA) configured to amplify laser light received from the semiconductor laser and output the amplified laser light via an output port of the plurality of output ports.

Example 57. The optical device of Example 1, wherein a laser source of the plurality of laser sources comprises a semiconductor laser and a spot-size converter configured to convert a spot-size of laser light output by the laser and output a laser light having a converted spot-size via an output port of the plurality of output ports.

Example 58. The optical device of any of the Examples above, wherein a laser source of the plurality of laser sources comprises a semiconductor laser, a semiconductor optical amplifier (SOA), the semiconductor optical amplifier (SOA) disposed to receive and amplify laser light from the semiconductor laser.

Example 59. The optical device of Example 58, further comprising a spot-size converter configured to convert a spot-size size of the amplified laser light output by the SOA and output an amplified laser light having a converted spot-size via an output port of the plurality of output ports.

Example 60. The optical device of Example 58 or 59, wherein the semiconductor laser and the SOA are monolithically fabricated on a laser chip.

Example 61. The optical device of Example 60, wherein the semiconductor laser and the SOA are electrically and/or thermally isolated by an isolation region.

Example 62. The optical device of any of Examples above, wherein the laser is a distributed Bragg reflector (DBR) laser.

Example 63. The optical device of any of Examples above, wherein the laser is a distributed feedback (DFB) laser.

Example 64. The optical device of any of the Examples above, wherein the laser is a quarter wavelength shifted DFB semiconductor laser.

Example 65. The optical device of Examples above 64, wherein the quarter wavelength shifted DFB semiconductor laser comprising a grating-free section in an active wave-guide having a length larger than 5% of the total length of the semiconductor laser.

Example 66. The optical device of any of the Examples above, wherein the laser source comprises an optical modulator configured to modulate the laser light output by the laser source.

Example 67. The optical device of Example 1, wherein different laser sources of the plurality of laser sources are configured to generate laser light having wavelengths different from the wavelengths of laser light generated by the other laser sources.

Example 68. The optical device of Example 67, wherein the PIC further comprises a plurality of PIC output ports configured to output multi-wavelength light comprising light having a plurality of wavelengths, wherein different wavelengths are associated with different laser sources of the plurality of laser sources.

Example 69. The optical device of the Examples above, wherein the optical multiplexer comprises a star coupler configured to receive laser light from the plurality of input ports, and transmit or couple multi-wavelength light to the plurality of PIC output ports.

Example 70. The optical device of the Examples above, wherein laser sources of the plurality of laser sources are configured to generate laser light having a wavelength different from wavelengths of laser light generated by the other laser sources.

Example 71. The optical device of the Examples above, wherein the PIC further comprises at least one output port, configured to output multi-wavelength light comprising light having a plurality of wavelengths, different wavelength are associated with respective laser sources of the plurality of laser sources.

Example 72. The optical device of any of the Examples above, wherein the optical multiplexer comprises an arrayed waveguide grating (AWG) configured to receive light from the plurality of input ports, and output the light having multiple wavelengths.

Example 71. The optical device of any of the Examples above, wherein the PIC comprises a waveguide layer comprising silicon nitride, silicon, doped glass, or polymer.

Example 72. The optical device of any of the Examples above, wherein a substrate of the least two separate substrates comprises a material not used in the other substrates.

Example 73. The optical device of any of the Examples above, wherein a photonic wire bond comprises a waveguide has a length and a cross-section orthogonal to its length that is round, circular, elliptically-shaped, or oval-shaped.

Example 74. The optical device of any of the Examples above, wherein a photonic wire bond has at least one bend along at least a portion of the length of the photonic wire bond from the output port of the laser source to the input port of the PIC.

Example 75. The optical device of any of the Examples above, wherein the photonic wire bond follows is arcuate at least along portion of the path from the from the output port of the laser source to the input port of the PIC.

Example 76. The optical device of any of the Examples above, wherein a photonic wire bond has first and second ends and a middle, wherein said photonic wire bond is tapered a at least one of said first and second ends.

Example 77. The optical device of any of the Examples above, wherein a photonic wire bond comprises a waveguide having has first and second ends connected to one of the output ports of the laser array and one of the input ports of the PIC and a middle between said first and second ends.

Example 78. The optical device of any of the Examples above, wherein at least one of said first and second ends is thinner than said middle.

Example 79. The optical device of any of the Examples above, wherein at least one of said first and second ends is thicker than said middle.

Example 80. The optical device of any of the Examples above, wherein said first end has a length of at least 1 micron from at least one of said input ports of the PIC to at least 10 microns from said input port of the PIC.

Example 81. The optical device of any of the Examples above, wherein said photonic wire bond has a diameter of 20 microns or less.

Example 82. The optical device of any of the Examples above, wherein said photonic wire bond has a diameter of 15 microns or less.

Example 83. The optical device of any of the Examples above, wherein said photonic wire bond has a diameter of 10 microns or less.

Example 84. The optical device of any of the Examples above, wherein said photonic wire bond has a diameter of 8 microns or less.

Example 85. The optical device of any of the Examples above, wherein said photonic wire bond has a diameter of 5 microns or less.

Example 86. The optical device of any of the Examples above, wherein a longitudinal distance between one of said output ports and one of said optical input ports optically connected thereto via the photonic wire bond is 500 microns or less.

Example 87. The optical device of any of the Examples above, wherein a longitudinal distance between one of said output ports and one of said optical input ports optically connected thereto via the photonic wire bond is 300 microns or less.

Example 88. The optical device of any of the Examples above, wherein a longitudinal distance between one of said output ports and one of said optical input ports optically connected thereto via the photonic wire bond is 100 microns or less.

Example 89. The optical device of any of the Examples above, wherein a spacing between adjacent output ports of the plurality of output ports or a spacing between adjacent input ports of the plurality of input ports is less than 20 microns.

Example 90. The optical device of any of the Examples above, wherein a spacing between adjacent output ports of the plurality of output ports or a spacing between adjacent input ports of the plurality of input ports is 15 microns or less.

Example 91. The optical device of any of the Examples above, wherein a spacing between adjacent output ports of the plurality of output ports or a spacing between adjacent input ports of the plurality of input ports is 10 microns or less.

Example 92. The optical device of any of the Examples above wherein the diameter of at least one of the polymer waveguides of the plurality of polymer waveguides is less than 8 microns.

Example 93. The optical device of any of Examples 25 or 61, wherein the semiconductor laser and the SOA are monolithically fabricated on a laser chip and wherein the semiconductor laser and the SOA are electrically and/or thermally isolated by an isolation section comprising the isolation region.

Example 94. The optical device of any of Examples 93, wherein the isolation section comprises a material having a bandgap different from that of active sections of the semiconductor laser and the SOA.

Example 95. The optical device of Example 93, wherein a length the isolation section extending from the semiconductor laser to the SOA, is larger than 50% of the thickness of the laser waveguide.

Example 96. The optical device of Example 93, wherein a length the isolation section extending from the semiconductor laser to the SOA, is larger than 50% of the thickness between the active region of the laser to the bottom of a substrate on which the laser array is fabricated.

Example 97. The optical device of Example 93, wherein the semiconductor laser comprises a laser waveguide or laser chip, and wherein a length the isolation section extending from the semiconductor laser to the SOA, is larger than 50% of the thickness of the laser waveguide, or the laser chip.

Example 98. The optical device of Example 97, wherein a length the isolation section extending from the semiconductor laser to the SOA, is larger than 50% of the combined thickness of the laser waveguide, and any intervening layer between the laser waveguide and a carrier chip on which the laser chip is mounted.

Example 99. The optical device of Example 93, wherein a length the isolation section extending from the semiconductor laser to the SOA, is at least as large as the thickness of the laser waveguide.

Example 100. The optical device of Example 93, wherein a length the isolation section extending from the semiconductor laser to the SOA, is at least as large as the thickness between the active region of the laser to the bottom of a laser chip comprising the semiconductor laser.

Example 101. The optical device of Example 93, wherein a length the isolation section extending from the semiconductor laser to the SOA, is at least as large as a thickness of a laser chip comprising the semiconductor laser.

Example 102. The optical device of Example 93, wherein a length the isolation section extending from the semiconductor laser to the SOA, is at least as large as a combined thickness of a top cladding layer, a core layer, and a bottom cladding layer.

Group 2

Example 1. An optical device comprising:

a laser array comprising a plurality of dual-output laser sources, said laser array having a first group and a second group of output ports wherein laser light generated by an individual dual-output laser source of the plurality of dual-output laser sources is output by an output port of the first group of output ports and an output port of the second group of output ports;

a first photonic integrated circuit (PIC) comprising a first group of input ports;

a second photonic integrated circuit (PIC) comprising a second group of input ports;

a first group of polymer waveguides connected to the first group of output and input ports, said first group of polymer waveguides configured to transmit laser light output from the first group of output ports to the first group of input ports;

a second group of polymer waveguides connected to the second group of output and input ports, said second group of polymer waveguides configured to transmit laser light output from the second group of output ports to the second group of input ports; and wherein the laser array, the first PIC and the second PIC are fabricated on at least three separate substrates.

Example 2. The optical device of Example 1, wherein a polymer waveguide of the first group of polymer waveguides comprises a first end connected to an output port of the first group of output ports, and a second end connected to an input port of the first group of input ports.

Example 3. The optical device of Example 2, wherein a longitudinal distance between a centerpoint of the output port and a centerpoint of the input port is between 10 and 200 microns.

Example 4. The optical device of Example 2, wherein a lateral distance between a centerpoint of the output port and a centerpoint of the input port is larger than 50 microns.

Example 5. The optical device of any of Examples 1 and 2, wherein the polymer waveguide is an air-cladded polymer waveguide.

Example 6. The optical device of any of Examples 1 and 2, wherein the polymer waveguide is embedded in a polymer layer having an optical refractive index less than that of the polymer waveguide.

Example 7. The optical device of any of Examples 1 and 2, wherein the polymer waveguide is a photonic wire bond.

Example 8. The optical device of Example 1, wherein the plurality of dual output laser sources comprise a plurality of separate laser chips and the laser array comprises the plurality of separate laser chips mounted on a laser carrier chip.

Example 9. The optical device of any of Examples 1 and 8, wherein the laser array is mounted on a surface of the first PIC or the second PIC.

Example 10. The optical device of any of Examples 2 and 8, wherein the laser array, the first PIC and the second PIC are mounted on a single optical bench.

Example 11. The optical device of any of Examples 2 and 8, wherein the laser array is mounted on a laser carrier chip, and the second PIC is mounted on a second PIC carrier chip and the first PIC is mounted on a first PIC carrier chip.

Example 12. The optical device of Example 11, wherein the laser and PIC carrier chips are mounted on a single optical bench.

Example 13. The optical device of any of Examples 10 and 12, wherein a distance between a centerpoint of the optical output port and a top surface of the optical bench is different from a distance between the centerpoint of the input port and the top surface of the optical bench.

Example 14. The optical device of any of Examples 9-11, wherein individual dual output laser sources are tested before the laser array is mounted, and wherein one or more output port of a dual output laser source identified based on test results are not connected to input ports.

Example 15. The optical device of Example 1, wherein laser light generated by a dual output laser source of the plurality of dual output laser sources comprises a narrowband light output centered around a single center wavelength.

Example 16. The optical device of Example 15, wherein the single center wavelength is a wavelength in C-band.

Example 17. The optical device of Example 15, wherein the single center wavelength is a wavelength in O-band.

Example 18. The optical device of Example 1, wherein the number of plurality of dual output laser sources is larger than 4, 8, 16, or 32.

Example 19. The optical device of Example 1, wherein the plurality of dual output laser sources comprises a laser bar.

Example 20. The optical device of Example 1, wherein the plurality of dual output laser sources comprise semiconductor lasers configured to generate laser light and output the laser light from the first and second groups of output ports.

Example 21. The optical device of Example 1, wherein a dual output laser source of the plurality of light sources comprises a dual-output semiconductor laser and at least one semiconductor optical amplifier (SOA) configured to amplify laser light received from an output of the semiconductor laser and output the amplified laser light via an output port of the first and second groups of output ports.

Example 22. The optical device of Example 1, wherein a dual output laser source of the plurality of light sources comprises a dual-output semiconductor laser and at least one spot-size converter configured to convert a spot-size size of laser light output by the dual-output semiconductor laser and output a laser light having a converted spot-size via an output port of first and second groups of the first and second groups of output ports.

Example 23. The optical device of Example 1, wherein a dual output laser source of the plurality of light sources comprises a dual output semiconductor laser, at least one semiconductor optical amplifier (SOA), and at a least one spot-size converter, wherein:

the dual-output semiconductor optical amplifier (SOA) is configured to amplify laser light received from the semiconductor laser; and the spot-size converter configured to convert a spot-size size of the amplified laser light output by the SOA and output an amplified laser light having a converted spot-size via an output port of the first and second groups of output ports.

Example 24. The optical device of Example 22 wherein the dual-output semiconductor laser and the SOA are monolithically fabricated on a laser chip and wherein the semiconductor laser and the SOA are electrically and/or thermally isolated from each other.

Example 25. The optical device of any of Examples 21 and 22, wherein the dual-out put semiconductor laser is a distributed feedback (DFB) laser or distributed Bragg reflector (DBR) laser.

Example 26. The optical device of a Example 25, wherein the dual-output semiconductor laser is a quarter wavelength shifted DFB semiconductor laser comprising a grating-free section in an active waveguide having a length larger than 5% of a total length of the dual-output semiconductor laser.

Example 27. The optical device of Example 26, wherein the dual-output semiconductor laser is a DBR laser having a phase tuning section between two optical gain sections, said phase tuning section configured to change a phase of the laser light sustained in a laser cavity via thermo-optic or electro-optic effect.

Example 28. The optical device of Example 27, wherein the dual-output semiconductor laser comprises at least one isolation section configured to thermally or electrically isolate the phase tuning section and an optical gain section, or an optical gain section and a reflector.

Example 29. The optical device of any of Examples 1 and 22-27, wherein the dual-output laser source further comprises an optical modulator configured to modulate the laser light output by the dual-output laser source.

Example 30. The optical device of Example 1, wherein individual dual output laser sources of the plurality of dual output laser sources are configured to generate laser light having a center wavelength different from center wavelengths of laser light generated by other dual output laser sources, the first PIC further comprises a first group of PIC output ports, the second PIC further comprises a second group of PIC output ports, the first and second groups of PIC output ports are configured to output multi-wavelength light comprising light having a plurality of center wavelengths wherein center wavelengths are associated with the respective light sources of the plurality of dual output laser sources.

Example 31. The optical device of Example 30, wherein:

the first PIC further comprises a first star coupler configured to receive laser light from the first group of input ports, and transmit the multi-wavelength light to the first group of PIC output ports; and the second PIC further comprises a second star coupler configured to receive laser light from the second group of input ports, and transmit the multi-wavelength light to the second group of PIC output ports.

Example 32. The optical device of Example 1, wherein each dual output laser source of the plurality of dual output laser sources is configured to generate laser light having a center wavelength different from center wavelengths of laser light generated by other dual output laser sources, the first PIC further comprises at least one first output port, the second PIC further comprises at least one second output port, the first and the second output ports configured to output multi-wavelength light comprising light having a plurality of center wavelengths wherein each center wavelength is associated with a light source of the plurality of dual output laser sources.

Example 33. The optical device of Example 32, wherein:

the first PIC further comprises a first arrayed waveguide grating (AWG) coupler configured to receive laser light from the first group of input ports, and transmit the multi-wavelength light to the first output port; and the second PIC further comprises a second arrayed waveguide grating (AWG) coupler configured to receive laser light from the second group of input ports, and transmit the multi-wavelength light to the second output port.

Example 34. The optical device of Example 1, wherein the first PIC and the second PIC comprise a waveguide layer comprising silicon nitride, silicon, doped glass, or polymer.

Example 35. The optical device of Example 1, wherein a substrate of the least two separate substrates comprises a material not used in the other substrates.

Example 36. The optical device of Example 1, wherein:

the first PIC further comprises a first optical multiplexer configured to combine laser outputs received from the first group of input ports, and transmit a multi-wavelength light to one or more output ports of the PIC; and the second PIC further comprises a second optical multiplexer configured to combine laser outputs received from the second group of input ports, and transmit a multi-wavelength light to one or more output ports of the PIC.

Example 37. An optical device comprising:

a laser array comprising a plurality of dual-output laser sources, said dual output laser array having a first group and a second group of output ports wherein laser light generated by an individual dual output laser source of the plurality of dual output laser sources is output by an output port of the first group of output ports and by an output port of the second group of output ports;

a first photonic integrated circuit (PIC) comprising a first group of input ports and a first optical multiplexer configured to combine laser outputs received from the first group of input ports;

a second photonic integrated circuit (PIC) comprising a second group of input ports and a second optical multiplexer configured to combine laser outputs received from the second group of input ports;

a first group of photonic wire bonds connected to the first group of output ports, said first group of photonic wire bonds configured to transmit laser light output from the first group of output ports to the first group of input ports;

a second group of photonic wire bonds connected to the second group of output and ports, said second group of photonic wire bonds configured to transmit laser light output from the second group of output ports to the second group of input ports.

Example 38. The optical device of any of Examples above, wherein the diameter of at least one of the photonic wire bonds of the first or second groups of polymer waveguides is less than 8 microns, Example 39. The optical device of any of Examples above, wherein a longitudinal distance between one of said first group of output ports and one of said first group of input ports optically connected thereto via the photonic wire bonds is less than 500 microns.

Example 40. The optical device of any of Examples above, wherein a longitudinal distance between one of said second group of output ports and one of said second group of input ports optically connected thereto via the photonic wire bonds is less than 500 microns.

Example 41. The optical device of any of Examples above, wherein a spacing between adjacent output ports of the first or second groups of output ports or a spacing between adjacent input ports of the first and second groups of input ports is less than 20 microns.

Example 42. The optical device of any of Examples above, wherein at least a section of at least one of the photonic wire bonds of the first or second groups of photonic wire bonds is cladded by air, or cladded by a polymer having a single refractive index different from the refractive index of the polymer waveguide/photonic wire bond.

Example 43. The optical device of any of Examples above, wherein at least a section of at least one of the photonic wire bonds of the first or second groups of photonic wire bonds is surrounded by a medium having a single refractive index.

Example 44. The optical device of any of Examples above, wherein at least one of the photonic wire bonds of the first or second groups of photonic wire bonds comprises a first end, a second end, and a middle section extending from the first end to the second end, wherein at least one of the first end or the second end comprises a tapered region.

Example 45. The optical device of Example 44, wherein the tapered region comprises a linearly tapered region.

Example 46. The optical device of Example 44, wherein the tapered region comprises a non-linearly tapered region.

Example 47. The optical device of Example 44, wherein at least the middle section comprises a bend.

Example 48. The optical device of any of Examples above, wherein the first group of output ports and the second group of output ports are disposed along two opposite edges or sides of the laser array.

Example 49. The optical device of any of Examples above, wherein the first and second photonic integrated circuits are disposed on opposite sides of the laser array.

Group 3

Example 1. An optical device comprising:

an optical gain array comprising a plurality of optically active waveguides and having a plurality of output ports configured to output laser light;

a photonic integrated circuit (PIC) comprising a plurality of input ports and a plurality of narrowband optical reflectors configured to reflect a portion of laser light received from the plurality of input ports; and a plurality of polymer waveguides connected to the plurality of output ports and input ports, said plurality of polymer waveguides configured to transmit laser light output from the plurality of output ports to the plurality of input ports;

wherein the plurality of optically active waveguides and the respective narrowband optical reflectors, form a plurality of individual laser sources; and wherein the optical gain array and the PIC are fabricated on at least two separate substrates.

Example 2. The optical device of Example 1, wherein a polymer waveguide of the plurality of polymer waveguides comprises a first end connected to an output port of the plurality of output ports, and a second end connected to an input port of the plurality of input ports.

Example 3. The optical device of Example 2, wherein a longitudinal distance between a centerpoint of the output port and a centerpoint of the input port is between 10 and 200 microns.

Example 4. The optical device of Example 2, wherein a lateral distance between a centerpoint of the output port and a centerpoint of the input port is larger than 50 microns.

Example 5. The optical device of Example 2, wherein the polymer waveguide is an air-cladded polymer waveguide.

Example 6. The optical device of Example 2, wherein the polymer waveguide is embedded in a polymer layer having an optical refractive index less than that of the polymer waveguide.

Example 7. The optical device of Example 2, wherein the polymer waveguide is a photonic wire bond.

Example 8. The optical device of Example 1, wherein the plurality of optically active waveguides comprise a plurality of separate gain chips and the optical gain array comprises the plurality of the separate gain chips mounted on a gain carrier chip.

Example 9. The optical device of any of Examples 1 and 8, wherein the optical gain array is mounted on a surface of the PIC.

Example 10. The optical device of any of Examples 2 and 8, wherein the optical gain array and the PIC are mounted on a single optical bench.

Example 11. The optical device of any of Examples 2 and 8, wherein the optical gain array is mounted on a gain carrier chip and the PIC is mounted on a PIC carrier chip.

Example 12. The optical device of Example 11, wherein the gain and PIC carrier chips are mounted on a single optical bench.

Example 13. The optical device of any of Examples 10 and 12, wherein a distance between a centerpoint of the optical output port and a top surface of the optical bench is different from a distance between the centerpoint of the input port and the top surface of the optical bench.

Example 14. The optical device of any of Examples 9-11, wherein individual active waveguides are tested before the optical gain array is mounted, and the output port of an optically active waveguide identified based on test results is not connected to a polymer waveguide.

Example 15. The optical device of Example 1, wherein an individual laser source of the plurality of laser sources, generates laser light comprising narrowband light output centered around a single center wavelength, wherein the single center wavelength is different from single center wavelengths associated with other individual laser sources in the plurality of laser sources.

Example 16. The optical device of Example 15, wherein the single center wavelength is a wavelength in C-band.

Example 17. The optical device of Example 15, wherein the single center wavelength is a wavelength in O-band.

Example 18. The optical device of Example 1, wherein a number of the plurality of laser sources is larger than 4, 8, 16, or 32.

Example 19. The optical device of Example 1, wherein the plurality of laser sources comprises a laser bar or a laser array.

Example 20. The optical device of Example 1, wherein the plurality of laser sources comprise semiconductor lasers configured to generate laser light and output the laser light from output ports of the plurality of output ports.

Example 21. The optical device of Example 1, wherein individual active waveguides comprise a spot-size converter configured to convert a spot-size size of laser light output by individual active waveguide.

Example 22. The optical device of Example 1, wherein the plurality of narrow band reflectors comprises sampled grating distributed Bragg reflectors.

Example 23. The optical device of Example 1, wherein the plurality of narrow band reflectors comprises distributed Bragg gratings.

Example 24. The optical device of Example 1, wherein the plurality of narrow band reflectors comprises ring resonators.

Example 25. The optical device of Example 15, wherein the plurality of narrow band reflectors are further configured to output a portion of laser light received from the plurality of input ports and the PIC further comprises a star coupler configured to receive the laser light output by the plurality of narrowband reflectors, generate multi-wavelength light comprising the single center wavelengths associated with individual laser sources, and output portions of the multi-wavelength light via a plurality of outputs.

Example 26. The optical device of Example 15, wherein the PIC further comprises:

an arrayed waveguide grating configured to receive laser light from the plurality of input ports and generate multi-wavelength light comprising the single center wavelengths associated with individual laser sources;

an output waveguide comprising the plurality of narrow-band reflectors, configured to output the multi-wavelength light received from the arrayed waveguide grating.

Example 27. The optical device of Example 1, wherein an optically active waveguide of the plurality of optically active waveguides comprises a phase tuning section configured to control the phase of the laser light within the optically active waveguide via electro-optic effect, thermo-optic effect, or thermal expansion.

Example 28. The optical device of Example 1, wherein the plurality of output ports are coated with one or more anti reflection layers.

Example 29. The optical device of Example 1, wherein individual optically active waveguides comprise a back end having a highly reflective coating or a high reflectivity mirror.

Example 30. The optical device of Example 1, wherein a substrate of the least two separate substrates comprises a material not used in the other substrates.

Example 31. The optical device of Example 1, wherein the optical gain array comprises a gain bar.

Example 32. The optical device of Example 1, wherein the plurality of optically active waveguides is monolithically fabricated on a single substrate.

Example 33. An optical device comprising:

an optical gain array comprising a plurality of optically active waveguides and having a plurality of output ports configured to output laser light;

a photonic integrated circuit (PIC) comprising a plurality of input ports and a plurality of narrowband optical reflectors configured to reflect a portion of laser light received from the plurality of input ports; and a plurality of photonic wire bonds connected to the plurality of output ports and input ports, said plurality of photonic wire bonds configured to transmit laser light output from the plurality of output ports to the plurality of input ports;

wherein the plurality of optically active waveguides and the respective narrowband optical reflectors, form a plurality of individual laser sources;

wherein the optical gain array and the PIC are fabricated on at least two separate substrates.

Example 34. The optical device of any of Examples 33, wherein the photonic wire bond is a polymer waveguide.

Example 35. The optical device of any of the Examples above, wherein a photonic wire bond comprises a waveguide has a length and a cross-section orthogonal to its length that is round, circular, elliptically-shaped, or oval-shaped.

Example 36. The optical device of any of the Examples above, wherein a photonic wire bond has at least one bend along at least a portion of the length of the photonic wire bond from the output port of the laser source to the input port of the PIC.

Example 37. The optical device of any of the Examples above, wherein a photonic wire bond has first and second ends and a middle, wherein said photonic wire bond is tapered a at least one of said first and second ends.

Example 38. The optical device of any of the Examples above, wherein said photonic wire bond has a diameter of 8 microns or less.

Example 39. The optical device of any of the Examples above, wherein the longitudinal distance between one of said output ports and one of said optical input ports optically connected thereto via the photonic wire bond is 500 microns or less.

Example 40. The optical device of any of the Examples above, wherein a spacing between adjacent output ports of the plurality of output ports or a spacing between adjacent input ports of the plurality of input ports is less than 20 microns.

Example 41. The optical device of any of the Examples above wherein the diameter of at least one of the photonic wire bonds of the plurality of photonic wire bonds is less than 8 microns.

Example 42. The optical device of any of the Examples above wherein the longitudinal distance between one of said plurality of output ports and one of said plurality of input ports, optically connected thereto via the photonic wire bonds, is less than 500 microns.

Example 43. The optical device of any of the Examples above wherein a spacing between adjacent output ports of the plurality of output ports or a spacing between adjacent input ports of the plurality of input ports is less than 20 microns.

Example 44. The optical device of any of the Examples above, wherein at least a section the polymer waveguide/ photonic wire bond is cladded by air, or cladded by a polymer having a single refractive index different from the refractive index of the polymer waveguide/photonic wire bond.

Example 45. The optical device of any of the Examples above, wherein at least a section of at least one of the photonic wire bonds of the plurality of photonic wire bonds is surrounded by a medium having a single refractive index.

Example 46. The optical device of any of the Examples above, wherein at least one of the polymer waveguides of the plurality of photonic wire bonds comprises a first end, a second end, and a middle section extending from the first end to the second end, wherein at least one of the first end or the second end comprises a tapered region.

Example 47. The optical device of Example 46, wherein the tapered region comprises a linearly tapered region.

Example 48. The optical device of Example 46, wherein the tapered region comprises a non-linearly tapered region.

Example 49. The optical device of Example 46, wherein the tapered region comprises a substantially cylindrically symmetric region.

Example 50. The optical device of Example 46, wherein at least the middle section comprises a bend.

Group 4

Example 1. An optical device comprising:

a laser array comprising a plurality of dual-output laser sources having a first group and a second group of output ports wherein laser light generated by individual dual-output laser sources of the plurality of dual-output laser sources are output by output ports of the first group of output ports and output ports of the second group of output ports;

a first photonic integrated circuit (PIC) comprising a first group of input ports and a first optical multiplexer configured to combine laser light outputs received from the first group of input ports;

a second photonic integrated circuit (PIC) comprising a second group of input ports and a second optical multiplexer configured to combine laser lights received from the second group of input ports;

wherein the first group of output ports are optically coupled to the first group of input ports;

wherein the second group of output ports are optically coupled to the second group of input ports.

Example 2. The optical device of Example 1, wherein the first group of output ports are optically coupled to the first group of input ports via butt coupling.

Example 3. The optical device of Example 1, wherein the second group of output ports are optically coupled to the second group of input ports via butt coupling.

Example 4. The optical device of Example 1, wherein the first group of output ports are optically coupled to the first group of input ports via a first group of waveguides.

Example 5. The optical device of Example 1, wherein the second group of output ports are optically coupled to the second group of input ports via a second group of waveguides.

Example 6. The optical device of any of Examples 4 and 5, wherein the first and the second group of waveguides comprise air-cladded polymer waveguides.

Example 7. The optical device of any of Examples 4 and 5, wherein the first and the second group of waveguides comprise fiber arrays.

Example 8. The optical device of any of Examples 4 and 5, wherein the first and the second group of waveguides comprise arrays of monolithically fabricated waveguides on a substrate.

Example 9. The optical device of any of Examples 4 and 5, wherein the first and the second group of waveguides, the first PIC and the second PIC, and the laser array, are monolithically fabricated waveguides on a single substrate.

Example 10. The optical device of any of Examples 8 and 9, where the arrays of monolithically fabricated waveguides comprise silicon, silicon nitride or polymer waveguides.

Example 11. The optical device of Example 1, wherein individual dual-output laser sources of the plurality of dual-output laser sources are configured to generate laser light having a wavelength different from wavelengths of laser light generated by other laser sources, the first PIC further comprises a first group of PIC output ports, each configured to output multi-wavelength light comprising light having a plurality of wavelengths, and the second PIC further comprises a second group of PIC output ports, each configured to output multi-wavelength light comprising light having a plurality of wavelengths, associated with individual laser sources.

Example 12. The optical device of Example 11, wherein the first optical multiplexer comprises a first star coupler configured to receive laser light from the first group of input ports, and transmit the multi-wavelength light to the first group of PIC output ports.

Example 13. The optical device of Example 12, wherein the second optical multiplexer comprises a second star coupler configured to receive laser light from the second group of input ports, and transmit the multi-wavelength light to the second group of PIC output ports.

Example 14. The optical device of Example 1, wherein individual dual-output laser sources of the plurality of dual-output laser sources are configured to generate laser light having a wavelength different from wavelengths of laser light generated by other laser sources, the first PIC further comprises at least one first PIC output port, configured to output multi-wavelength light comprising light having a plurality of wavelengths associated with individual laser sources, the second PIC further comprises at least one second PIC output port, configured to output multi-wavelength light comprising light having a plurality of wavelengths associated with individual laser sources.

Example 15. The optical device of Example 14, wherein the first optical multiplexer comprises an arrayed waveguide grating (AWG) configured to receive light from the first group of input ports, and generate multi-wavelength light Example 16. The optical device of Example 15, wherein the second optical multiplexer comprises an arrayed waveguide grating (AWG) configured to receive light from the second group of input ports, and generate multi-wavelength light.

Example 17. The optical device of Example 1, wherein laser light generated by a dual output laser source of the plurality of dual output laser sources comprises a narrow-band light output centered around a single center wavelength.

Example 18. The optical device of Example 17 wherein the single center wavelength is a wavelength in C-band.

Example 19. The optical device of Example 17, wherein the single center wavelength is a wavelength in O-band.

Example 20. The optical device of Example 1, wherein a number of plurality of dual output laser sources is larger than 4, 8, 16, or 32.

Example 21. The optical device of Example 1, wherein the plurality of dual output laser sources comprises a laser bar.

Example 22. The optical device of Example 1, wherein the plurality of dual output laser sources comprise semiconductor lasers configured to generate laser light and output the laser light from the plurality of output ports.

Example 23. The optical device of Example 1, wherein a dual output laser source of the plurality of light sources comprises a dual-output semiconductor laser and at least one semiconductor optical amplifier (SOA) configured to amplify laser light received from an output of the semiconductor laser and output the amplified laser light via an output port of the plurality of output ports.

Example 24. The optical device of Example 1, wherein a dual output laser source of the plurality of light sources comprises a dual-output semiconductor laser and at least one spot-size converter configured to convert a spot-size of laser light output by the dual-output semiconductor laser and output laser light having a converted spot-size via an output port of the plurality of output ports.

Example 25. The optical device of Example 1, wherein a dual output laser source of the plurality of light sources comprises a dual output semiconductor laser, at least one semiconductor optical amplifier (SOA), and at a least one spot-size converter, wherein:

the dual-output semiconductor optical amplifier (SOA) is configured to amplify laser light received from the semiconductor laser; and the spot-size converter configured to convert a spot-size of the amplified laser light output by the SOA and output amplified laser light having a converted spot-size via an output port of the plurality of output ports.

Example 26. The optical device of any of any of Examples above, wherein the dual-out put semiconductor laser is a distributed feedback (DFB) laser or distributed Bragg reflector (DBR) laser.

Example 27. The optical device of Example 26, wherein the dual-output semiconductor laser is a quarter wavelength shifted DFB semiconductor laser comprising a grating-free section in an active waveguide having a length larger than 5% of a total length of the dual-output semiconductor laser.

Example 28. The optical device of Example 26, wherein the dual-output semiconductor laser is a DBR laser having a phase tuning section between two optical gain sections, said phase tuning section configured to change a phase of the laser light sustained in a laser cavity via thermo-optic or electro-optic effect.

Example 29. The optical device of Example 28, wherein the dual-output semiconductor laser comprises at least one isolation section configured to thermally or electrically isolate the phase tuning section and an optical gain section, or an optical gain section and a reflector.

Example 30. The optical device of any of Examples above, wherein the first group of output ports and the second group of output ports are disposed along two opposite edges or sides of the laser array.

Example 31. The optical device of any of Example 27, wherein the grating-free section comprises a phase tuning section.

Example 32. The optical device of Example 31, wherein the phase tuning section comprises bandgap different from that of a gain medium of the distributed feedback (DFB) laser or the distributed Bragg reflector (DBR) laser.

Example 33. The optical device of any of Examples above, wherein the first and second photonic integrated circuits are disposed on opposite sides of the laser array.

Group 5

Example 1. A semiconductor laser configured to generate laser light having a center wavelength, said semiconductor laser comprising:

an active waveguide extended in a longitudinal direction from a first end to a second end, said active waveguide configured to provide optical gain within a gain bandwidth, wherein the active waveguide comprises:

a first region near the first end comprising a first Bragg grating;

a second region near the second end comprising a second Bragg grating;

a third region extended between the first Bragg grating and the second Bragg grating wherein:

the third region does not include any grating;

a length of the third region is larger than 5% of a longitudinal distance between the first end and the second end; and wherein the third region is configured to provide an optical phase of quarter wavelength (or $\pi/2$) for the laser light passing through the third region.

Example 2. The semiconductor laser of Example 1, wherein an optical path length of the third region is equal to an odd integer number multiplied by a quarter of the laser wavelength within said active waveguide.

Example 3. The semiconductor laser of Example 1, wherein the laser light comprises wavelength within a narrow bandwidth centered around the center wavelength.

Example 4. The semiconductor laser of Example 3, wherein the narrow bandwidth is between 1 KHz and 50 MHz.

Example 5. The semiconductor laser of Example 1, wherein the active waveguide comprises III-V semiconductor material.

Example 6. The semiconductor laser of Example 1, wherein the length of the third region is larger than 10%, 30%, 50%, or 75% of the longitudinal distance between the first end and the second end.

Example 7. The semiconductor laser of Example 3, wherein the center wavelength is between 1200 nm and 1750 nm.

Example 8. The semiconductor laser of Example 1, wherein the first and the second ends of the active waveguide comprise anti reflection coating.

Example 9. The semiconductor laser of Example 1, wherein said active waveguide further comprises a phase tuning section configured to adjust a phase of laser light within said active waveguide via electro-optic effect, thermo-optic effect, or thermal expansion.

Example 10. The semiconductor laser of Example 1, wherein a side mode suppression ratio of the laser light generated by the semiconductor laser is larger than 30 dB.

Example 11. The semiconductor laser of any of Examples above, wherein the active waveguide, the first region, and the second region comprise a single gain material.

Example 12. The semiconductor laser of any of Examples above, wherein the first and the second the first and the second Bragg Gratings comprise Distributed Bragg Reflectors (DBRs).

Example 13. The semiconductor laser of any of Examples above, wherein the first and the second the first and the second Bragg Gratings comprise Sampled Grating Distributed Bragg Reflectors (SG-DBRs).

Example 14. The semiconductor laser of any of Examples above, wherein at least of the first or the second the first and the second Bragg Gratings comprise a Distributed Bragg Reflector (DBR) or a Sampled Grating Distributed Bragg Reflectors (SG-DBR).

Group 6

Example 1. A semiconductor laser configured to generate laser light having a center wavelength, said semiconductor laser comprising:

a laser waveguide extended in a longitudinal direction from a first end to a second end, wherein the laser waveguide comprises:

a first reflector near the first end;

a second reflector near the second end;

a cavity section extended between the first reflector and the second reflector, the cavity section comprising:

a first and a second optical gain section configured to amplify the laser light;

a phase tuning section disposed between the first and the second optical gain sections, said phase tuning section configured to control the phase of laser light sustained in the cavity section.

Example 2. The semiconductor laser of Example 1, wherein the first and the second reflectors comprise distributed Bragg gratings.

Example 3. The semiconductor laser of Example 1, wherein the cavity section further comprises:

a first isolation section between the first optical gain section and the phase tuning section; and a second isolation section between the second optical gain section and the phase tuning section;

wherein the first and the second isolation sections are configured to thermally or electrically isolate the phase tuning section, the first optical gain section and second optical gain section.

Example 4. The semiconductor laser of Example 3, wherein the cavity section further comprises:

a third isolation section between the first reflector and the first optical gain section, said third isolation configured to thermally or electrically isolate the first reflector and the first optical gain section; and a fourth isolation section between the second reflector and the second gain section, said fourth isolation configured to thermally or electrically isolate the second reflector and the second optical gain section.

Example 5. The semiconductor laser of Example 1, wherein the phase tuning section comprises bandgap different from the of the first and the second optical gain sections.

Example 6. The semiconductor laser of Example 1, wherein the first reflector is closer to the first end and the second reflector is closer to the second end.

Example 7. The semiconductor laser of any of Examples above, wherein the first and the second reflectors comprise Distributed Bragg Reflectors (DBRs).

Example 8. The semiconductor laser of any of Examples above, wherein the first and the second reflectors comprise Sampled Grating Distributed Bragg Reflectors (SG-DBRs).

Example 9. The semiconductor laser of any of Examples above, wherein at least of the first or the second reflectors comprise a Distributed Bragg Reflector (DBR) or a Sampled Grating Distributed Bragg Reflectors (SG-DBR).

Group 7

Example 1. An optical source configured to generate light having a center wavelength, said optical source:

an active waveguide extended in a longitudinal direction from a first end to a second end, said active waveguide is fabricated on a laser chip and configured to provide optical gain within a gain bandwidth, wherein the active waveguide comprises:

a laser section comprising a semiconductor laser closer to the first end, the laser section configured to generate laser light;

an optical amplifier section closer to the second end, the amplifier section configured to receive and amplify the laser light;

an isolation section configured to transmit the laser light from the laser section to the amplifier section, and reduce thermal cross talk between the laser section and optical amplifier section;

wherein a length of the isolation section along the longitudinal direction extending between the laser section and optical amplifier section, is greater than at least 50% of a thickness of the active waveguide along a direction perpendicular to a top surface of the substrate.

Example 2. The optical source of Example 1, wherein the isolation section comprises a bandgap different from that of the active waveguide.

Example 3. The optical source of Example 1 or 2, wherein the length of the isolation section is greater than 50% of the laser chip.

Example 4. The optical device of Example 1 or 2, wherein a length the isolation section extending from the semiconductor laser to the SOA, is larger than 50% of a thickness between the top of the active waveguide to the bottom of the laser chip.

Example 5. The optical device of Example 1 or 2, wherein a length of the isolation section extending from the semiconductor laser to the SOA, is larger than 50% of a thickness of the laser chip, and any intervening layer between the laser chip and a substrate on which the laser chip is mounted.

Example 6. The optical source of Example 1 or 2, wherein a length of the isolation section is at least as large as the thickness of the active waveguide along a direction perpendicular to a top surface of the substrate.

Example 7. The optical source of Example 1 or 2, wherein the length of the isolation section is at least as large as the laser chip.

Example 8. The optical device of Example 1 or 2, wherein a length the isolation section extending from the semiconductor laser to the SOA is at least as large as the thickness between top of the active waveguide to the bottom of the laser chip.

Example 11. The optical device of Example 1 or 2, wherein a length the isolation section extending from the semiconductor laser to the SOA is at least as large as the thickness of the laser chip and any intervening layer between the laser chip and a substrate on which the laser chip is mounted.

Group 8

Example 1. An optical device comprising:

a laser array comprising a plurality of laser sources and having a plurality of output ports configured to output laser light generated by the plurality of laser sources;

a photonic integrated circuit (PIC) comprising a plurality of input ports and an optical multiplexer configured to combine laser lights received from the plurality of input ports; and a plurality of polymer waveguides connected to the plurality of input ports and the plurality of output ports, the plurality of the polymer waveguides configured to guide laser light output from the plurality of output ports to the plurality of input ports;

wherein the laser array and the PIC are fabricated on at least two separate substrates; and wherein a diameter of at least one of the polymer waveguides of the plurality of polymer waveguides does not exceed 20 microns along a length of the at least one of the polymer waveguides, or wherein the longitudinal distance between one of said output ports and one of said optical input ports optically connected thereto via the coupling waveguides is less than 500 microns, or wherein a spacing between adjacent output ports of the plurality of output ports or a spacing between adjacent input ports of the plurality of input ports is less than 20 microns.

Example 2. The optical device of Example 1, wherein a polymer waveguide of the plurality of polymer waveguides comprises a first end connected to an output port of the plurality of output ports, and a second end connected to an input port of the plurality of input ports.

Example 3. The optical device of Example 1 or 2, wherein a longitudinal distance between a centerpoint of the output port and a centerpoint of the input port is between 10 and 200 microns.

Example 4. The optical device of any of the examples above, wherein a lateral distance between a centerpoint of the output port and a centerpoint of the input port is larger than 50 microns.

Example 5. The optical device of any of the examples above, wherein the polymer waveguide is an air-cladded polymer waveguide.

Example 6. The optical device of any of Examples 1-4, wherein the polymer waveguide is embedded in a polymer layer having an optical refractive index less than that of the polymer waveguide.

Example 7. The optical device of any of the examples above, wherein the polymer waveguide is a photonic wire bond.

Example 8. The optical device of any of examples above, wherein the plurality of laser sources comprise a plurality of separate laser chips and the laser array comprises the plurality of separate laser chips mounted on a laser carrier chip.

Example 9. The optical device of any of the examples above, wherein the laser array is mounted on a surface of the PIC or a substrate on which the PIC is fabricated.

Example 10. The optical device of any of the examples above, wherein the laser array and the PIC are mounted on a single optical bench.

Example 11. The optical device any of the examples above, wherein the laser array is mounted on a laser carrier chip and the PIC is mounted on a PIC carrier chip.

Example 12. The optical device of Example 11, wherein the laser and PIC carrier chips are mounted on a single optical bench.

Example 13. The optical device of any of Examples 10 and 12, wherein a distance between a centerpoint of the optical output port and a top surface of the optical bench is different from a distance between the centerpoint of the input port and the top surface of the optical bench.

Example 14. The optical device of any of the examples above, wherein laser light output by a laser source of the plurality of laser sources is not optically coupled guided to any input port.

Example 15. The optical device of Example 14, wherein the individual laser sources are tested before the laser array is mounted, and the laser source is identified based on an outcome of the test.

Example 16. The optical device of any of the examples above, wherein laser light generated by a laser source of the plurality of laser sources comprises a narrowband light output centered around a single center wavelength.

Example 17. The optical device of Example 16, wherein the single center wavelength is a wavelength in C-band.

Example 18. The optical device of Example 16, wherein the single center wavelength is a wavelength in O-band.

Example 19. The optical device of any of the examples above, wherein a number of plurality of laser sources is larger than 4, 8, 16, or 32.

Example 20. The optical device of any of the examples above, wherein the plurality of laser sources comprises a laser bar or a laser array.

Example 21. The optical device of any of the examples above, wherein the plurality of laser sources comprise semiconductor lasers configured to generate laser light and output the laser light from the plurality of output ports.

Example 22. The optical device of any of the examples above, wherein a laser source of the plurality of laser sources comprises a semiconductor laser and a semiconductor optical amplifier (SOA) configured to amplify laser light received from the semiconductor laser and output the amplified laser light via an output port of the plurality of output ports.

Example 23. The optical device of any of Examples 1-21, wherein a laser source of the plurality of laser sources comprises a semiconductor laser and a spot-size converter configured to convert a spot-size size of laser light output by the laser and output a laser light having a converted spot-size via an output port of the plurality of output ports.

Example 24. The optical device of any of Examples 1-19, wherein a laser source of the plurality of laser sources comprises a semiconductor laser, a semiconductor optical amplifier (SOA), and a spot-size converter, wherein:

the semiconductor optical amplifier (SOA) is configured to amplify laser light received from the semiconductor laser; and the spot-size converter configured to convert a spot-size size of the amplified laser light output by the SOA and output an amplified laser light having a converted spot-size via an output port of the plurality of output ports.

Example 25. The optical device of Example 22 wherein the semiconductor laser and the SOA are monolithically fabricated on a laser chip and wherein the semiconductor laser and the SOA are electrically and/or thermally isolated by an isolation region.

Example 26. The optical device of any of examples above, wherein the semiconductor laser is a distributed feedback (DFB) laser or distributed Bragg reflector (DBR) laser.

Example 27. The optical device of Example 26, wherein the semiconductor laser is a quarter wavelength shifted DFB semiconductor laser comprising a grating-free section in an active waveguide having a length larger than 5% of the total length of the semiconductor laser.

Example 28. The optical device of any of examples above, wherein the laser source comprises an optical modulator configured to modulate the laser light output by the laser source.

Example 29. The optical device of any of the examples above, wherein different laser sources of the plurality of laser sources are configured to generate laser light having wavelengths different from the wavelengths of laser light generated by the other laser sources, and the PIC further comprises a plurality of PIC output ports, configured to output multi-wavelength light comprising light having a plurality of wavelengths, wherein different wavelengths are associated with a laser source of the plurality of laser sources.

Example 30. The optical device of any of the examples above, wherein the optical multiplexer comprises a star coupler configured to receive laser light from the plurality of input ports, and transmit or couple the multi-wavelength light to the plurality of PIC output ports.

Example 31. The optical device of any of the examples above, wherein different laser source of the plurality of laser sources is configured to generate laser light having a wavelength different from wavelengths of laser light generated by the other laser sources, and the PIC further comprises at least one output port, configured to output multi-wavelength light comprising light having a plurality of wavelengths wherein different wavelength associated with respective laser sources of the plurality of laser sources.

Example 32. The optical device of any of the examples above, wherein the optical multiplexer comprises an arrayed waveguide grating (AWG) configured to receive light from the plurality of input ports, and output the light having multiple wavelengths.

Example 33. The optical device of any of the examples above, wherein the PIC comprises a waveguide layer comprising silicon nitride, silicon, doped glass, or polymer.

Example 34. The optical device of any of the examples above, wherein a substrate of the least two separate substrates comprises a material not used in the other substrates.

Example 35. The optical device of any of the examples above, wherein the at least one end of a polymer waveguide of the plurality of polymer waveguides comprises a tapered region, wherein the at least one end is at or to proximal to an input port of the plurality of input ports or an output port of the plurality of the output ports.

Example 36. The optical device of Example 35, wherein a cross-sectional area of the tapered region in a plane perpendicular to the direction of propagation of light within the tapered region, gradually decreases as a function of a distance from the output port toward the middle of the polymer waveguide, or a distance from the input port toward the middle of the at least one of the polymer waveguides.

Example 37. The optical device of Example 35, wherein the cross-sectional area of the tapered region in a plane perpendicular to the direction of propagation of light within the tapered region gradually increases as a function of a distance from the output port toward the middle of the polymer waveguide, or a distance from the input port toward the middle of the at least one of the polymer waveguides.

Example 38. The optical device of any of Examples 36 or 37, wherein the function is a linear function.

Example 39. The optical device of any of Examples 36 or 37, wherein the function is a non-linear function.

Example 40. The optical device of any of Examples 35-39, wherein the tapered region is substantially cylindrically symmetric.

Example 41. The optical device of Example 35, wherein the output port comprises an out-coupling region of an active waveguide, and wherein a cross-sectional area of the tapered region in a plane perpendicular to the direction of propagation of light within the tapered region of the tapered region gradually increases as a function of a distance from a boundary between the active waveguide and the at least one of the polymer waveguides.

Example 42. The optical device of Example 35, wherein the input port comprises an in-coupling region of a waveguide, and wherein a cross-sectional area of the tapered region in a plane perpendicular to the direction of propagation of light within the tapered region of the tapered region gradually increases proportional to a distance from a boundary between the active waveguide and the at least one of the polymer waveguides.

Example 43. The optical device of Example 35, wherein the diameter of the tapered region varies adiabatically along a direction of propagation of light within the at least one of the polymer waveguides.

Example 44. The optical device of Example 35, wherein a cross-sectional area of the tapered region in a plane perpendicular to the direction of propagation of light within the tapered region adiabatically varies along the direction of propagation of light within the at least one of the polymer waveguides.

Example 45. The optical device of any of the examples above, wherein a cross-section of at least a portion of at least one of the polymer waveguides within a plane perpendicular to a direction of propagation of light within the at least one of the polymer waveguides comprises a circular, round, oval, or elliptical shape.

Example 46. An optical device comprising:

a laser array comprising a plurality of laser sources and having a plurality of output ports configured to output laser light generated by the plurality of laser sources;

a photonic integrated circuit (PIC) comprising a plurality of input ports and an optical multiplexer configured to combine laser light received from the plurality of input ports; and a plurality of photonic wire bonds connected to the plurality of input ports and the plurality of output ports, the plurality of waveguides configured to guide laser light output from the plurality of output ports to the plurality of input ports;

wherein the laser array and the PIC are fabricated on at least two separate substrates.

Example 47. The optical device of Example 46, wherein the photonic wire bond comprises a first end, a second end, and a middle section extending from the first end to the second end, wherein at least one of the first end or the second end comprise a tapered region.

Example 48. An optical device comprising:

a laser array comprising a plurality of laser sources and having a plurality of output ports configured to output laser light generated by the plurality of laser sources;

a photonic integrated circuit (PIC) comprising a plurality of input ports and an optical multiplexer configured to combine laser lights received from the plurality of input ports; and a plurality of polymer waveguides connected to the plurality of input ports and the plurality of output ports, the plurality of the polymer waveguides configured to guide laser light output from the plurality of output ports to the plurality of input ports;

wherein the laser array and the PIC are fabricated on at least two separate substrates;

wherein a cross-section of at least a portion of the at least one of the polymer waveguides within a plane perpendicular to a direction of propagation of light within the polymer waveguide comprises a circular, round, oval, or elliptical shape; and wherein at least one of the polymer waveguides comprises a tapered region closer to an input port of the plurality of input ports, or closer to an output port of the plurality of output ports, wherein a cross-sectional area of the tapered region in a plane perpendicular to the direction of propagation of light within the tapered region decreases from the input port toward the output port or from the output port toward the input port.

Terminology

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments.

Conjunctive language such as the phrase "at least one of X, Y, and Z," unless specifically stated otherwise, is to be understood within the context used in general to convey that an item, term, etc. may be either X, Y, or Z. Thus, such conjunctive language is not generally intended to imply that certain embodiments require the presence of at least one of X, at least one of Y, and at least one of Z.

Language of degree, as used herein, such as the terms "approximately," "about," "generally," and "substantially," represent a value, amount, or characteristic close to the stated value, amount, or characteristic that still performs a desired function or achieves a desired result. For example, the terms "approximately," "about," "generally," and "substantially" may refer to an amount that is within ±10% of, within ±5% of, within ±2% of, within ±1% of, or within ±0.1% of the stated amount. As another example, the terms "generally parallel" and "substantially parallel" refer to a value, amount, or characteristic that departs from exactly parallel by ±10 degrees, by ±5 degrees, by ±2 degrees, by ±1 degree, or by ±0.1 degree, and the terms "generally perpendicular" and "substantially perpendicular" refer to a value, amount, or characteristic that departs from exactly perpendicular by ±10 degrees, by ±5 degrees, by ±2 degrees, by ±1 degree, or by ±0.1 degree.

Various configurations have been described above. Although this invention has been described with reference to these specific configurations, the descriptions are intended to be illustrative of the invention and are not intended to be limiting. Various modifications and applications may occur to those skilled in the art without departing from the true spirit and scope of the invention. Thus, for example, in any method or process disclosed herein, the acts or operations making up the method/process may be performed in any suitable sequence and are not necessarily limited to any particular disclosed sequence. Features or elements from various embodiments and examples discussed above may be combined with one another to produce alternative configurations compatible with embodiments disclosed herein. Various aspects and advantages of the embodiments have been described where appropriate. It is to be understood that not necessarily all such aspects or advantages may be achieved in accordance with any particular embodiment. Thus, for example, it should be recognized that the various embodiments may be carried out in a manner that achieves or optimizes one advantage or group of advantages as taught herein without necessarily achieving other aspects or advantages as may be taught or suggested herein.

What is claimed is:

1. An optical device comprising:

a multi-wavelength optical source comprising:

a plurality of optically active waveguides configured to provide optical gain having a plurality of output ports configured to output laser light amplified by the plurality of optically active waveguides;

a photonic integrated circuit (PIC) comprising a plurality of input ports, and a plurality of narrow band optical reflectors configured to reflect at least a portion of light received from the plurality of input ports, and at least one PIC output port configured to output multi-wavelength light comprising laser light having at least two different wavelengths, wherein the PIC further comprises an optical multiplexer optically coupled to the plurality of narrowband optical reflectors and the at least one PIC output port, the optical multiplexer configured to combine light from the plurality of laser sources to form the multi-wavelength light; and a plurality of polymer waveguides connected to the plurality of input ports of the PIC and the plurality of output ports of the plurality of optically active waveguides, the plurality of the polymer waveguides configured to optically connect the plurality of output ports of the plurality of optically active waveguides to the plurality of input ports to form a plurality of laser sources comprising the plurality of optically active waveguides and respective narrowband optical reflectors, wherein the plurality of optically active waveguides and the PIC are fabricated on at least two separate substrates, wherein the plurality of polymer waveguides comprise polymer cladded polymer waveguides, and wherein the at least one PIC output port comprises a first PIC output port configured to provide a first multi-wavelength output and a second PIC output port configured to provide a second multi-wavelength output.

2. The optical device of claim 1, wherein at least one of the polymer waveguides has a length and a cross-section orthogonal to the length that is round, circular, elliptically-shaped, or oval-shaped.

3. The optical device of claim 1, wherein a polymer waveguide of the plurality of polymer waveguides is embedded in a polymer layer having an optical refractive index less than that of the polymer waveguide.

4. The optical device of claim 1, wherein the laser light generated by the at least one PIC output port comprises a narrowband light output centered around a single center wavelength.

5. The optical device of claim 1, further comprising a spot-size converter configured to convert a spot-size of light output by at least one optically active waveguide.

6. The optical device of claim 1, wherein an optically active waveguide of the plurality optically active waveguides comprises a semiconductor optical amplifier configured to amplify the laser light.

7. The optical device of claim 1, wherein the plurality of optically active waveguides comprise a plurality of back reflectors and a plurality of laser cavities are formed between the plurality of back reflectors and a plurality of the narrowband optical reflectors via the plurality of polymer waveguides.

8. The optical device of claim 7, wherein the plurality of back reflectors comprise a highly reflective coating or a high reflectivity mirror at a back end of at least one of the plurality of optically active waveguides.

9. The optical device of claim 1, wherein the PIC further comprises an optical multiplexer configured to receive light from the plurality of narrowband optical reflectors and provide the multi-wavelength light to the at least one PIC output port.

10. The optical device of claim 1, wherein the PIC further comprises an optical multiplexer configured to combine light received from the plurality of the input ports and provide the multi-wavelength light to the at least one PIC output port.

11. The optical device of claim 10, wherein the optical multiplexer comprises an arrayed waveguide grating (AWG).

12. The optical device of claim 1, wherein at least one of the narrowband optical reflectors comprises a sampled grating Bragg reflector, a Bragg reflector, or a ring resonator.

13. The optical device of claim 1, wherein the plurality of optically active waveguides are monolithically fabricated on a first chip of at least two separate chips, the first chip comprising IIIV semiconductor material.

14. The optical device of claim 13, wherein the PIC comprises a planar light wave circuit (PLC) fabricated on a second chip of the at least two separate chips, the second chip comprising silicon.

15. The optical device of claim 1, wherein the plurality of optically active waveguides are monolithically fabricated on a gain bar.

16. The optical device of claim 1, wherein the plurality of optically active waveguides comprises a plurality of gain chips mounted on a carrier chip.

17. The optical device of claim 1, wherein at least one narrowband reflector of the plurality of narrowband optical reflectors comprises a center wavelength different from the center wavelength of other narrowband reflectors.

18. The optical device of claim 1, wherein a diameter of at least one of the polymer waveguides of the plurality of polymer waveguides does not exceed 20 microns along a length of the at least one of the polymer waveguides, or wherein a longitudinal distance between one of said output ports of a laser array and one of said input ports optically connected thereto via the polymer waveguides is less than 500 microns, or wherein a spacing between adjacent output ports of the plurality of output ports or a spacing between adjacent input ports of the plurality of input ports is less than 20 microns.

* * * * *